US010184056B2

(12) United States Patent
Sonoyama et al.

(10) Patent No.: US 10,184,056 B2
(45) Date of Patent: Jan. 22, 2019

(54) INK FOR FORMING FUNCTIONAL LAYER, INK CONTAINER, DISCHARGHING APPARATUS, METHOD FOR FORMING FUNCTIONAL LAYER, METHOD FOR MANUFACTURING ORGANIC EL ELEMENT, LIGHT EMITTING DEVICE, AND ELECTRONIC APPARATUS

(71) Applicant: SEIKO EPSON CORPORATION, Tokyo (JP)

(72) Inventors: Takuya Sonoyama, Fujimi-machi (JP); Shotaro Watanabe, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 11 days.

(21) Appl. No.: 14/077,955

(22) Filed: Nov. 12, 2013

(65) Prior Publication Data
US 2014/0138655 A1    May 22, 2014

(30) Foreign Application Priority Data
Nov. 16, 2012    (JP) .................................. 2012-252007

(51) Int. Cl.
*C09D 11/36*    (2014.01)
*H01L 51/00*    (2006.01)
(Continued)

(52) U.S. Cl.
CPC .............. *C09D 11/36* (2013.01); *C09D 11/52* (2013.01); *H01L 51/0005* (2013.01); *H01L 51/0007* (2013.01); *H01L 51/56* (2013.01)

(58) Field of Classification Search
CPC . H01L 51/0005; H01L 51/0007; H01L 51/56; C09D 11/36
(Continued)

(56) References Cited

U.S. PATENT DOCUMENTS 7,704,785 B2    4/2010  Steiger et al.
7,807,741 B2   10/2010  Yamamoto
(Continued)

FOREIGN PATENT DOCUMENTS

JP          56118465 A   *  9/1981
JP       A-2006-348288    12/2006
(Continued)

OTHER PUBLICATIONS

English machine translation of Shoji et al. (JP 56118465 A).*

*Primary Examiner* — Lex Malsawma
*Assistant Examiner* — Geoffrey Ida
(74) *Attorney, Agent, or Firm* — Oliff PLC

(57)    ABSTRACT

An ink for forming a functional layer includes a first component that contains at least one kind of aromatic solvent of which a boiling point is higher than or equal to 250° C. and lower than or equal to 350° C., a second component that contains at least one kind of aliphatic solvent of which a boiling point is higher than or equal to 200° C., and a third component for forming a positive hole injection layer, in which a solubility of the third component in the first component is higher than the solubility of the third component in the second component, a mixing ratio of the second component is 30 vol %, the boiling point of the first component is higher than the boiling point of the second component, and a difference between the boiling points thereof is higher than or equal to 30° C.

15 Claims, 54 Drawing Sheets

(51) Int. Cl.
*C09D 11/52* (2014.01)
*H01L 51/56* (2006.01)

(58) Field of Classification Search
USPC .......................................... 252/519.3; 257/40
See application file for complete search history.

(56) References Cited

U.S. PATENT DOCUMENTS

| | | | |
|---|---|---|---|
| 7,820,077 B2 | 10/2010 | Spreitzer et al. | |
| 8,029,919 B2 | 10/2011 | Gessner et al. | |
| 8,174,000 B2 | 5/2012 | Cheon et al. | |
| 2006/0045959 A1 | 3/2006 | Yasukawa et al. | |
| 2006/0127563 A1* | 6/2006 | Toyoda | H01L 51/56 |
| | | | 427/58 |
| 2006/0159838 A1* | 7/2006 | Kowalski et al. | 427/58 |
| 2008/0038488 A1* | 2/2008 | Yamamoto | C08J 3/091 |
| | | | 428/1.3 |
| 2008/0114151 A1* | 5/2008 | Shirasawa | H05B 33/14 |
| | | | 528/395 |
| 2008/0265214 A1* | 10/2008 | Steiger | C09K 11/025 |
| | | | 252/500 |
| 2009/0102365 A1* | 4/2009 | Takemoto | B82Y 20/00 |
| | | | 313/504 |
| 2009/0103284 A1* | 4/2009 | Suzuki | C08K 5/0008 |
| | | | 362/97.3 |
| 2011/0269255 A1 | 11/2011 | Goddard et al. | |
| 2012/0001124 A1 | 1/2012 | Ishino et al. | |
| 2013/0009137 A1* | 1/2013 | Brown et al. | 257/40 |
| 2013/0026421 A1* | 1/2013 | James | H01L 51/0007 |
| | | | 252/500 |
| 2013/0069020 A1* | 3/2013 | May | C09K 11/06 |
| | | | 252/519.21 |
| 2013/0082249 A1* | 4/2013 | Kawanami et al. | 257/40 |

FOREIGN PATENT DOCUMENTS

| | | |
|---|---|---|
| JP | A-2009-267299 | 11/2009 |
| JP | B2-4616596 | 1/2011 |
| JP | A-2011-109016 | 6/2011 |
| JP | B2-4707658 | 6/2011 |
| JP | B2-4768746 | 9/2011 |
| JP | B2-4788161 | 10/2011 |
| JP | A-2011-528861 | 11/2011 |
| JP | B2-4856753 | 1/2012 |
| JP | B2-4861197 | 1/2012 |
| JP | B2-5019454 | 9/2012 |
| WO | WO 2010/010337 A1 | 1/2010 |
| WO | 2012/001744 A1 | 1/2012 |

* cited by examiner

FIG. 7

<INK FOR FORMING POSITIVE HOLE INJECTION LAYER>

FIRST COMPONENT : SECOND COMPONENT : THIRD COMPONENT = 100.0 : THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | WETTING SPREAD DEFECT | STAIN | LIGHT EMITTING FAILURE IN DARK SPOT OR BRIGHT SPOT |
|---|---|---|---|---|---|---|---|---|---|
| COMPARATIVE EXAMPLE 1-1 | 4,4',4''-Tris[N-(3-methylphenyl)-N-phenylamino]-triphenylamine-MTDATA | NOT INCLUDED | | | 1,3-Dipropoxybenzene | 251 | × | △ | × |
| COMPARATIVE EXAMPLE 1-2 | | | | | 4-Methoxybenzaldehyde Dimethyl Acetal | 253 | × | △ | × |
| COMPARATIVE EXAMPLE 1-3 | | | | | 4,4'-Difluorodiphenylmethane | 258 | × | △ | × |
| COMPARATIVE EXAMPLE 1-4 | | | | | Diphenyl ether | 259 | × | △ | × |
| COMPARATIVE EXAMPLE 1-5 | | | | | 1,2-Dimethoxy-4-(1-propenyl)benzene | 264 | × | △ | × |
| COMPARATIVE EXAMPLE 1-6 | | | | | MDPE | 265 | × | △ | × |
| COMPARATIVE EXAMPLE 1-7 | | | | | Diphenyl methane | 265 | × | △ | × |
| COMPARATIVE EXAMPLE 1-8 | | | | | 2-Phenylpyridine | 268 | × | △ | × |
| COMPARATIVE EXAMPLE 1-9 | | | | | DMDPE | 270 | × | △ | × |
| COMPARATIVE EXAMPLE 1-10 | | | | | 3-Phenoxytoluene | 272 | × | △ | × |
| COMPARATIVE EXAMPLE 1-11 | | | | | 3-Phenylpyridine | 272 | × | △ | × |
| COMPARATIVE EXAMPLE 1-12 | | | | | 2-Phenylanisole | 274 | × | △ | × |
| COMPARATIVE EXAMPLE 1-13 | | | | | 2-Phenoxytetrahydrofuran | 275 | × | △ | × |
| COMPARATIVE EXAMPLE 1-14 | | | | | NPBP | 280 | × | △ | × |
| COMPARATIVE EXAMPLE 1-15 | | | | | 25DMDPE | 280 | × | △ | × |
| COMPARATIVE EXAMPLE 1-16 | | | | | Ethyl 2-Naphthyl Ether | 282 | × | △ | × |
| COMPARATIVE EXAMPLE 1-17 | | | | | 225TMDPE | 290 | × | △ | × |
| COMPARATIVE EXAMPLE 1-18 | | | | | Dibenzyl Ether | 295 | × | △ | × |
| COMPARATIVE EXAMPLE 1-19 | | | | | 235TMDPE | 295 | × | △ | × |
| COMPARATIVE EXAMPLE 1-20 | | | | | N-Methyldiphenylamine | 297 | × | △ | × |
| COMPARATIVE EXAMPLE 1-21 | | | | | 4-Isopropylbiphenyl | 298 | × | △ | × |
| COMPARATIVE EXAMPLE 1-22 | | | | | α,α-Dichlorodiphenylmethane | 305 | × | △ | × |
| COMPARATIVE EXAMPLE 1-23 | | | | | 4-(3-phenylpropyl)pyridine | 322 | × | △ | × |
| COMPARATIVE EXAMPLE 1-24 | | | | | Benzyl Benzoate | 324 | × | △ | × |
| COMPARATIVE EXAMPLE 1-25 | | | | | 1,1-Bis(3,4-Dimethylphenyl)methane | 333 | × | △ | × |

FIG. 8

<INK FOR FORMING POSITIVE HOLE INJECTION LAYER>
FIRST COMPONENT : SECOND COMPONENT = 80 : 20, THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-26 | 4,4',4''-Tris[N-(3-methylphenyl)-N-phenylamino]-triphenylamine (m-MTDATA) | Diethyleneglycol butylmethyl ether | 212 | 24.1 | 1,3-Dipropoxybenzene | 251 | 39 | × | △ | × |
| COMPARATIVE EXAMPLE 1-27 | | | | | 4-Methoxybenzaldehyde Dimethyl Acetal | 253 | 41 | × | △ | × |
| COMPARATIVE EXAMPLE 1-28 | | | | | 4,4'-Difluorodiphenylmethane | 258 | 46 | × | △ | × |
| COMPARATIVE EXAMPLE 1-29 | | | | | Diphenyl ether | 259 | 47 | × | △ | × |
| COMPARATIVE EXAMPLE 1-30 | | | | | 1,2-Dimethoxy-4-(1-propenyl)benzene | 264 | 52 | × | △ | × |
| COMPARATIVE EXAMPLE 1-31 | | | | | MDPE | 265 | 53 | × | △ | × |
| COMPARATIVE EXAMPLE 1-32 | | | | | Diphenyl methane | 265 | 53 | × | △ | × |
| COMPARATIVE EXAMPLE 1-33 | | | | | 2-Phenylpyridine | 268 | 56 | × | △ | × |
| COMPARATIVE EXAMPLE 1-34 | | | | | DMDPE | 270 | 58 | × | △ | × |
| COMPARATIVE EXAMPLE 1-35 | | | | | 3-Phenoxytoluene | 272 | 60 | × | △ | × |
| COMPARATIVE EXAMPLE 1-36 | | | | | 3-Phenylpyridine | 272 | 60 | × | △ | × |
| COMPARATIVE EXAMPLE 1-37 | | | | | 2-Phenylanisole | 274 | 62 | × | △ | × |
| COMPARATIVE EXAMPLE 1-38 | | | | | 2-Phenoxytetrahydropuran | 275 | 63 | × | △ | × |
| COMPARATIVE EXAMPLE 1-39 | | | | | NPBP | 280 | 68 | × | △ | × |
| COMPARATIVE EXAMPLE 1-40 | | | | | 25DMDPE | 280 | 68 | × | △ | × |
| COMPARATIVE EXAMPLE 1-41 | | | | | Ethyl 2-Naphthyl Ether | 282 | 70 | × | △ | × |
| COMPARATIVE EXAMPLE 1-42 | | | | | 22TMDPE | 290 | 78 | × | △ | × |
| COMPARATIVE EXAMPLE 1-43 | | | | | Dibenzyl Ether | 295 | 83 | × | △ | × |
| COMPARATIVE EXAMPLE 1-44 | | | | | 23STMDPE | 295 | 83 | × | △ | × |
| COMPARATIVE EXAMPLE 1-45 | | | | | N-Methyldiphenylamine | 297 | 85 | × | △ | × |
| COMPARATIVE EXAMPLE 1-46 | | | | | 4-Isopropylbiphenyl | 298 | 86 | × | △ | × |
| COMPARATIVE EXAMPLE 1-47 | | | | | α,α-Dichlorodiphenylmethane | 305 | 93 | × | △ | × |
| COMPARATIVE EXAMPLE 1-48 | | | | | 4-(3-phenylpropyl)pyridine | 322 | 110 | × | △ | × |
| COMPARATIVE EXAMPLE 1-49 | | | | | Benzyl Benzoate | 324 | 112 | × | △ | × |
| COMPARATIVE EXAMPLE 1-50 | | | | | 1,1-Bis(3,4-Dimethylphenyl)ethane | 333 | 121 | × | △ | × |

FIG. 9

<INK FOR FORMING POSITIVE HOLE INJECTION LAYER>

FIRST COMPONENT : SECOND COMPONENT = 80 : 20, THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-51 | 4,4',4''-Tris(N-(3-methylphenyl)-N-phenylamino)triphenylamine (m-MTDATA) | Diethyleneglycol dibutyl ether | 256 | 24.9 | 1,3-Dipropoxybenzene | 251 | −5 | × | △ | × |
| COMPARATIVE EXAMPLE 1-52 | | | | | 4-Methoxybenzaldehyde Dimethyl Acetal | 253 | −3 | × | △ | × |
| COMPARATIVE EXAMPLE 1-53 | | | | | 4,4'-Difluorodiphenylmethane | 258 | 2 | × | △ | × |
| COMPARATIVE EXAMPLE 1-54 | | | | | Diphenyl ether | 259 | 3 | × | △ | × |
| COMPARATIVE EXAMPLE 1-55 | | | | | 1,2-Dimethoxy-4-(1-propenyl)benzene | 264 | 8 | × | △ | × |
| COMPARATIVE EXAMPLE 1-56 | | | | | MDPE | 265 | 9 | × | △ | × |
| COMPARATIVE EXAMPLE 1-57 | | | | | Diphenyl methane | 265 | 9 | × | △ | × |
| COMPARATIVE EXAMPLE 1-58 | | | | | 2-Phenylpyridine | 268 | 12 | × | △ | × |
| COMPARATIVE EXAMPLE 1-59 | | | | | DMDPE | 270 | 14 | × | △ | × |
| COMPARATIVE EXAMPLE 1-60 | | | | | 3-Phenoxytoluene | 272 | 16 | × | △ | × |
| COMPARATIVE EXAMPLE 1-61 | | | | | 3-Phenylpyridine | 272 | 16 | × | △ | × |
| COMPARATIVE EXAMPLE 1-62 | | | | | 2-Phenylanisole | 274 | 18 | × | △ | × |
| COMPARATIVE EXAMPLE 1-63 | | | | | 2-Phenoxytetrahydrofuran | 275 | 19 | × | △ | × |
| COMPARATIVE EXAMPLE 1-64 | | | | | NPBP | 280 | 24 | × | △ | × |
| COMPARATIVE EXAMPLE 1-65 | | | | | 25DMDPE | 280 | 24 | × | △ | × |
| COMPARATIVE EXAMPLE 1-66 | | | | | Ethyl 2-Naphthyl Ether | 282 | 26 | × | △ | × |
| COMPARATIVE EXAMPLE 1-67 | | | | | 22RTMDPE | 290 | 34 | × | △ | × |
| COMPARATIVE EXAMPLE 1-68 | | | | | Dibenzyl Ether | 295 | 39 | × | △ | × |
| COMPARATIVE EXAMPLE 1-69 | | | | | 2RSTMDPE | 295 | 39 | × | △ | × |
| COMPARATIVE EXAMPLE 1-70 | | | | | N-Methyldiphenylamine | 297 | 41 | × | △ | × |
| COMPARATIVE EXAMPLE 1-71 | | | | | 4-Isopropylbiphenyl | 298 | 42 | × | △ | × |
| COMPARATIVE EXAMPLE 1-72 | | | | | α,α-Dichlorodiphenylmethane | 305 | 49 | × | △ | × |
| COMPARATIVE EXAMPLE 1-73 | | | | | 4-(3-phenylpropyl)pyridine | 322 | 66 | × | △ | × |
| COMPARATIVE EXAMPLE 1-74 | | | | | Benzyl Benzoate | 324 | 68 | × | △ | × |
| COMPARATIVE EXAMPLE 1-75 | | | | | 1,1-Bis(3,4-Dimethylphenyl)ethane | 333 | 77 | × | △ | × |

FIG. 10

<INK FOR FORMING POSITIVE HOLE INJECTION LAYER>

FIRST COMPONENT : SECOND COMPONENT = 80 : 20  THIRD COMPONENT 0.3 wt%

| No. | THIRD COMPONENT COMPONENT NAME | SECOND COMPONENT SOLVENT NAME | SECOND COMPONENT BOILING POINT (°C) | SURFACE TENSION (mN/m) | FIRST COMPONENT SOLVENT NAME | BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-76 | 4,4',4''-Tris(N-(3-methylphenyl)-N-phenylamino)-triphenylamine[MTDATA] | Tetraethyleneglycol dimethyl ether | 275 | 31.8 | 1,3-Dipropoxybenzene | 251 | −24 | × | △ | × |
| COMPARATIVE EXAMPLE 1-77 | | | | | 4-Methoxybenzaldehyde Dimethyl Acetal | 253 | −22 | × | △ | × |
| COMPARATIVE EXAMPLE 1-78 | | | | | 4,4'-Difluorodiphenylmethane | 258 | −17 | × | △ | × |
| COMPARATIVE EXAMPLE 1-79 | | | | | Diphenyl ether | 259 | −16 | × | △ | × |
| COMPARATIVE EXAMPLE 1-80 | | | | | 1,2-Dimethoxy-4-(1-propenyl)benzene | 264 | −11 | × | △ | × |
| COMPARATIVE EXAMPLE 1-81 | | | | | MDPE | 265 | −10 | × | △ | × |
| COMPARATIVE EXAMPLE 1-82 | | | | | Diphenyl methane | 265 | −10 | × | △ | × |
| COMPARATIVE EXAMPLE 1-83 | | | | | 2-Phenylpyridine | 268 | −7 | × | △ | × |
| COMPARATIVE EXAMPLE 1-84 | | | | | DMDPE | 270 | −5 | × | △ | × |
| COMPARATIVE EXAMPLE 1-85 | | | | | 3-Phenoxytoluene | 272 | −3 | × | △ | × |
| COMPARATIVE EXAMPLE 1-86 | | | | | 3-Phenylpyridine | 272 | −3 | × | △ | × |
| COMPARATIVE EXAMPLE 1-87 | | | | | 2-Phenylanisole | 274 | −1 | × | △ | × |
| COMPARATIVE EXAMPLE 1-88 | | | | | 2-Phenoxytetrahydropyran | 275 | 0 | × | △ | × |
| COMPARATIVE EXAMPLE 1-89 | | | | | MPBP | 280 | 5 | × | △ | × |
| COMPARATIVE EXAMPLE 1-90 | | | | | 25DMDPE | 280 | 5 | × | △ | × |
| COMPARATIVE EXAMPLE 1-91 | | | | | Ethyl 2-Naphthyl Ether | 282 | 7 | × | △ | × |
| COMPARATIVE EXAMPLE 1-92 | | | | | 225TMDPE | 290 | 15 | × | △ | × |
| COMPARATIVE EXAMPLE 1-93 | | | | | Dibenzyl Ether | 295 | 20 | × | △ | × |
| COMPARATIVE EXAMPLE 1-94 | | | | | 235TMDPE | 295 | 20 | × | △ | × |
| COMPARATIVE EXAMPLE 1-95 | | | | | N-Methyldiphenylamine | 297 | 22 | × | △ | × |
| COMPARATIVE EXAMPLE 1-96 | | | | | 4-Isopropylbiphenyl | 298 | 23 | × | △ | × |
| COMPARATIVE EXAMPLE 1-97 | | | | | α,α'-Dichlorodiphenylmethane | 305 | 30 | × | △ | × |
| COMPARATIVE EXAMPLE 1-98 | | | | | 4-(3-phenylpropyl)pyridine | 322 | 47 | × | △ | × |
| COMPARATIVE EXAMPLE 1-99 | | | | | Benzyl Benzoate | 324 | 49 | × | △ | × |
| COMPARATIVE EXAMPLE 1-100 | | | | | 1,1-Bis(3,4-Dimethylphenyl)ethane | 333 | 58 | × | △ | × |

FIG. 11

<INK FOR FORMING POSITIVE HOLE INJECTION LAYER>
FIRST COMPONENT, SECOND COMPONENT, THIRD COMPONENT = 70, 30, THIRD COMPONENT 0.3 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 1-1 | 4,4',4''-Tris(N-(3-methylphenyl)-N-phenylamino)triphenylamine [m-MTDATA] | Diethyleneglycol butylmethyl ether | 212 | 24.1 | 1,3-Dipropoxybenzene | 251 | 39 | ○ | ○ | ○ |
| EXAMPLE 1-2 | | | | | 4-Methoxybenzaldehyde Dimethyl Acetal | 253 | 41 | ○ | ○ | ○ |
| EXAMPLE 1-3 | | | | | 4,4'-Difluorodiphenylmethane | 258 | 46 | ○ | ○ | ○ |
| EXAMPLE 1-4 | | | | | Diphenyl ether | 259 | 47 | ○ | ○ | ○ |
| EXAMPLE 1-5 | | | | | 1,2-Dimethoxy-4-(1-propenyl)benzene | 264 | 52 | ○ | ○ | ○ |
| EXAMPLE 1-6 | | | | | MDPE | 265 | 53 | ○ | ○ | ○ |
| EXAMPLE 1-7 | | | | | Diphenyl methane | 265 | 53 | ○ | ○ | ○ |
| EXAMPLE 1-8 | | | | | 2-Phenylpyridine | 268 | 56 | ○ | ○ | ○ |
| EXAMPLE 1-9 | | | | | DMDPE | 270 | 58 | ○ | ○ | ○ |
| EXAMPLE 1-10 | | | | | 3-Phenoxytoluene | 272 | 60 | ○ | ○ | ○ |
| EXAMPLE 1-11 | | | | | 3-Phenylpyridine | 272 | 60 | ○ | ○ | ○ |
| EXAMPLE 1-12 | | | | | 2-Phenylanisole | 274 | 62 | ○ | ○ | ○ |
| EXAMPLE 1-13 | | | | | 2-Phenoxytetrahydrofuran | 275 | 63 | ○ | ○ | ○ |
| EXAMPLE 1-14 | | | | | NPBP | 280 | 68 | ○ | ○ | ○ |
| EXAMPLE 1-15 | | | | | 26DMDPE | 280 | 68 | ○ | ○ | ○ |
| EXAMPLE 1-16 | | | | | Ethyl 2-Naphthyl Ether | 282 | 70 | ○ | ○ | ○ |
| EXAMPLE 1-17 | | | | | 225TMDPE | 290 | 78 | ○ | ○ | ○ |
| EXAMPLE 1-18 | | | | | Dibenzyl Ether | 295 | 83 | ○ | ○ | ○ |
| EXAMPLE 1-19 | | | | | 235TMDPE | 295 | 83 | ○ | ○ | ○ |
| EXAMPLE 1-20 | | | | | N-Methyldiphenylamine | 297 | 85 | ○ | ○ | ○ |
| EXAMPLE 1-21 | | | | | 4-Isopropylbiphenyl | 298 | 86 | ○ | ○ | ○ |
| EXAMPLE 1-22 | | | | | α,α-Dichlorodiphenylmethane | 305 | 93 | △ | △ | △ |
| EXAMPLE 1-23 | | | | | 4-(3-phenylpropyl)pyridine | 322 | 110 | △ | △ | △ |
| EXAMPLE 1-24 | | | | | Benzyl Benzoate | 324 | 112 | △ | △ | △ |
| EXAMPLE 1-25 | | | | | 1,1-Bis(3,4-Dimethylphenyl)ethane | 333 | 121 | △ | △ | △ |

FIG. 12

<INK FOR FORMING POSITIVE HOLE INJECTION LAYER>

FIRST COMPONENT : SECOND COMPONENT = 70 : 30  THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE I-101 | 4,4',4''-Tris(N-(3-methylphenyl)-N-phenylamino)-triphenylamine(m-MTDATA) | Diethyleneglycol dibutyl ether | 256 | 24.9 | 1,3-Dipropoxybenzene | 251 | -5 | × | × | × |
| COMPARATIVE EXAMPLE I-102 | | | | | 4-Methoxybenzaldehyde Dimethyl Acetal | 253 | -3 | × | × | × |
| COMPARATIVE EXAMPLE I-103 | | | | | 4,4'-Difluorodiphenylmethane | 258 | 2 | × | × | × |
| COMPARATIVE EXAMPLE I-104 | | | | | Diphenyl ether | 259 | 3 | × | × | × |
| COMPARATIVE EXAMPLE I-105 | | | | | 1,2-Dimethoxy-4-(1-propenyl)benzene | 264 | 8 | × | × | × |
| COMPARATIVE EXAMPLE I-106 | | | | | MDPE | 265 | 9 | × | × | △ |
| COMPARATIVE EXAMPLE I-107 | | | | | Diphenyl methane | 265 | 9 | × | × | × |
| COMPARATIVE EXAMPLE I-108 | | | | | 2-Phenylpyridine | 268 | 12 | △ | × | △ |
| COMPARATIVE EXAMPLE I-109 | | | | | DMDPE | 270 | 14 | △ | × | △ |
| COMPARATIVE EXAMPLE I-110 | | | | | 3-Phenoxytoluene | 272 | 16 | △ | × | △ |
| COMPARATIVE EXAMPLE I-111 | | | | | 3-Phenylpyridine | 272 | 16 | △ | × | △ |
| COMPARATIVE EXAMPLE I-112 | | | | | 2-Phenylanisole | 274 | 18 | △ | × | △ |
| COMPARATIVE EXAMPLE I-113 | | | | | 2-Phenoxytetrahydropuran | 275 | 19 | △ | △ | △ |
| COMPARATIVE EXAMPLE I-114 | | | | | NPBP | 280 | 24 | △ | △ | △ |
| COMPARATIVE EXAMPLE I-115 | | | | | 26DMDPE | 280 | 24 | △ | △ | △ |
| COMPARATIVE EXAMPLE I-116 | | | | | Ethyl 2-Naphthyl Ether | 282 | 26 | ○ | △ | ○ |
| EXAMPLE I-26 | | | | | 22STMDPE | 290 | 34 | ○ | ◎ | ○ |
| EXAMPLE I-27 | | | | | Dibenzyl Ether | 295 | 39 | ○ | ◎ | ○ |
| EXAMPLE I-28 | | | | | 23STMDPE | 295 | 39 | ○ | ◎ | ○ |
| EXAMPLE I-29 | | | | | N-Methyldiphenylamine | 297 | 41 | ○ | ○ | ○ |
| EXAMPLE I-30 | | | | | 4-isopropylbiphenyl | 298 | 42 | ○ | △ | △ |
| EXAMPLE I-31 | | | | | α,α-Dichlorodiphenylmethane | 305 | 49 | ○ | △ | △ |
| EXAMPLE I-32 | | | | | 4,6-phenylpropylpyridine | 322 | 66 | ○ | △ | △ |
| EXAMPLE I-33 | | | | | Benzyl Benzoate | 324 | 68 | ○ | △ | △ |
| EXAMPLE I-34 | | | | | 1,1-Bis(3,4-Dimethylphenyl)ethane | 333 | 77 | ○ | △ | △ |

FIG. 13

<INK FOR FORMING POSITIVE HOLE INJECTION LAYER>
FIRST COMPONENT : SECOND COMPONENT : THIRD COMPONENT = 70 : 30, THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-117 | 4,4',4''-Tris(N-(3-methylphenyl)-N-phenylamino)-triphenylamine (m-MTDATA) | Tetraethylene glycol dimethyl ether | 275 | 31.8 | 1,3-Dipropoxybenzene | 251 | -24 | × | × | × |
| COMPARATIVE EXAMPLE 1-118 | | | | | 4-Methoxybenzaldehyde Dimethyl Acetal | 253 | -22 | × | × | × |
| COMPARATIVE EXAMPLE 1-119 | | | | | 4,4'-Difluorodiphenylmethane | 258 | -17 | × | × | × |
| COMPARATIVE EXAMPLE 1-120 | | | | | Diphenyl ether | 259 | -16 | × | × | × |
| COMPARATIVE EXAMPLE 1-121 | | | | | 1,2-Dimethoxy-4-(1-propenyl)benzene | 264 | -11 | × | × | × |
| COMPARATIVE EXAMPLE 1-122 | | | | | MDPE | 265 | -10 | × | × | × |
| COMPARATIVE EXAMPLE 1-123 | | | | | Diphenyl methane | 265 | -10 | × | × | × |
| COMPARATIVE EXAMPLE 1-124 | | | | | 2-Phenylpyridine | 268 | -7 | × | × | × |
| COMPARATIVE EXAMPLE 1-125 | | | | | DMDPE | 270 | -5 | × | × | × |
| COMPARATIVE EXAMPLE 1-126 | | | | | 3-Phenyltoluene | 272 | -3 | × | × | × |
| COMPARATIVE EXAMPLE 1-127 | | | | | 3-Phenylpyridine | 272 | -3 | × | × | × |
| COMPARATIVE EXAMPLE 1-128 | | | | | 2-Phenylanisole | 274 | -1 | × | × | × |
| COMPARATIVE EXAMPLE 1-129 | | | | | 2-Phenoxytetrahydrofuran | 275 | 0 | × | × | × |
| COMPARATIVE EXAMPLE 1-130 | | | | | NPBP | 280 | 5 | × | × | × |
| COMPARATIVE EXAMPLE 1-131 | | | | | 25DMDPE | 280 | 5 | × | × | × |
| COMPARATIVE EXAMPLE 1-132 | | | | | Ethyl 2-Napthyl Ether | 282 | 7 | × | × | × |
| COMPARATIVE EXAMPLE 1-133 | | | | | 22STMDPE | 290 | 15 | × | × | × |
| COMPARATIVE EXAMPLE 1-134 | | | | | Dibenzyl Ether | 295 | 20 | △ | △ | △ |
| COMPARATIVE EXAMPLE 1-135 | | | | | 23STMDPE | 295 | 20 | △ | △ | △ |
| COMPARATIVE EXAMPLE 1-136 | | | | | N-Methyldiphenylamine | 297 | 22 | △ | △ | △ |
| COMPARATIVE EXAMPLE 1-137 | | | | | 4-Isopropylbiphenyl | 298 | 23 | △ | △ | △ |
| EXAMPLE 1-35 | | | | | α,α'-Dichlorodiphenylmethane | 305 | 30 | ○ | △ | △ |
| EXAMPLE 1-36 | | | | | 4-(3-phenylpropyl)pyridine | 322 | 47 | ○ | △ | △ |
| EXAMPLE 1-37 | | | | | Benzyl Benzoate | 324 | 49 | ○ | △ | △ |
| EXAMPLE 1-38 | | | | | 1,1-Bis(3,4-Dimethylphenyl)methane | 333 | 58 | ○ | △ | △ |

FIG. 14

⟨INK FOR FORMING POSITIVE HOLE INJECTION LAYER⟩

FIRST COMPONENT: SECOND COMPONENT: THIRD COMPONENT = 50 : 50 THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 1-39 | 4,4',4''-Tris(N-3-methylphenyl-N-phenylamino)-triphenylamine:m-MTDATA | Diethyleneglycol butylmethyl ether | 212 | 24.1 | 1,3-Dipropoxybenzene | 251 | 39 | ○ | ○ | ○ |
| EXAMPLE 1-40 | | | | | 4-Methoxybenzaldehyde Dimethyl Acetal | 253 | 41 | ○ | ○ | ○ |
| EXAMPLE 1-41 | | | | | 4,4'-Difluorodiphenylmethane | 258 | 46 | ○ | ○ | ○ |
| EXAMPLE 1-42 | | | | | Diphenyl ether | 259 | 47 | ○ | ○ | ○ |
| EXAMPLE 1-43 | | | | | 1,2-Dimethoxy-4-(1-propenyl)benzene | 264 | 52 | ○ | ○ | ○ |
| EXAMPLE 1-44 | | | | | MDPE | 265 | 53 | ○ | ○ | ○ |
| EXAMPLE 1-45 | | | | | Diphenyl methane | 265 | 53 | ○ | ○ | ○ |
| EXAMPLE 1-46 | | | | | 2-Phenylpyridine | 268 | 56 | ○ | ○ | ○ |
| EXAMPLE 1-47 | | | | | DMDPE | 270 | 58 | ○ | ○ | ○ |
| EXAMPLE 1-48 | | | | | 3-Phenoxytoluene | 272 | 60 | ○ | ○ | ○ |
| EXAMPLE 1-49 | | | | | 3-Phenylpyridine | 272 | 60 | ○ | ○ | ○ |
| EXAMPLE 1-50 | | | | | 2-Phenylanisole | 274 | 62 | ○ | ○ | ○ |
| EXAMPLE 1-51 | | | | | 2-Phenoxytetrahydropuran | 275 | 63 | ○ | ○ | ○ |
| EXAMPLE 1-52 | | | | | NPBP | 280 | 68 | ○ | ○ | ○ |
| EXAMPLE 1-53 | | | | | 25DMDPE | 280 | 68 | ○ | ○ | ○ |
| EXAMPLE 1-54 | | | | | Ethyl 2-Naphthyl Ether | 282 | 70 | ○ | ○ | ○ |
| EXAMPLE 1-55 | | | | | 225TMDPE | 290 | 78 | ○ | ○ | ○ |
| EXAMPLE 1-56 | | | | | Dibenzyl Ether | 295 | 83 | ○ | ○ | ○ |
| EXAMPLE 1-57 | | | | | 235TMDPE | 295 | 83 | ○ | ○ | ○ |
| EXAMPLE 1-58 | | | | | N-Methyldiphenylamine | 297 | 85 | ○ | ○ | ○ |
| EXAMPLE 1-59 | | | | | 4-Isopropylbiphenyl | 298 | 86 | ○ | ○ | ○ |
| EXAMPLE 1-60 | | | | | α,α-Dichlorodiphenylmethane | 305 | 93 | ○ | ○ | ○ |
| EXAMPLE 1-61 | | | | | 4,4'-Bis(3-phenylpropyl)pyridine | 322 | 110 | ○ | ○ | ○ |
| EXAMPLE 1-62 | | | | | Benzyl Benzoate | 324 | 112 | ○ | ○ | ○ |
| EXAMPLE 1-63 | | | | | 1,1-Bis(3,4-Dimethylphenyl)ethane | 333 | 121 | ○ | ○ | ○ |

FIG. 15

<INK FOR FORMING POSITIVE HOLE INJECTION LAYER>

FIRST COMPONENT : SECOND COMPONENT = 50 : 50   THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-138 | 4,4',4''-Tris(N-3-methylphenyl-N-phenylamino)-triphenylamine-MTDATA | Diethyleneglycol dibutyl ether | 256 | 24.9 | 1,3-Dipropoxybenzene | 251 | −5 | × | × | × |
| COMPARATIVE EXAMPLE 1-139 | | | | | 4-Methoxybenzaldehyde Dimethyl Acetal | 253 | −3 | × | × | × |
| COMPARATIVE EXAMPLE 1-140 | | | | | 4,4'-Difluorodiphenylmethane | 258 | 2 | × | × | × |
| COMPARATIVE EXAMPLE 1-141 | | | | | Diphenyl ether | 259 | 3 | × | × | × |
| COMPARATIVE EXAMPLE 1-142 | | | | | 1,2-Dimethoxy-4-(1-propenyl)benzene | 264 | 8 | × | × | × |
| COMPARATIVE EXAMPLE 1-143 | | | | | MDPE | 265 | 9 | × | × | × |
| COMPARATIVE EXAMPLE 1-144 | | | | | Diphenyl methane | 265 | 9 | × | × | △ |
| COMPARATIVE EXAMPLE 1-145 | | | | | 2-Phenylpyridine | 268 | 12 | × | × | × |
| COMPARATIVE EXAMPLE 1-146 | | | | | DMDPE | 270 | 14 | △ | × | △ |
| COMPARATIVE EXAMPLE 1-147 | | | | | 3-Phenoxytoluene | 272 | 16 | △ | × | △ |
| COMPARATIVE EXAMPLE 1-148 | | | | | 3-Phenylpyridine | 272 | 16 | △ | △ | △ |
| COMPARATIVE EXAMPLE 1-149 | | | | | 2-Phenylanisole | 274 | 18 | △ | △ | △ |
| COMPARATIVE EXAMPLE 1-150 | | | | | 2-Phenyltetrahydropyran | 275 | 19 | △ | △ | △ |
| COMPARATIVE EXAMPLE 1-151 | | | | | NPBP | 280 | 24 | △ | △ | △ |
| COMPARATIVE EXAMPLE 1-152 | | | | | 25DMDPE | 280 | 24 | △ | △ | △ |
| COMPARATIVE EXAMPLE 1-153 | | | | | Ethyl 2-Naphthyl Ether | 282 | 26 | △ | △ | △ |
| EXAMPLE 1-64 | | | | | 225TMDPE | 290 | 34 | ○ | ◎ | ○ |
| EXAMPLE 1-65 | | | | | Dibenzyl Ether | 295 | 39 | ○ | ◎ | ○ |
| EXAMPLE 1-66 | | | | | 235TMDPE | 295 | 39 | ○ | ◎ | ○ |
| EXAMPLE 1-67 | | | | | N-Methyldiphenylamine | 297 | 41 | ○ | ○ | ○ |
| EXAMPLE 1-68 | | | | | 4-Isopropylbiphenyl | 298 | 42 | ○ | ○ | ○ |
| EXAMPLE 1-69 | | | | | α,α-Dichlorodiphenylmethane | 305 | 49 | ○ | ○ | ○ |
| EXAMPLE 1-70 | | | | | 4-(3-phenylpropyl)pyridine | 322 | 66 | ○ | △ | ○ |
| EXAMPLE 1-71 | | | | | Benzyl Benzoate | 324 | 68 | ○ | △ | ○ |
| EXAMPLE 1-72 | | | | | 1,1-Bis(3,4-Dimethylphenyl)ethane | 333 | 77 | ○ | △ | ○ |

FIG. 16

<INK FOR FORMING POSITIVE HOLE INJECTION LAYER>

FIRST COMPONENT: SECOND COMPONENT = 30 : 30, THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-154 | 4,4',4''-Tris(N-(3-methylphenyl)-N-phenylamino)triphenylamine (m-MTDATA) | Tetraethyleneglycol dimethyl ether | 275 | 31.8 | 1,3-Dipropoxybenzene | 251 | -24 | × | × | × |
| COMPARATIVE EXAMPLE 1-155 | | | | | 4-Methoxybenzaldehyde Dimethyl Acetal | 253 | -22 | × | × | × |
| COMPARATIVE EXAMPLE 1-156 | | | | | 4,4'-Difluorodiphenylmethane | 258 | -17 | × | × | × |
| COMPARATIVE EXAMPLE 1-157 | | | | | Diphenyl ether | 259 | -16 | × | × | × |
| COMPARATIVE EXAMPLE 1-158 | | | | | 1,2-Dimethoxy-4-(1-propenyl)benzene | 264 | -11 | × | × | × |
| COMPARATIVE EXAMPLE 1-159 | | | | | MDPE | 265 | -10 | × | × | × |
| COMPARATIVE EXAMPLE 1-160 | | | | | Diphenyl methane | 265 | -10 | × | × | × |
| COMPARATIVE EXAMPLE 1-161 | | | | | 2-Phenylpyridine | 268 | -7 | × | × | × |
| COMPARATIVE EXAMPLE 1-162 | | | | | DMDPE | 270 | -5 | × | × | × |
| COMPARATIVE EXAMPLE 1-163 | | | | | 3-Phenoxytoluene | 272 | -3 | × | × | × |
| COMPARATIVE EXAMPLE 1-164 | | | | | 3-Phenylpyridine | 272 | -3 | × | × | × |
| COMPARATIVE EXAMPLE 1-165 | | | | | 2-Phenylanisole | 274 | -1 | × | × | × |
| COMPARATIVE EXAMPLE 1-166 | | | | | 2-Phenoxytetrahydropuran | 275 | 0 | × | × | × |
| COMPARATIVE EXAMPLE 1-167 | | | | | NPBP | 280 | 5 | × | × | × |
| COMPARATIVE EXAMPLE 1-168 | | | | | 25DMDPE | 280 | 5 | × | × | × |
| COMPARATIVE EXAMPLE 1-169 | | | | | Ethyl 2-Naphthyl Ether | 282 | 7 | × | × | × |
| COMPARATIVE EXAMPLE 1-170 | | | | | 225TMDPE | 290 | 15 | × | × | × |
| COMPARATIVE EXAMPLE 1-171 | | | | | Dibenzyl Ether | 295 | 20 | △ | △ | △ |
| COMPARATIVE EXAMPLE 1-172 | | | | | 235TMDPE | 295 | 20 | △ | △ | △ |
| EXAMPLE 1-73 | | | | | N-Methyldiphenylamine | 297 | 22 | △ | △ | △ |
| EXAMPLE 1-74 | | | | | 4-Isopropylbiphenyl | 298 | 23 | ○ | △ | △ |
| EXAMPLE 1-75 | | | | | α,α-Dichlorodiphenylmethane | 305 | 30 | ○ | △ | △ |
| EXAMPLE 1-76 | | | | | 4-(3-phenylpropyl)pyridine | 322 | 47 | ○ | △ | △ |
| | | | | | Benzyl Benzoate | 324 | 49 | ○ | △ | △ |
| | | | | | 1,1-Bis(3,4-Dimethylphenyl)ethane | 333 | 58 | | △ | △ |

FIG. 17

<INK FOR FORMING POSITIVE HOLE INJECTION LAYER>

FIRST COMPONENT : SECOND COMPONENT = 30 : 70   THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 1-77 | 4,4',4''-Tris[N-(3-methylphenyl)-N-phenylamino]-triphenylamine(MTDATA) | Diethyleneglycol butylmethyl ether | 212 | 24.1 | 1,3-Dipropoxybenzene | 251 | 39 | ○ | ○ | ○ |
| EXAMPLE 1-78 | | | | | 4-Methoxybenzaldehyde Dimethyl Acetal | 253 | 41 | ○ | ○ | ○ |
| EXAMPLE 1-79 | | | | | 4,4'-Difluorodiphenylmethane | 258 | 46 | ○ | ○ | ○ |
| EXAMPLE 1-80 | | | | | Diphenyl ether | 259 | 47 | ○ | ○ | ○ |
| EXAMPLE 1-81 | | | | | 1,2-Dimethoxy-4-(1-propenyl)benzene | 264 | 52 | ○ | ○ | ○ |
| EXAMPLE 1-82 | | | | | MDPE | 265 | 53 | ○ | ○ | ○ |
| EXAMPLE 1-83 | | | | | Diphenyl methane | 265 | 53 | ○ | ○ | ○ |
| EXAMPLE 1-84 | | | | | 2-Phenylpyridine | 268 | 56 | ○ | ○ | ○ |
| EXAMPLE 1-85 | | | | | DMDPE | 270 | 58 | ○ | ○ | ○ |
| EXAMPLE 1-86 | | | | | 3-Phenoxytoluene | 272 | 60 | ○ | ○ | ○ |
| EXAMPLE 1-87 | | | | | 3-Phenylpyridine | 272 | 60 | ○ | ○ | ○ |
| EXAMPLE 1-88 | | | | | 2-Phenylanisole | 274 | 62 | ○ | ○ | ○ |
| EXAMPLE 1-89 | | | | | 2-Phenoxytetrahydropuran | 275 | 63 | ○ | ○ | ○ |
| EXAMPLE 1-90 | | | | | NPBP | 280 | 68 | ○ | ○ | ○ |
| EXAMPLE 1-91 | | | | | 25DMDPE | 280 | 68 | ○ | ○ | ○ |
| EXAMPLE 1-92 | | | | | Ethyl 2-Naphthyl Ether | 282 | 70 | ○ | ○ | ○ |
| EXAMPLE 1-93 | | | | | 22STMDPE | 290 | 78 | ○ | ○ | ○ |
| EXAMPLE 1-94 | | | | | Dibenzyl Ether | 295 | 83 | ○ | ○ | ○ |
| EXAMPLE 1-95 | | | | | 23STMDPE | 295 | 83 | ○ | ○ | ○ |
| EXAMPLE 1-96 | | | | | N-Methyldiphenylamine | 297 | 85 | ○ | ○ | ○ |
| EXAMPLE 1-97 | | | | | 4-Isopropylbiphenyl | 298 | 86 | ○ | ○ | ○ |
| EXAMPLE 1-98 | | | | | α, α'-Dichlorodiphenylmethane | 305 | 93 | ○ | ○ | ○ |
| EXAMPLE 1-99 | | | | | 4-(3-phenylpropyl)pyridine | 322 | 110 | ○ | △ | △ |
| EXAMPLE 1-100 | | | | | Benzyl Benzoate | 324 | 112 | ○ | △ | △ |
| EXAMPLE 1-101 | | | | | 1,1-Bis(3,4-Dimethylphenyl)ethane | 333 | 121 | ○ | △ | △ |

FIG. 18

<INK FOR FORMING POSITIVE HOLE INJECTION LAYER>

| No. | THIRD COMPONENT COMPONENT NAME | SECOND COMPONENT SOLVENT NAME | SECOND COMPONENT BOILING POINT (°C) | SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-175 | 4,4',4''-Tris(N-(3-methylphenyl)-N-phenylamino)-triphenylamine(m-MTDATA) | Diethyleneglycol dibutyl ether | 256 | 24.9 | 1,3-Dipropoxybenzene | 251 | −5 | × | × | × |
| COMPARATIVE EXAMPLE 1-176 | | | | | 4-Methoxybenzaldehyde Dimethyl Acetal | 253 | −3 | × | × | × |
| COMPARATIVE EXAMPLE 1-177 | | | | | 4,4'-Difluorodiphenylmethane | 258 | 2 | × | × | × |
| COMPARATIVE EXAMPLE 1-178 | | | | | Diphenyl ether | 259 | 3 | × | × | × |
| COMPARATIVE EXAMPLE 1-179 | | | | | 1,2-Dimethoxy-4-(1-propenyl)benzene | 264 | 8 | × | × | × |
| COMPARATIVE EXAMPLE 1-180 | | | | | MDPE | 265 | 9 | × | × | △ |
| COMPARATIVE EXAMPLE 1-181 | | | | | Diphenyl methane | 265 | 9 | × | × | × |
| COMPARATIVE EXAMPLE 1-182 | | | | | 2-Phenylpyridine | 268 | 12 | △ | × | △ |
| COMPARATIVE EXAMPLE 1-183 | | | | | DMDPE | 270 | 14 | △ | × | △ |
| COMPARATIVE EXAMPLE 1-184 | | | | | 3-Phenoxytoluene | 272 | 16 | △ | × | △ |
| COMPARATIVE EXAMPLE 1-185 | | | | | 3-Phenylpyridine | 272 | 16 | △ | × | △ |
| COMPARATIVE EXAMPLE 1-186 | | | | | 2-Phenylanisole | 274 | 18 | △ | × | △ |
| COMPARATIVE EXAMPLE 1-187 | | | | | 2-Phenoxytetrahydropuran | 275 | 19 | △ | × | △ |
| COMPARATIVE EXAMPLE 1-188 | | | | | NPBP | 280 | 24 | △ | △ | △ |
| COMPARATIVE EXAMPLE 1-189 | | | | | 25DMDPE | 280 | 24 | ○ | △ | ○ |
| COMPARATIVE EXAMPLE 1-190 | | | | | Ethyl 2-Naphthyl Ether | 282 | 26 | ○ | ◎ | ○ |
| EXAMPLE 1-102 | | | | | 22STMDPE | 290 | 34 | ○ | ◎ | ○ |
| EXAMPLE 1-103 | | | | | Dibenzyl Ether | 295 | 39 | ○ | ◎ | ○ |
| EXAMPLE 1-104 | | | | | 235TMDPE | 295 | 39 | ○ | ◎ | ○ |
| EXAMPLE 1-105 | | | | | N-Methyldiphenylamine | 297 | 41 | ○ | ○ | ○ |
| EXAMPLE 1-106 | | | | | 4-Isopropylbiphenyl | 298 | 42 | ○ | △ | △ |
| EXAMPLE 1-107 | | | | | α,α-Dichlorodiphenylmethane | 305 | 49 | ○ | △ | △ |
| EXAMPLE 1-108 | | | | | 4-(3-phenylpropyl)pyridine | 322 | 66 | ○ | △ | △ |
| EXAMPLE 1-109 | | | | | Benzyl Benzoate | 324 | 68 | ○ | △ | △ |
| EXAMPLE 1-110 | | | | | 1,1-Bis(3,4-Dimethylphenyl)ethane | 333 | 77 | ○ | △ | △ |

FIRST COMPONENT : SECOND COMPONENT : THIRD COMPONENT = 30 : 70 : 0.3 wt%

FIG. 19

⟨INK FOR FORMING POSITIVE HOLE INJECTION LAYER⟩

FIRST COMPONENT : SECOND COMPONENT = 30 : 70, THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | $\Delta bp$ (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE I-191 | 4,4',4''-Tris(N-(3-methylphenyl)-N-phenylamino)triphenylamine (m-MTDATA) | Tetraethyleneglycol dimethyl ether | 275 | 31.8 | 1,3-Dipropoxybenzene | 251 | -24 | × | × | × |
| COMPARATIVE EXAMPLE I-192 | | | | | 4-Methoxybenzaldehyde Dimethyl Acetal | 253 | -22 | × | × | × |
| COMPARATIVE EXAMPLE I-193 | | | | | 4,4'-Difluorodiphenylmethane | 258 | -17 | × | × | × |
| COMPARATIVE EXAMPLE I-194 | | | | | Diphenyl ether | 259 | -16 | × | × | × |
| COMPARATIVE EXAMPLE I-195 | | | | | 1,2-Dimethoxy-4-(1-propenyl)benzene | 264 | -11 | × | × | × |
| COMPARATIVE EXAMPLE I-196 | | | | | MDPE | 265 | -10 | × | × | × |
| COMPARATIVE EXAMPLE I-197 | | | | | Diphenyl methane | 265 | -10 | × | × | × |
| COMPARATIVE EXAMPLE I-198 | | | | | 2-Phenylpyridine | 268 | -7 | × | × | × |
| COMPARATIVE EXAMPLE I-199 | | | | | DMDPE | 270 | -5 | × | × | × |
| COMPARATIVE EXAMPLE I-200 | | | | | 3-Phenoxytoluene | 272 | -3 | × | × | × |
| COMPARATIVE EXAMPLE I-201 | | | | | 3-Phenylpyridine | 272 | -3 | × | × | × |
| COMPARATIVE EXAMPLE I-202 | | | | | 2-Phenylanisole | 274 | -1 | × | × | × |
| COMPARATIVE EXAMPLE I-203 | | | | | 2-Phenoxytetrahydropuran | 275 | 0 | × | × | × |
| COMPARATIVE EXAMPLE I-204 | | | | | NPBP | 280 | 5 | × | × | × |
| COMPARATIVE EXAMPLE I-205 | | | | | 26DMDPE | 280 | 5 | × | × | × |
| COMPARATIVE EXAMPLE I-206 | | | | | Ethyl 2-Naphthyl Ether | 282 | 7 | × | × | × |
| COMPARATIVE EXAMPLE I-207 | | | | | 225TMDPE | 290 | 15 | × | × | × |
| COMPARATIVE EXAMPLE I-208 | | | | | Dibenzyl Ether | 295 | 20 | △ | △ | △ |
| COMPARATIVE EXAMPLE I-209 | | | | | 235TMDPE | 295 | 20 | △ | △ | △ |
| COMPARATIVE EXAMPLE I-210 | | | | | N-Methyldiphenylamine | 297 | 22 | △ | △ | △ |
| COMPARATIVE EXAMPLE I-211 | | | | | 4-Isopropylbiphenyl | 298 | 23 | △ | △ | △ |
| EXAMPLE I-111 | | | | | α,α-Dichlorodiphenylmethane | 305 | 30 | ○ | △ | △ |
| EXAMPLE I-112 | | | | | 4-(3-phenylpropyl)pyridine | 322 | 47 | ○ | △ | △ |
| EXAMPLE I-113 | | | | | Benzyl Benzoate | 324 | 49 | ○ | △ | △ |
| EXAMPLE I-114 | | | | | 1,1-Bis(3,4-Dimethylphenyl)ethane | 333 | 58 | ○ | △ | △ |

FIG. 20

<INK FOR FORMING POSITIVE HOLE INJECTION LAYER>

FIRST COMPONENT : SECOND COMPONENT = 20 : 80, THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-212 | 4,4',4''-Tris(N-3-methylphenyl-N-phenylamino)-triphenylamine(m-MTDATA) | Diethyleneglycol butylmethyl ether | 212 | 24.1 | 1,3-Dipropoxybenzene | 251 | 39 | ○ | × | × |
| COMPARATIVE EXAMPLE 1-213 | | | | | 4-Methoxybenzaldehyde Dimethyl Acetal | 253 | 41 | ○ | × | × |
| COMPARATIVE EXAMPLE 1-214 | | | | | 4,4'-Difluorodiphenylmethane | 258 | 46 | ○ | × | × |
| COMPARATIVE EXAMPLE 1-215 | | | | | Diphenyl ether | 259 | 47 | ○ | × | × |
| COMPARATIVE EXAMPLE 1-216 | | | | | 1,2-Dimethoxy-4-(1-propenyl)benzene | 264 | 52 | ○ | × | × |
| COMPARATIVE EXAMPLE 1-217 | | | | | MDPE | 265 | 53 | ○ | × | × |
| COMPARATIVE EXAMPLE 1-218 | | | | | Diphenyl methane | 265 | 53 | ○ | × | × |
| COMPARATIVE EXAMPLE 1-219 | | | | | 2-Phenylpyridine | 268 | 56 | ○ | × | × |
| COMPARATIVE EXAMPLE 1-220 | | | | | DMDPE | 270 | 58 | ○ | × | × |
| COMPARATIVE EXAMPLE 1-221 | | | | | 3-Phenoxytoluene | 272 | 60 | ○ | × | × |
| COMPARATIVE EXAMPLE 1-222 | | | | | 3-Phenylpyridine | 272 | 60 | ○ | × | × |
| COMPARATIVE EXAMPLE 1-223 | | | | | 2-Phenylanisole | 274 | 62 | ○ | × | × |
| COMPARATIVE EXAMPLE 1-224 | | | | | 2-Phenoxytetrahydrofuran | 275 | 63 | ○ | × | × |
| COMPARATIVE EXAMPLE 1-225 | | | | | NPBP | 280 | 68 | ○ | × | × |
| COMPARATIVE EXAMPLE 1-226 | | | | | 25DMDPE | 280 | 68 | ○ | × | × |
| COMPARATIVE EXAMPLE 1-227 | | | | | Ethyl 2-Naphthyl Ether | 282 | 70 | ○ | × | × |
| COMPARATIVE EXAMPLE 1-228 | | | | | 225TMDPE | 290 | 78 | ○ | × | × |
| COMPARATIVE EXAMPLE 1-229 | | | | | Dibenzyl Ether | 295 | 83 | ○ | × | × |
| COMPARATIVE EXAMPLE 1-230 | | | | | 235TMDPE | 295 | 83 | ○ | × | × |
| COMPARATIVE EXAMPLE 1-231 | | | | | N-Methyldiphenylamine | 297 | 85 | ○ | × | × |
| COMPARATIVE EXAMPLE 1-232 | | | | | 4-isopropylbiphenyl | 298 | 86 | ○ | × | × |
| COMPARATIVE EXAMPLE 1-233 | | | | | α,α-Dichlorodiphenylmethane | 305 | 93 | ○ | × | × |
| COMPARATIVE EXAMPLE 1-234 | | | | | 4-(3-phenylpropyl)pyridine | 322 | 110 | ○ | × | × |
| COMPARATIVE EXAMPLE 1-235 | | | | | Benzyl Benzoate | 324 | 112 | ○ | × | × |
| COMPARATIVE EXAMPLE 1-236 | | | | | 1,1-Bis(3,4-Dimethylphenyl)ethane | 333 | 121 | ○ | × | × |

FIG. 21

<INK FOR FORMING POSITIVE HOLE INJECTION LAYER>

FIRST COMPONENT, SECOND COMPONENT = 22, 80, THIRD COMPONENT 0.1 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE I-237 | 4,4',4''-Tris[N-(3-methylphenyl)-N-phenylamino]-triphenylamine (m-MTDATA) | Diethyleneglycol dibutyl ether | 256 | 24.9 | 1,3-Dipropoxybenzene | 251 | -5 | × | × | × |
| COMPARATIVE EXAMPLE I-238 | | | | | 4-Methoxybenzaldehyde Dimethyl Acetal | 253 | -3 | × | × | × |
| COMPARATIVE EXAMPLE I-239 | | | | | 4,4'-Difluorodiphenylmethane | 258 | 2 | × | × | × |
| COMPARATIVE EXAMPLE I-240 | | | | | Diphenyl ether | 259 | 3 | × | × | × |
| COMPARATIVE EXAMPLE I-241 | | | | | 1,2-Dimethoxy-4-(1-propenyl)benzene | 264 | 8 | × | × | × |
| COMPARATIVE EXAMPLE I-242 | | | | | MDPE | 265 | 9 | × | × | × |
| COMPARATIVE EXAMPLE I-243 | | | | | Diphenyl methane | 265 | 9 | × | × | × |
| COMPARATIVE EXAMPLE I-244 | | | | | 2-Phenylpyridine | 268 | 12 | × | × | × |
| COMPARATIVE EXAMPLE I-245 | | | | | DMDPE | 270 | 14 | △ | × | × |
| COMPARATIVE EXAMPLE I-246 | | | | | 3-Phenoxytoluene | 272 | 16 | △ | × | × |
| COMPARATIVE EXAMPLE I-247 | | | | | 3-Phenylpyridine | 272 | 16 | △ | × | × |
| COMPARATIVE EXAMPLE I-248 | | | | | 2-Phenylanisole | 274 | 18 | △ | × | × |
| COMPARATIVE EXAMPLE I-249 | | | | | 2-Phenoxytetrahydropuran | 275 | 19 | △ | × | × |
| COMPARATIVE EXAMPLE I-250 | | | | | NPBP | 280 | 24 | △ | × | × |
| COMPARATIVE EXAMPLE I-251 | | | | | 25DMDPE | 280 | 24 | △ | × | × |
| COMPARATIVE EXAMPLE I-252 | | | | | Ethyl 2-Naphthyl Ether | 282 | 26 | △ | × | × |
| COMPARATIVE EXAMPLE I-253 | | | | | 225TMDPE | 290 | 34 | ○ | × | × |
| COMPARATIVE EXAMPLE I-254 | | | | | Dibenzyl Ether | 295 | 39 | ○ | × | × |
| COMPARATIVE EXAMPLE I-255 | | | | | 235TMDPE | 295 | 39 | ○ | × | × |
| COMPARATIVE EXAMPLE I-256 | | | | | N-Methyldiphenylamine | 297 | 41 | ○ | × | × |
| COMPARATIVE EXAMPLE I-257 | | | | | 4-Isopropylbiphenyl | 298 | 42 | ○ | × | × |
| COMPARATIVE EXAMPLE I-258 | | | | | α,α-Dichlorodiphenylmethane | 305 | 49 | ○ | × | × |
| COMPARATIVE EXAMPLE I-259 | | | | | 4-(3-phenylpropyl)pyridine | 322 | 66 | ○ | × | × |
| COMPARATIVE EXAMPLE I-260 | | | | | Benzyl Benzoate | 324 | 68 | ○ | × | × |
| COMPARATIVE EXAMPLE I-261 | | | | | 1,1-Bis(3,4-Dimethylphenyl)ethane | 333 | 77 | ○ | × | × |

FIG. 22

<INK FOR FORMING POSITIVE HOLE INJECTION LAYER>
FIRST COMPONENT : SECOND COMPONENT = 20 : 80   THIRD COMPONENT 0.3 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 1-262 | 4,4',4''-Tris(N-3-methylphenyl-N-phenylamino)-triphenylamine(m-MTDATA) | Tetraethyleneglycol dimethyl ether | 275 | 31.8 | 1,3-Dipropoxybenzene | 251 | -24 | × | × | × |
| COMPARATIVE EXAMPLE 1-263 | | | | | 4-Methoxybenzaldehyde Dimethyl Acetal | 253 | -22 | × | × | × |
| COMPARATIVE EXAMPLE 1-264 | | | | | 4,4'-Difluorodiphenylmethane | 258 | -17 | × | × | × |
| COMPARATIVE EXAMPLE 1-265 | | | | | Diphenyl ether | 259 | -16 | × | × | × |
| COMPARATIVE EXAMPLE 1-266 | | | | | 1,2-Dimethoxy-4-(1-propenyl)benzene | 264 | -11 | × | × | × |
| COMPARATIVE EXAMPLE 1-267 | | | | | MDPE | 265 | -10 | × | × | × |
| COMPARATIVE EXAMPLE 1-268 | | | | | Diphenyl methane | 265 | -10 | × | × | × |
| COMPARATIVE EXAMPLE 1-269 | | | | | 2-Phenylpyridine | 268 | -7 | × | × | × |
| COMPARATIVE EXAMPLE 1-270 | | | | | DMDPE | 270 | -5 | × | × | × |
| COMPARATIVE EXAMPLE 1-271 | | | | | 3-Phenoxytoluene | 272 | -3 | × | × | × |
| COMPARATIVE EXAMPLE 1-272 | | | | | 3-Phenylpyridine | 272 | -3 | × | × | × |
| COMPARATIVE EXAMPLE 1-273 | | | | | 2-Phenylanisole | 274 | -1 | × | × | × |
| COMPARATIVE EXAMPLE 1-274 | | | | | 2-Phenoxytetrahydropuran | 275 | 0 | × | × | × |
| COMPARATIVE EXAMPLE 1-275 | | | | | NPBP | 280 | 5 | × | × | × |
| COMPARATIVE EXAMPLE 1-276 | | | | | 26DMDPE | 280 | 5 | × | × | × |
| COMPARATIVE EXAMPLE 1-277 | | | | | Ethyl 2-Napthyl Ether | 282 | 7 | × | × | × |
| COMPARATIVE EXAMPLE 1-278 | | | | | 226TMDPE | 290 | 15 | × | × | × |
| COMPARATIVE EXAMPLE 1-279 | | | | | Dibenzyl Ether | 295 | 20 | × | × | × |
| COMPARATIVE EXAMPLE 1-280 | | | | | 235TMDPE | 295 | 20 | △ | × | × |
| COMPARATIVE EXAMPLE 1-281 | | | | | N-Methyldiphenylamine | 297 | 22 | △ | × | × |
| COMPARATIVE EXAMPLE 1-282 | | | | | 4-Isopropylbiphenyl | 298 | 23 | △ | × | × |
| COMPARATIVE EXAMPLE 1-283 | | | | | α,α-Dichlorodiphenylmethane | 305 | 30 | ○ | × | × |
| COMPARATIVE EXAMPLE 1-284 | | | | | 4-(3-phenylpropyl)pyridine | 322 | 47 | ○ | × | × |
| COMPARATIVE EXAMPLE 1-285 | | | | | Benzyl Benzoate | 324 | 49 | ○ | × | × |
| COMPARATIVE EXAMPLE 1-286 | | | | | 1,1-Bis(3,4-Dimethylphenyl)ethane | 333 | 58 | ○ | × | × |

FIG. 23

<INK FOR FORMING POSITIVE HOLE TRANSPORT LAYER>

FIRST COMPONENT : SECOND COMPONENT : THIRD COMPONENT = 100 : 0 : THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | WETTING SPREAD DEFECT | STAIN | LIGHT EMITTING FAILURE IN DARK SPOT OR BRIGHT SPOT |
|---|---|---|---|---|---|---|---|---|---|
| COMPARATIVE EXAMPLE 2-1 | TFB poly(9,9-dioctyl-fluorene-co-N-(4-butylphenyl)-diphenylamine) | NOT INCLUDED | | | 1,3-Dipropoxybenzene | 251 | △ | △ | △ |
| COMPARATIVE EXAMPLE 2-2 | | | | | 4-Methoxybenzaldehyde Dimethyl Acetal | 253 | △ | △ | △ |
| COMPARATIVE EXAMPLE 2-3 | | | | | 4,4'-Difluorodiphenylmethane | 258 | △ | △ | △ |
| COMPARATIVE EXAMPLE 2-4 | | | | | Diphenyl ether | 259 | △ | △ | △ |
| COMPARATIVE EXAMPLE 2-5 | | | | | 1,2-Dimethoxy-4-(1-propenyl)benzene | 264 | △ | △ | △ |
| COMPARATIVE EXAMPLE 2-6 | | | | | MDPE | 265 | △ | △ | △ |
| COMPARATIVE EXAMPLE 2-7 | | | | | Diphenyl methane | 265 | △ | △ | △ |
| COMPARATIVE EXAMPLE 2-8 | | | | | 2-Phenylpyridine | 268 | △ | △ | △ |
| COMPARATIVE EXAMPLE 2-9 | | | | | DMDPE | 270 | △ | △ | △ |
| COMPARATIVE EXAMPLE 2-10 | | | | | 3-Phenoxytoluene | 272 | △ | △ | △ |
| COMPARATIVE EXAMPLE 2-11 | | | | | 3-Phenylpyridine | 272 | △ | △ | △ |
| COMPARATIVE EXAMPLE 2-12 | | | | | 2-Phenylanisole | 274 | △ | △ | △ |
| COMPARATIVE EXAMPLE 2-13 | | | | | 2-Phenoxytetrahydrofuran | 275 | △ | △ | △ |
| COMPARATIVE EXAMPLE 2-14 | | | | | NPBP | 280 | △ | △ | △ |
| COMPARATIVE EXAMPLE 2-15 | | | | | 26DMDPE | 280 | △ | △ | △ |
| COMPARATIVE EXAMPLE 2-16 | | | | | Ethyl 2-Naphthyl Ether | 282 | △ | △ | △ |
| COMPARATIVE EXAMPLE 2-17 | | | | | 225TMDPE | 290 | △ | △ | △ |
| COMPARATIVE EXAMPLE 2-18 | | | | | Dibenzyl Ether | 295 | △ | △ | △ |
| COMPARATIVE EXAMPLE 2-19 | | | | | 235TMDPE | 295 | △ | △ | △ |
| COMPARATIVE EXAMPLE 2-20 | | | | | N-Methyldiphenylamine | 297 | △ | △ | △ |
| COMPARATIVE EXAMPLE 2-21 | | | | | 4-Isopropylbiphenyl | 298 | △ | △ | △ |
| COMPARATIVE EXAMPLE 2-22 | | | | | α,α-Dichlorodiphenylmethane | 305 | △ | △ | △ |
| COMPARATIVE EXAMPLE 2-23 | | | | | 4-(3-phenylpropyl)pyridine | 322 | △ | △ | △ |
| COMPARATIVE EXAMPLE 2-24 | | | | | Benzyl Benzoate | 324 | △ | △ | △ |
| COMPARATIVE EXAMPLE 2-25 | | | | | 1,1-Bis(3,4-Dimethylphenyl)ethane | 333 | △ | △ | △ |

FIG. 24

< INK FOR FORMING POSITIVE HOLE TRANSPORT LAYER >

FIRST COMPONENT:SECOND COMPONENT = 80:20 THIRD COMPONENT 0.5 wt%

| No. | THIRD COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD EFFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-26 | TFB poly(9,9-dioctyl-fluorene-co-N-(4-butylphenyl)-diphenylamine) | Diethylene glycol butyl methyl ether | 212 | 24.1 | 1,3-Dipropoxybenzene | 251 | 39 | △ | △ | △ |
| COMPARATIVE EXAMPLE 2-27 | | | | | 4-Methoxybenzaldehyde Dimethyl Acetal | 253 | 41 | △ | △ | △ |
| COMPARATIVE EXAMPLE 2-28 | | | | | 4,4-Difluorodiphenylmethane | 258 | 46 | △ | △ | △ |
| COMPARATIVE EXAMPLE 2-29 | | | | | Diphenyl ether | 259 | 47 | △ | △ | △ |
| COMPARATIVE EXAMPLE 2-30 | | | | | 1,2-Dimethoxy-4-(1-propenyl)benzene | 264 | 52 | △ | △ | △ |
| COMPARATIVE EXAMPLE 2-31 | | | | | MDPE | 265 | 53 | △ | △ | △ |
| COMPARATIVE EXAMPLE 2-32 | | | | | Diphenyl methane | 265 | 53 | △ | △ | △ |
| COMPARATIVE EXAMPLE 2-33 | | | | | 2-Phenylpyridine | 268 | 56 | △ | △ | △ |
| COMPARATIVE EXAMPLE 2-34 | | | | | DMDPE | 270 | 58 | △ | △ | △ |
| COMPARATIVE EXAMPLE 2-35 | | | | | 3-Phenoxytoluene | 272 | 60 | △ | △ | △ |
| COMPARATIVE EXAMPLE 2-36 | | | | | 3-Phenylpyridine | 272 | 60 | △ | △ | △ |
| COMPARATIVE EXAMPLE 2-37 | | | | | 2-Phenylanisole | 274 | 62 | △ | △ | △ |
| COMPARATIVE EXAMPLE 2-38 | | | | | 2-Phenoxytetrahydropuran | 275 | 63 | △ | △ | △ |
| COMPARATIVE EXAMPLE 2-39 | | | | | NPBP | 280 | 68 | △ | △ | △ |
| COMPARATIVE EXAMPLE 2-40 | | | | | 25DMDPE | 280 | 68 | △ | △ | △ |
| COMPARATIVE EXAMPLE 2-41 | | | | | Ethyl 2-Naphthyl Ether | 282 | 70 | △ | △ | △ |
| COMPARATIVE EXAMPLE 2-42 | | | | | 225TMDPE | 290 | 78 | △ | △ | △ |
| COMPARATIVE EXAMPLE 2-43 | | | | | Dibenzyl Ether | 295 | 83 | △ | △ | △ |
| COMPARATIVE EXAMPLE 2-44 | | | | | 235TMDPE | 295 | 83 | △ | △ | △ |
| COMPARATIVE EXAMPLE 2-45 | | | | | N-Methyldiphenylamine | 297 | 85 | △ | △ | △ |
| COMPARATIVE EXAMPLE 2-46 | | | | | 4-Isopropylbiphenyl | 298 | 86 | △ | △ | △ |
| COMPARATIVE EXAMPLE 2-47 | | | | | α,α-Dichlorodiphenylmethane | 305 | 93 | △ | △ | △ |
| COMPARATIVE EXAMPLE 2-48 | | | | | 4-(3-phenylpropyl)pyridine | 322 | 110 | △ | △ | △ |
| COMPARATIVE EXAMPLE 2-49 | | | | | Benzyl Benzoate | 324 | 112 | △ | △ | △ |
| COMPARATIVE EXAMPLE 2-50 | | | | | 1,1-Bis(3,4-Dimethylphenyl)methane | 333 | 121 | △ | △ | △ |

FIG. 25

<INK FOR FORMING POSITIVE HOLE TRANSPORT LAYER>

| No. | THIRD COMPONENT | | SECOND COMPONENT | | | FIRST COMPONENT | | WETTING SPREAD DEFECT | STAIN | LIGHT EMITTING FAILURE IN DARK SPOT OR BRIGHT SPOT |
|---|---|---|---|---|---|---|---|---|---|---|
| | COMPONENT NAME | SOLVENT NAME | BOILING POINT (°C) | SURFACE TENSION (mN/m) | SOLVENT NAME | BOILING POINT (°C) | Δbp(°C) | | | |
| COMPARATIVE EXAMPLE 2-51 | TFB poly(9,9-dioctyl-fluorene-co-N-(4-butylphenyl)-diphenylamine) | Diethyleneglycol dibutyl ether | 256 | 24.9 | 1,3-Dipropoxybenzene | 251 | -5 | △ | △ | △ |
| COMPARATIVE EXAMPLE 2-52 | | | | | 4-Methoxybenzacetaldehyde Dimethyl Acetal | 253 | -3 | △ | △ | △ |
| COMPARATIVE EXAMPLE 2-53 | | | | | 4,4'-Difluorodiphenylmethane | 258 | 2 | △ | △ | △ |
| COMPARATIVE EXAMPLE 2-54 | | | | | Diphenyl ether | 259 | 3 | △ | △ | △ |
| COMPARATIVE EXAMPLE 2-55 | | | | | 1,2-Dimethoxy-4-(1-propenyl)benzene | 264 | 8 | △ | △ | △ |
| COMPARATIVE EXAMPLE 2-56 | | | | | MDPE | 265 | 9 | △ | △ | △ |
| COMPARATIVE EXAMPLE 2-57 | | | | | Diphenyl methane | 265 | 9 | △ | △ | △ |
| COMPARATIVE EXAMPLE 2-58 | | | | | 2-Phenylpyridine | 268 | 12 | △ | △ | △ |
| COMPARATIVE EXAMPLE 2-59 | | | | | DMDPE | 270 | 14 | △ | △ | △ |
| COMPARATIVE EXAMPLE 2-60 | | | | | 3-Phenoxytoluene | 272 | 16 | △ | △ | △ |
| COMPARATIVE EXAMPLE 2-61 | | | | | 3-Phenylpyridine | 272 | 16 | △ | △ | △ |
| COMPARATIVE EXAMPLE 2-62 | | | | | 2-Phenylanisole | 274 | 18 | △ | △ | △ |
| COMPARATIVE EXAMPLE 2-63 | | | | | 2-Phenoxytetrahydrofuran | 275 | 19 | △ | △ | △ |
| COMPARATIVE EXAMPLE 2-64 | | | | | NPBP | 280 | 24 | △ | △ | △ |
| COMPARATIVE EXAMPLE 2-65 | | | | | 25DMDPE | 280 | 24 | △ | △ | △ |
| COMPARATIVE EXAMPLE 2-66 | | | | | Ethyl 2-Naphthyl Ether | 282 | 26 | △ | △ | △ |
| COMPARATIVE EXAMPLE 2-67 | | | | | 225TMDPE | 290 | 34 | △ | △ | △ |
| COMPARATIVE EXAMPLE 2-68 | | | | | Dibenzyl Ether | 295 | 39 | △ | △ | △ |
| COMPARATIVE EXAMPLE 2-69 | | | | | 235TMDPE | 295 | 39 | △ | △ | △ |
| COMPARATIVE EXAMPLE 2-70 | | | | | N-Methyldiphenylamine | 297 | 41 | △ | △ | △ |
| COMPARATIVE EXAMPLE 2-71 | | | | | 4-Isopropylbiphenyl | 298 | 42 | △ | △ | △ |
| COMPARATIVE EXAMPLE 2-72 | | | | | α,α-Dichlorodiphenylmethane | 305 | 49 | △ | △ | △ |
| COMPARATIVE EXAMPLE 2-73 | | | | | 4-(3-phenylpropyl)pyridine | 322 | 66 | △ | △ | △ |
| COMPARATIVE EXAMPLE 2-74 | | | | | Benzyl Benzoate | 324 | 68 | △ | △ | △ |
| COMPARATIVE EXAMPLE 2-75 | | | | | 1,1-Bis(3,4-Dimethylphenyl)ethane | 333 | 77 | △ | △ | △ |

FIRST COMPONENT : SECOND COMPONENT = 80 : 20  THIRD COMPONENT 0.5 wt%

FIG. 26

<INK FOR FORMING POSITIVE HOLE TRANSPORT LAYER>
FIRST COMPONENT : SECOND COMPONENT = 99.5 : THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-76 | TFB poly(9,9-dioctyl-fluorene-co-N-(4-butylphenyl)-diphenylamine) | Tetraethyleneglycol dimethyl ether | 275 | 31.8 | 1,3-Dipropoxybenzene | 251 | -24 | △ | △ | △ |
| COMPARATIVE EXAMPLE 2-77 | | | | | 4-Methoxybenzaldehyde Dimethyl Acetal | 253 | -22 | △ | △ | △ |
| COMPARATIVE EXAMPLE 2-78 | | | | | 4,4'-Difluorodiphenylmethane | 258 | -17 | △ | △ | △ |
| COMPARATIVE EXAMPLE 2-79 | | | | | Diphenyl ether | 259 | -16 | △ | △ | △ |
| COMPARATIVE EXAMPLE 2-80 | | | | | 1,2-Dimethoxy-4-(1-propenyl)benzene | 264 | -11 | △ | △ | △ |
| COMPARATIVE EXAMPLE 2-81 | | | | | MDPE | 265 | -10 | △ | △ | △ |
| COMPARATIVE EXAMPLE 2-82 | | | | | Diphenyl methane | 265 | -10 | △ | △ | △ |
| COMPARATIVE EXAMPLE 2-83 | | | | | 2-Phenylpyridine | 268 | -7 | △ | △ | △ |
| COMPARATIVE EXAMPLE 2-84 | | | | | DMDPE | 270 | -5 | △ | △ | △ |
| COMPARATIVE EXAMPLE 2-85 | | | | | 3-Phenoxytoluene | 272 | -3 | △ | △ | △ |
| COMPARATIVE EXAMPLE 2-86 | | | | | 3-Phenylpyridine | 272 | -3 | △ | △ | △ |
| COMPARATIVE EXAMPLE 2-87 | | | | | 2-Phenylanisole | 274 | -1 | △ | △ | △ |
| COMPARATIVE EXAMPLE 2-88 | | | | | 2-Phenyltetrahydropuran | 275 | 0 | △ | △ | △ |
| COMPARATIVE EXAMPLE 2-89 | | | | | NPBP | 280 | 5 | △ | △ | △ |
| COMPARATIVE EXAMPLE 2-90 | | | | | 25DMDPE | 280 | 5 | △ | △ | △ |
| COMPARATIVE EXAMPLE 2-91 | | | | | Ethyl 2-Naphthyl Ether | 282 | 7 | △ | △ | △ |
| COMPARATIVE EXAMPLE 2-92 | | | | | 225TMDPE | 290 | 15 | △ | △ | △ |
| COMPARATIVE EXAMPLE 2-93 | | | | | Dibenzyl Ether | 295 | 20 | △ | △ | △ |
| COMPARATIVE EXAMPLE 2-94 | | | | | 235TMDPE | 295 | 20 | △ | △ | △ |
| COMPARATIVE EXAMPLE 2-95 | | | | | N-Methyldiphenylamine | 297 | 22 | △ | △ | △ |
| COMPARATIVE EXAMPLE 2-96 | | | | | 4-Isopropoxybiphenyl | 298 | 23 | △ | △ | △ |
| COMPARATIVE EXAMPLE 2-97 | | | | | α,α-Dichlorodiphenylmethane | 305 | 30 | △ | △ | △ |
| COMPARATIVE EXAMPLE 2-98 | | | | | 4-(3-phenylpropyl)pyridine | 322 | 47 | △ | △ | △ |
| COMPARATIVE EXAMPLE 2-99 | | | | | Benzyl Benzoate | 324 | 49 | △ | △ | △ |
| COMPARATIVE EXAMPLE 2-100 | | | | | 1,1-Bis(3,4-Dimethylphenyl)methane | 333 | 58 | △ | △ | △ |

FIG. 27

⟨INK FOR FORMING POSITIVE HOLE TRANSPORT LAYER⟩

FIRST COMPONENT: SECOND COMPONENT = 70:30  THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 2-1 | TFB poly(9,9-dioctyl-fluorene-co-N-(4-butylphenyl)-diphenylamine) | Diethyleneglycol butylmethyl ether | 212 | 24.1 | 1,3-Dipropoxybenzene | 251 | 39 | ○ | ○ | ○ |
| EXAMPLE 2-2 | | | | | 4-Methoxybenzaldehyde Dimethyl Acetal | 253 | 41 | ○ | ○ | ○ |
| EXAMPLE 2-3 | | | | | 4,4'-Difluorodiphenylmethane | 258 | 46 | ○ | ○ | ○ |
| EXAMPLE 2-4 | | | | | Diphenyl ether | 259 | 47 | ○ | ○ | ○ |
| EXAMPLE 2-5 | | | | | 1,2-Dimethoxy-4-(1-propenyl)benzene | 264 | 52 | ◎ | ○ | ◎ |
| EXAMPLE 2-6 | | | | | MDPE | 265 | 53 | ◎ | ○ | ◎ |
| EXAMPLE 2-7 | | | | | Diphenyl methane | 265 | 53 | ◎ | ○ | ◎ |
| EXAMPLE 2-8 | | | | | 2-Phenylpyridine | 268 | 56 | ◎ | ○ | ◎ |
| EXAMPLE 2-9 | | | | | DMDPE | 270 | 58 | ◎ | ○ | ◎ |
| EXAMPLE 2-10 | | | | | 3-Phenoxytoluene | 272 | 60 | ◎ | ○ | ◎ |
| EXAMPLE 2-11 | | | | | 3-Phenylpyridine | 272 | 60 | ◎ | ○ | ◎ |
| EXAMPLE 2-12 | | | | | 2-Phenylanisole | 274 | 62 | ◎ | ○ | ◎ |
| EXAMPLE 2-13 | | | | | 2-Phenoxytetrahydrofuran | 275 | 63 | ◎ | ○ | ◎ |
| EXAMPLE 2-14 | | | | | NP3P | 280 | 68 | ◎ | ○ | ◎ |
| EXAMPLE 2-15 | | | | | 26DMDPE | 280 | 68 | ◎ | ○ | ◎ |
| EXAMPLE 2-16 | | | | | Ethyl 2-Naphthyl Ether | 282 | 70 | ◎ | ○ | ◎ |
| EXAMPLE 2-17 | | | | | 226TMDPE | 290 | 78 | ◎ | ○ | ◎ |
| EXAMPLE 2-18 | | | | | Dibenzyl Ether | 295 | 83 | ◎ | ○ | ◎ |
| EXAMPLE 2-19 | | | | | 235TMDPE | 295 | 83 | ◎ | ○ | ◎ |
| EXAMPLE 2-20 | | | | | N-Methyldiphenylamine | 297 | 85 | ◎ | ○ | ◎ |
| EXAMPLE 2-21 | | | | | 4-Isopropylbiphenyl | 298 | 86 | ◎ | ○ | ◎ |
| EXAMPLE 2-22 | | | | | α,α-Dichlorodiphenylmethane | 305 | 93 | ◎ | ○ | ◎ |
| EXAMPLE 2-23 | | | | | 4-(3-phenylpropyl)pyridine | 322 | 110 | ◎ | ○ | ◎ |
| EXAMPLE 2-24 | | | | | Benzyl Benzoate | 324 | 112 | ○ | ○ | ◎ |
| EXAMPLE 2-25 | | | | | 1,1-Bis(3,4-Dimethylphenyl)ethane | 333 | 121 | ○ | ○ | ◎ |

FIG. 28

<INK FOR FORMING POSITIVE HOLE TRANSPORT LAYER>
FIRST COMPONENT : SECOND COMPONENT : THIRD COMPONENT = 79.35 : 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-101 | TFB poly(9,9-dioctyl-fluorene-co-N-(4-butylphenyl)-diphenylamine) | Diethyleneglycol dibutyl ether | 256 | 24.9 | 1,3-Dipropoxybenzene | 251 | -5 | △ | △ | △ |
| COMPARATIVE EXAMPLE 2-102 | | | | | 4-Methoxybenzaldehyde Dimethyl Acetal | 253 | -3 | △ | △ | △ |
| COMPARATIVE EXAMPLE 2-103 | | | | | 4,4'-Difluorodiphenylmethane | 258 | 2 | △ | △ | △ |
| COMPARATIVE EXAMPLE 2-104 | | | | | Diphenyl ether | 259 | 3 | △ | △ | △ |
| COMPARATIVE EXAMPLE 2-105 | | | | | 1,2-Dimethoxy-4-(1-propenyl)benzene | 264 | 8 | △ | △ | △ |
| COMPARATIVE EXAMPLE 2-106 | | | | | MDPE | 265 | 9 | △ | △ | △ |
| COMPARATIVE EXAMPLE 2-107 | | | | | Diphenyl methane | 265 | 9 | △ | △ | △ |
| COMPARATIVE EXAMPLE 2-108 | | | | | 2-Phenylpyridine | 268 | 12 | △ | △ | △ |
| COMPARATIVE EXAMPLE 2-109 | | | | | DMDPE | 270 | 14 | △ | △ | △ |
| COMPARATIVE EXAMPLE 2-110 | | | | | 3-Phenoxytoluene | 272 | 16 | △ | △ | △ |
| COMPARATIVE EXAMPLE 2-111 | | | | | 3-Phenylpyridine | 272 | 16 | △ | △ | △ |
| COMPARATIVE EXAMPLE 2-112 | | | | | 2-Phenylanisole | 274 | 18 | △ | △ | △ |
| COMPARATIVE EXAMPLE 2-113 | | | | | 2-Phenoxytetrahydropuran | 275 | 19 | △ | △ | △ |
| COMPARATIVE EXAMPLE 2-114 | | | | | NPBP | 280 | 24 | △ | △ | △ |
| COMPARATIVE EXAMPLE 2-115 | | | | | 250MDPE | 280 | 24 | △ | △ | △ |
| COMPARATIVE EXAMPLE 2-116 | | | | | Ethyl 2-Naphthyl Ether | 282 | 26 | △ | △ | △ |
| EXAMPLE 2-26 | | | | | 225TMDPE | 290 | 34 | ◎ | ◎ | ○ |
| EXAMPLE 2-27 | | | | | Dibenzyl Ether | 295 | 39 | ◎ | ◎ | ○ |
| EXAMPLE 2-28 | | | | | 235TMDPE | 295 | 39 | ◎ | ◎ | ○ |
| EXAMPLE 2-29 | | | | | N-Methyldiphenylamine | 297 | 41 | ◎ | ◎ | ○ |
| EXAMPLE 2-30 | | | | | 4-Isopropylbiphenyl | 298 | 42 | ◎ | ◎ | ○ |
| EXAMPLE 2-31 | | | | | α,α-Dichlorodiphenylmethane | 305 | 49 | ◎ | ◎ | ◎ |
| EXAMPLE 2-32 | | | | | 4(3-phenylpropyl)pyridine | 322 | 66 | ◎ | ◎ | ◎ |
| EXAMPLE 2-33 | | | | | Benzyl Benzoate | 324 | 68 | ◎ | ◎ | ◎ |
| EXAMPLE 2-34 | | | | | 1,1-Bis(3,4-Dimethylphenyl)ethane | 333 | 77 | ◎ | ◎ | ◎ |

FIG. 29

< INK FOR FORMING POSITIVE HOLE TRANSPORT LAYER >
FIRST COMPONENT : SECOND COMPONENT : THIRD COMPONENT = 70 : 30 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-117 | TFB poly(9,9-dioctyl-fluorene-co-N-(4-butylphenyl)-diphenylamine) | Tetraethyleneglycol dimethyl ether | 275 | 31.8 | 1,3-Dipropoxybenzene | 251 | -24 | × | × | × |
| COMPARATIVE EXAMPLE 2-118 | | | | | 4-Methoxybenzaldehyde Dimethyl Acetal | 253 | -22 | × | × | × |
| COMPARATIVE EXAMPLE 2-119 | | | | | 4,4'-Difluorodiphenylmethane | 258 | -17 | × | × | × |
| COMPARATIVE EXAMPLE 2-120 | | | | | Diphenyl ether | 259 | -16 | × | × | × |
| COMPARATIVE EXAMPLE 2-121 | | | | | 1,2-Dimethoxy-4-(1-propenyl)benzene | 264 | -11 | × | × | × |
| COMPARATIVE EXAMPLE 2-122 | | | | | MDPE | 265 | -10 | × | × | × |
| COMPARATIVE EXAMPLE 2-123 | | | | | Diphenyl methane | 265 | -10 | × | × | × |
| COMPARATIVE EXAMPLE 2-124 | | | | | 2-Phenylpyridine | 268 | -7 | × | × | × |
| COMPARATIVE EXAMPLE 2-125 | | | | | DMDPE | 270 | -5 | × | × | × |
| COMPARATIVE EXAMPLE 2-126 | | | | | 3-Phenyltoluene | 272 | -3 | △ | △ | △ |
| COMPARATIVE EXAMPLE 2-127 | | | | | 3-Phenylpyridine | 272 | -3 | △ | △ | △ |
| COMPARATIVE EXAMPLE 2-128 | | | | | 2-Phenylanisole | 274 | -1 | △ | △ | △ |
| COMPARATIVE EXAMPLE 2-129 | | | | | 2-Phenoxytetrahydropuran | 275 | 0 | △ | △ | △ |
| COMPARATIVE EXAMPLE 2-130 | | | | | NPBP | 280 | 5 | △ | △ | △ |
| COMPARATIVE EXAMPLE 2-131 | | | | | 25DMDPE | 280 | 5 | △ | △ | △ |
| COMPARATIVE EXAMPLE 2-132 | | | | | Ethyl 2-Naphthyl Ether | 282 | 7 | △ | △ | △ |
| COMPARATIVE EXAMPLE 2-133 | | | | | 225TMDPE | 290 | 15 | △ | △ | △ |
| COMPARATIVE EXAMPLE 2-134 | | | | | Dibenzyl Ether | 295 | 20 | △ | △ | △ |
| COMPARATIVE EXAMPLE 2-135 | | | | | 235TMDPE | 295 | 20 | △ | △ | △ |
| COMPARATIVE EXAMPLE 2-136 | | | | | N-Methyldiphenylamine | 297 | 22 | △ | △ | △ |
| COMPARATIVE EXAMPLE 2-137 | | | | | 4-Isopropylbiphenyl | 298 | 23 | △ | △ | △ |
| EXAMPLE 2-35 | | | | | α,α-Dichlorodiphenylmethane | 305 | 30 | ○ | ○ | ○ |
| EXAMPLE 2-36 | | | | | 4-(3-phenylpropyl)pyridine | 322 | 47 | ◎ | ◎ | ◎ |
| EXAMPLE 2-37 | | | | | Benzyl Benzoate | 324 | 49 | ◎ | ◎ | ◎ |
| EXAMPLE 2-38 | | | | | 1,1-Bis(3,4-Dimethylphenyl)ethane | 333 | 58 | ◎ | ◎ | ◎ |

FIG. 30

<INK FOR FORMING POSITIVE HOLE TRANSPORT LAYER>

FIRST COMPONENT: SECOND COMPONENT: THIRD COMPONENT = 30 : 50 : THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE E2-39 | TFB poly(9,9-dioctyl-fluorene-co-N-(4-butylphenyl)-diphenylamine) | Diethyleneglycol butylmethyl ether | 212 | 24.1 | 1,3-Dipropoxybenzene | 251 | 39 | ○ | ○ | ○ |
| EXAMPLE E2-40 | | | | | 4-Methoxybenzaldehyde Dimethyl Acetal | 253 | 41 | ○ | ○ | ○ |
| EXAMPLE E2-41 | | | | | 4,4'-Difluorodiphenylmethane | 258 | 46 | ○ | ○ | ○ |
| EXAMPLE E2-42 | | | | | Diphenyl ether | 259 | 47 | ○ | ○ | ○ |
| EXAMPLE E2-43 | | | | | 1,2-Dimethoxy-4-(1-propenyl)benzene | 264 | 52 | ○ | ○ | ◎ |
| EXAMPLE E2-44 | | | | | MDPE | 265 | 53 | ◎ | ○ | ◎ |
| EXAMPLE E2-45 | | | | | Diphenyl methane | 265 | 53 | ◎ | ○ | ◎ |
| EXAMPLE E2-46 | | | | | 2-Phenylpyridine | 268 | 56 | ◎ | ○ | ◎ |
| EXAMPLE E2-47 | | | | | DMDPE | 270 | 58 | ◎ | ○ | ◎ |
| EXAMPLE E2-48 | | | | | 3-Phenoxytoluene | 272 | 60 | ◎ | ○ | ◎ |
| EXAMPLE E2-49 | | | | | 3-Phenylpyridine | 272 | 60 | ◎ | ○ | ◎ |
| EXAMPLE E2-50 | | | | | 2-Phenylanisole | 274 | 62 | ◎ | ○ | ◎ |
| EXAMPLE E2-51 | | | | | 2-Phenoxytetrahydrofuran | 275 | 63 | ◎ | ○ | ◎ |
| EXAMPLE E2-52 | | | | | NPBP | 280 | 68 | ◎ | ○ | ◎ |
| EXAMPLE E2-53 | | | | | 25DMDPE | 280 | 68 | ◎ | ○ | ◎ |
| EXAMPLE E2-54 | | | | | Ethyl 2-Naphthyl Ether | 282 | 70 | ◎ | ○ | ◎ |
| EXAMPLE E2-55 | | | | | 22STMDPE | 290 | 78 | ◎ | ○ | ◎ |
| EXAMPLE E2-56 | | | | | Dibenzyl Ether | 295 | 83 | ◎ | ○ | ◎ |
| EXAMPLE E2-57 | | | | | 23STMDPE | 295 | 83 | ◎ | ○ | ◎ |
| EXAMPLE E2-58 | | | | | N-Methyldiphenylamine | 297 | 85 | ◎ | ○ | ◎ |
| EXAMPLE E2-59 | | | | | 4-Isopropylbiphenyl | 298 | 86 | ◎ | ○ | ◎ |
| EXAMPLE E2-60 | | | | | α,α-Dichlorodiphenylmethane | 305 | 93 | ◎ | ○ | ◎ |
| EXAMPLE E2-61 | | | | | 4-(3-phenylpropyl)pyridine | 322 | 110 | ◎ | ○ | ◎ |
| EXAMPLE E2-62 | | | | | Benzyl Benzoate | 324 | 112 | ◎ | ○ | ◎ |
| EXAMPLE E2-63 | | | | | 1,1-Bis(3,4-Dimethylphenyl)ethane | 333 | 121 | ◎ | ○ | ◎ |

FIG. 31

<INK FOR FORMING POSITIVE HOLE TRANSPORT LAYER>
FIRST COMPONENT : SECOND COMPONENT = 50 : 50, THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-138 | TFB poly(9,9-dioctylfluorene-co-N-(4-butylphenyl)-diphenylamine) | Diethyleneglycol dibutyl ether | 256 | 24.9 | 1,3-Dipropoxybenzene | 251 | -5 | △ | △ | △ |
| COMPARATIVE EXAMPLE 2-139 | | | | | 4-Methoxybenzaldehyde Dimethyl Acetal | 253 | -3 | △ | △ | △ |
| COMPARATIVE EXAMPLE 2-140 | | | | | 4,4'-Difluorodiphenylmethane | 258 | 2 | △ | △ | △ |
| COMPARATIVE EXAMPLE 2-141 | | | | | Diphenyl ether | 259 | 3 | △ | △ | △ |
| COMPARATIVE EXAMPLE 2-142 | | | | | 1,2-Dimethoxy-4-(1-propenyl)benzene | 264 | 8 | △ | △ | △ |
| COMPARATIVE EXAMPLE 2-143 | | | | | MDPE | 265 | 9 | △ | △ | △ |
| COMPARATIVE EXAMPLE 2-144 | | | | | Dipbenyl methane | 265 | 9 | △ | △ | △ |
| COMPARATIVE EXAMPLE 2-145 | | | | | 2-Phenylpyridine | 268 | 12 | △ | △ | △ |
| COMPARATIVE EXAMPLE 2-146 | | | | | DMDPE | 270 | 14 | △ | △ | △ |
| COMPARATIVE EXAMPLE 2-147 | | | | | 3-Phenoxytoluene | 272 | 16 | △ | △ | △ |
| COMPARATIVE EXAMPLE 2-148 | | | | | 3-Phenylpyridine | 272 | 16 | △ | △ | △ |
| COMPARATIVE EXAMPLE 2-149 | | | | | 2-Phenylanisole | 274 | 18 | △ | △ | △ |
| COMPARATIVE EXAMPLE 2-150 | | | | | 2-Phenoxytetrahydrofuran | 275 | 19 | △ | △ | △ |
| COMPARATIVE EXAMPLE 2-151 | | | | | NPBP | 280 | 24 | △ | △ | △ |
| COMPARATIVE EXAMPLE 2-152 | | | | | 25DMDPE | 280 | 24 | △ | △ | △ |
| COMPARATIVE EXAMPLE 2-153 | | | | | Ethyl 2-Naphthyl Ether | 282 | 26 | △ | △ | △ |
| EXAMPLE 2-64 | | | | | 22STMDPE | 290 | 34 | ◎ | ◎ | ○ |
| EXAMPLE 2-65 | | | | | Dibenzyl Ether | 295 | 39 | ◎ | ◎ | ○ |
| EXAMPLE 2-66 | | | | | 23STMDPE | 295 | 39 | ◎ | ◎ | ○ |
| EXAMPLE 2-67 | | | | | N-Methyldiphenylamine | 297 | 41 | ◎ | ◎ | ○ |
| EXAMPLE 2-68 | | | | | 4-Isopropylbiphenyl | 298 | 42 | ◎ | ◎ | ◎ |
| EXAMPLE 2-69 | | | | | α,α-Dichlorodiphenylmethane | 305 | 49 | ◎ | ◎ | ◎ |
| EXAMPLE 2-70 | | | | | 4-(3-phenylpropyl)pyridine | 322 | 66 | ◎ | ◎ | ◎ |
| EXAMPLE 2-71 | | | | | Benzyl Benzoate | 324 | 68 | ◎ | ◎ | ◎ |
| EXAMPLE 2-72 | | | | | 1,1-Bis(3,4-Dimethylphenyl)ethane | 333 | 77 | ◎ | ◎ | ◎ |

FIG. 32

⟨INK FOR FORMING POSITIVE HOLE TRANSPORT LAYER⟩

FIRST COMPONENT : SECOND COMPONENT = 50 : 50, THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-154 | TFB poly(9,9-dioctyl-fluorene-co-N-(4-butylphenyl)-diphenylamine) | Tetraethyleneglycol dimethyl ether | 275 | 31.8 | 1,3-Dipropoxybenzene | 251 | -24 | × | × | × |
| COMPARATIVE EXAMPLE 2-155 | | | | | 4-Methoxybenzaldehyde Dimethyl Acetal | 253 | -22 | × | × | × |
| COMPARATIVE EXAMPLE 2-156 | | | | | 4,4'-Difluorodiphenylmethane | 258 | -17 | × | × | × |
| COMPARATIVE EXAMPLE 2-157 | | | | | Diphenyl ether | 259 | -16 | × | × | × |
| COMPARATIVE EXAMPLE 2-158 | | | | | 1,2-Dimethoxy-4-(1-propenyl)benzene | 264 | -11 | × | × | × |
| COMPARATIVE EXAMPLE 2-159 | | | | | MDPE | 265 | -10 | × | × | × |
| COMPARATIVE EXAMPLE 2-160 | | | | | Diphenyl methane | 265 | -10 | × | × | × |
| COMPARATIVE EXAMPLE 2-161 | | | | | 2-Phenylpyridine | 268 | -7 | × | × | × |
| COMPARATIVE EXAMPLE 2-162 | | | | | DMDPE | 270 | -5 | △ | △ | △ |
| COMPARATIVE EXAMPLE 2-163 | | | | | 3-Phenoxytoluene | 272 | -3 | △ | △ | △ |
| COMPARATIVE EXAMPLE 2-164 | | | | | 3-Phenylpyridine | 272 | -3 | △ | △ | △ |
| COMPARATIVE EXAMPLE 2-165 | | | | | 2-Phenylanisole | 274 | -1 | △ | △ | △ |
| COMPARATIVE EXAMPLE 2-166 | | | | | 2-Phenoxytetrahydropuran | 275 | 0 | △ | △ | △ |
| COMPARATIVE EXAMPLE 2-167 | | | | | NPBP | 280 | 5 | △ | △ | △ |
| COMPARATIVE EXAMPLE 2-168 | | | | | 25DMDPE | 280 | 5 | △ | △ | △ |
| COMPARATIVE EXAMPLE 2-169 | | | | | Ethyl 2-Naphthyl Ether | 282 | 7 | △ | △ | △ |
| COMPARATIVE EXAMPLE 2-170 | | | | | 225TMDPE | 290 | 15 | △ | △ | △ |
| COMPARATIVE EXAMPLE 2-171 | | | | | Dibenzyl Ether | 295 | 20 | △ | △ | △ |
| COMPARATIVE EXAMPLE 2-172 | | | | | 235TMDPE | 295 | 20 | △ | △ | △ |
| COMPARATIVE EXAMPLE 2-173 | | | | | N-Methyldiphenylamine | 297 | 22 | △ | △ | △ |
| COMPARATIVE EXAMPLE 2-174 | | | | | 4-Isopropylbiphenyl | 298 | 23 | △ | △ | △ |
| EXAMPLE 2-73 | | | | | α,α-Dichlorodiphenylmethane | 305 | 30 | ○ | ○ | ○ |
| EXAMPLE 2-74 | | | | | 4-(3-phenylpropyl)pyridine | 322 | 47 | ◎ | ◎ | ◎ |
| EXAMPLE 2-75 | | | | | Benzyl Benzoate | 324 | 49 | ◎ | ◎ | ◎ |
| EXAMPLE 2-76 | | | | | 1,1-Bis(3,4-Dimethylphenyl)ethane | 333 | 58 | ◎ | ◎ | ◎ |

FIG. 33

<INK FOR FORMING POSITIVE HOLE TRANSPORT LAYER>

FIRST COMPONENT : SECOND COMPONENT = 30 : 70   THIRD COMPONENT 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | ΔbP (°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 2-77 | poly(9,9-dioctyl-fluorene-co-N-(4-butylphenyl)-diphenylamine) TFB | Diethyleneglycol butylmethyl ether | 212 | 24.1 | 1,3-Dipropoxybenzene | 251 | 39 | ○ | ○ | ○ |
| EXAMPLE 2-78 | | | | | 4-Methoxybenzaldehyde Dimethyl Acetal | 253 | 41 | ○ | ○ | ○ |
| EXAMPLE 2-79 | | | | | 4,4'-Difluorodiphenylmethane | 258 | 46 | ○ | ○ | ○ |
| EXAMPLE 2-80 | | | | | Diphenyl ether | 259 | 47 | ○ | ○ | ○ |
| EXAMPLE 2-81 | | | | | 1,2-Dimethoxy-4-(1-propenyl)benzene | 264 | 52 | ○ | ○ | ◎ |
| EXAMPLE 2-82 | | | | | MDPE | 265 | 53 | ◎ | ○ | ◎ |
| EXAMPLE 2-83 | | | | | Diphenyl methane | 265 | 53 | ◎ | ○ | ◎ |
| EXAMPLE 2-84 | | | | | 2-Phenylpyridine | 268 | 56 | ◎ | ○ | ◎ |
| EXAMPLE 2-85 | | | | | DMDPE | 270 | 58 | ◎ | ○ | ◎ |
| EXAMPLE 2-86 | | | | | 3-Phenoxytoluene | 272 | 60 | ◎ | ○ | ◎ |
| EXAMPLE 2-87 | | | | | 3-Phenylpyridine | 272 | 60 | ◎ | ○ | ◎ |
| EXAMPLE 2-88 | | | | | 2-Phenylanisole | 274 | 62 | ◎ | ○ | ◎ |
| EXAMPLE 2-89 | | | | | 2-Phenoxytetrahydrofuran | 275 | 63 | ◎ | ○ | ◎ |
| EXAMPLE 2-90 | | | | | NPBP | 280 | 68 | ◎ | ○ | ◎ |
| EXAMPLE 2-91 | | | | | 25DMDPE | 280 | 68 | ◎ | ○ | ◎ |
| EXAMPLE 2-92 | | | | | Ethyl 2-Naphthyl Ether | 282 | 70 | ◎ | ○ | ◎ |
| EXAMPLE 2-93 | | | | | 225TMDPE | 290 | 78 | ◎ | ○ | ◎ |
| EXAMPLE 2-94 | | | | | Dibenzyl Ether | 295 | 83 | ◎ | ○ | ◎ |
| EXAMPLE 2-95 | | | | | 235TMDPE | 295 | 83 | ◎ | ○ | ◎ |
| EXAMPLE 2-96 | | | | | N-Methyldiphenylamine | 297 | 85 | ◎ | ○ | ◎ |
| EXAMPLE 2-97 | | | | | 4-Isopropylbiphenyl | 298 | 86 | ◎ | ○ | ◎ |
| EXAMPLE 2-98 | | | | | α,α-Dichlorodiphenylmethane | 305 | 93 | ◎ | ○ | ◎ |
| EXAMPLE 2-99 | | | | | 4-(3-phenylpropyl)pyridine | 322 | 110 | ◎ | ○ | ◎ |
| EXAMPLE 2-100 | | | | | Benzyl Benzoate | 324 | 112 | ◎ | ○ | ◎ |
| EXAMPLE 2-101 | | | | | 1,1-Bis(3,4-Dimethylphenyl)methane | 333 | 121 | ◎ | ○ | ◎ |

FIG. 34

<INK FOR FORMING POSITIVE HOLE TRANSPORT LAYER>

FIRST COMPONENT: SECOND COMPONENT = 30:70  THIRD COMPONENT 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-175 | TFB poly(9,9-dioctyl-fluorene-co-N-(4-butylphenyl)-diphenylamine) | Diethyleneglycol dibutyl ether | 256 | 24.9 | 1,3-Dipropoxybenzene | 251 | -5 | △ | △ | △ |
| COMPARATIVE EXAMPLE 2-176 | | | | | 4-Methoxybenzaldehyde Dimethyl Acetal | 253 | -3 | △ | △ | △ |
| COMPARATIVE EXAMPLE 2-177 | | | | | 4,4'-Difluorodiphenylmethane | 258 | 2 | △ | △ | △ |
| COMPARATIVE EXAMPLE 2-178 | | | | | Diphenyl ether | 259 | 3 | △ | △ | △ |
| COMPARATIVE EXAMPLE 2-179 | | | | | 1,2-Dimethoxy-4-(1-propenyl)benzene | 264 | 8 | △ | △ | △ |
| COMPARATIVE EXAMPLE 2-180 | | | | | MDPE | 265 | 9 | △ | △ | △ |
| COMPARATIVE EXAMPLE 2-181 | | | | | Diphenyl methane | 265 | 9 | △ | △ | △ |
| COMPARATIVE EXAMPLE 2-182 | | | | | 2-Phenylpyridine | 268 | 12 | △ | △ | △ |
| COMPARATIVE EXAMPLE 2-183 | | | | | DMDPE | 270 | 14 | △ | △ | △ |
| COMPARATIVE EXAMPLE 2-184 | | | | | 3-Phenoxytoluene | 272 | 16 | △ | △ | △ |
| COMPARATIVE EXAMPLE 2-185 | | | | | 3-Phenylpyridine | 272 | 16 | △ | △ | △ |
| COMPARATIVE EXAMPLE 2-186 | | | | | 2-Phenylanisole | 274 | 18 | △ | △ | △ |
| COMPARATIVE EXAMPLE 2-187 | | | | | 2-Phenoxytetrahydropyran | 275 | 19 | △ | △ | △ |
| COMPARATIVE EXAMPLE 2-188 | | | | | NPBP | 280 | 24 | △ | △ | △ |
| COMPARATIVE EXAMPLE 2-189 | | | | | 2SDMDPE | 280 | 24 | △ | △ | △ |
| COMPARATIVE EXAMPLE 2-190 | | | | | Ethyl 2-Naphthyl Ether | 282 | 26 | △ | △ | △ |
| EXAMPLE C-102 | | | | | 225TMDPE | 290 | 34 | ◎ | ◎ | ○ |
| EXAMPLE 2-103 | | | | | Dibenzyl Ether | 295 | 39 | ◎ | ◎ | ○ |
| EXAMPLE 2-104 | | | | | 235TMDPE | 295 | 39 | ◎ | ◎ | ○ |
| EXAMPLE 2-105 | | | | | N-Methyldiphenylamine | 297 | 41 | ◎ | ◎ | ○ |
| EXAMPLE 2-106 | | | | | 4-Isopropylbiphenyl | 298 | 42 | ◎ | ◎ | ○ |
| EXAMPLE 2-107 | | | | | α,α-Dichlorodiphenylmethane | 305 | 49 | ◎ | ◎ | ◎ |
| EXAMPLE 2-108 | | | | | 4-(3-phenylpropyl)pyridine | 322 | 66 | ◎ | ◎ | ◎ |
| EXAMPLE 2-109 | | | | | Benzyl Benzoate | 324 | 68 | ◎ | ◎ | ◎ |
| EXAMPLE 2-110 | | | | | 1,1-Bis(3,4-Dimethylphenyl)ethane | 333 | 77 | ◎ | ◎ | ◎ |

FIG. 35

<INK FOR FORMING POSITIVE HOLE TRANSPORT LAYER>

FIRST COMPONENT : SECOND COMPONENT : THIRD COMPONENT = 30 : 70 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-191 | TF5 poly(9,9-dioctyl-fluorene-co-N-(4-butylphenyl)-diphenylamine) | Tetraethyleneglycol dimethyl ether | 275 | 31.8 | 1,3-Dipropoxybenzene | 251 | -24 | × | × | × |
| COMPARATIVE EXAMPLE 2-192 | | | | | 4-Methoxybenzaldehyde Dimethyl Acetal | 253 | -22 | × | × | × |
| COMPARATIVE EXAMPLE 2-193 | | | | | 4,4'-Difluorodiphenylmethane | 258 | -17 | × | × | × |
| COMPARATIVE EXAMPLE 2-194 | | | | | Diphenyl ether | 259 | -16 | × | × | × |
| COMPARATIVE EXAMPLE 2-195 | | | | | 1,2-Dimethoxy-4-(1-propenyl)benzene | 264 | -11 | × | × | × |
| COMPARATIVE EXAMPLE 2-196 | | | | | MDPE | 265 | -10 | × | × | × |
| COMPARATIVE EXAMPLE 2-197 | | | | | Diphenyl methane | 265 | -10 | × | × | × |
| COMPARATIVE EXAMPLE 2-198 | | | | | 2-Phenylpyridine | 268 | -7 | × | × | × |
| COMPARATIVE EXAMPLE 2-199 | | | | | DMDPE | 270 | -5 | × | × | × |
| COMPARATIVE EXAMPLE 2-200 | | | | | 3-Phenoxytoluene | 272 | -3 | △ | △ | △ |
| COMPARATIVE EXAMPLE 2-201 | | | | | 3-Phenylpyridine | 272 | -3 | △ | △ | △ |
| COMPARATIVE EXAMPLE 2-202 | | | | | 2-Phenylanisole | 274 | -1 | △ | △ | △ |
| COMPARATIVE EXAMPLE 2-203 | | | | | 2-Phenoxytetrahydrofuran | 275 | 0 | △ | △ | △ |
| COMPARATIVE EXAMPLE 2-204 | | | | | NPBP | 280 | 5 | △ | △ | △ |
| COMPARATIVE EXAMPLE 2-205 | | | | | 25DMDPE | 280 | 5 | △ | △ | △ |
| COMPARATIVE EXAMPLE 2-206 | | | | | Ethyl 2-Naphthyl Ether | 282 | 7 | △ | △ | △ |
| COMPARATIVE EXAMPLE 2-207 | | | | | 225TMDPE | 290 | 15 | △ | △ | △ |
| COMPARATIVE EXAMPLE 2-208 | | | | | Dibenzyl Ether | 295 | 20 | △ | △ | △ |
| COMPARATIVE EXAMPLE 2-209 | | | | | 235TMDPE | 295 | 20 | △ | △ | △ |
| COMPARATIVE EXAMPLE 2-210 | | | | | N-Methyldiphenylamine | 297 | 22 | △ | △ | △ |
| COMPARATIVE EXAMPLE 2-211 | | | | | 4-Isopropylbiphenyl | 298 | 23 | △ | △ | △ |
| EXAMPLE 2-111 | | | | | α,α-Dichlorodiphenylmethane | 305 | 30 | ○ | ○ | ○ |
| EXAMPLE 2-112 | | | | | 4-(3-phenylpropyl)pyridine | 322 | 47 | ◎ | ◎ | ◎ |
| EXAMPLE 2-113 | | | | | Benzyl Benzoate | 324 | 49 | ◎ | ◎ | ◎ |
| EXAMPLE 2-114 | | | | | 1,1-Bis(3,4-Dimethylphenyl)ethane | 333 | 58 | ◎ | ◎ | ◎ |

FIG. 36

< INK FOR FORMING POSITIVE HOLE TRANSPORT LAYER >

FIRST COMPONENT: SECOND COMPONENT = 20:80, THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-212 | TFB poly(9,9-dioctyl-fluorene-co-N-(4-butylphenyl)-diphenylamine) | Diethylene glycol butyl methyl ether | 212 | 24.1 | 1,3-Dipropoxybenzene | 251 | 39 | ○ | × | × |
| COMPARATIVE EXAMPLE 2-213 | | | | | 4-Methoxybenzaldehyde Dimethyl Acetal | 253 | 41 | ○ | × | × |
| COMPARATIVE EXAMPLE 2-214 | | | | | 4,4'-Difluorodiphenylmethane | 258 | 46 | ○ | × | × |
| COMPARATIVE EXAMPLE 2-215 | | | | | Diphenyl ether | 259 | 47 | ○ | × | × |
| COMPARATIVE EXAMPLE 2-216 | | | | | 1,2-Dimethoxy-4-(1-propenyl)benzene | 264 | 52 | ○ | × | × |
| COMPARATIVE EXAMPLE 2-217 | | | | | MDPE | 265 | 53 | ◎ | × | × |
| COMPARATIVE EXAMPLE 2-218 | | | | | Diphenyl methane | 265 | 53 | ◎ | × | × |
| COMPARATIVE EXAMPLE 2-219 | | | | | 2-Phenylpyridine | 268 | 56 | ◎ | × | × |
| COMPARATIVE EXAMPLE 2-220 | | | | | DMDPE | 270 | 58 | ◎ | × | × |
| COMPARATIVE EXAMPLE 2-221 | | | | | 3-Phenoxytoluene | 272 | 60 | ◎ | × | × |
| COMPARATIVE EXAMPLE 2-222 | | | | | 3-Phenylpyridine | 272 | 60 | ◎ | × | × |
| COMPARATIVE EXAMPLE 2-223 | | | | | 2-Phenylanisole | 274 | 62 | ◎ | × | × |
| COMPARATIVE EXAMPLE 2-224 | | | | | 2-Phenoxytetrahydropuran | 275 | 63 | ◎ | × | × |
| COMPARATIVE EXAMPLE 2-225 | | | | | NPBP | 280 | 68 | ◎ | × | × |
| COMPARATIVE EXAMPLE 2-226 | | | | | 25DMDPE | 280 | 68 | ◎ | × | × |
| COMPARATIVE EXAMPLE 2-227 | | | | | Ethyl 2-Naphthyl Ether | 282 | 70 | ◎ | × | × |
| COMPARATIVE EXAMPLE 2-228 | | | | | 226TMDPE | 290 | 78 | ◎ | × | × |
| COMPARATIVE EXAMPLE 2-229 | | | | | Dibenzyl Ether | 295 | 83 | ◎ | × | × |
| COMPARATIVE EXAMPLE 2-230 | | | | | 233TMDPE | 295 | 83 | ◎ | × | × |
| COMPARATIVE EXAMPLE 2-231 | | | | | N-Methyldiphenylamine | 297 | 85 | ◎ | × | × |
| COMPARATIVE EXAMPLE 2-232 | | | | | 4-Isopropylbiphenyl | 298 | 86 | ◎ | × | × |
| COMPARATIVE EXAMPLE 2-233 | | | | | α,α-Dichlorodiphenylmethane | 305 | 93 | ◎ | × | × |
| COMPARATIVE EXAMPLE 2-234 | | | | | 4-(3-phenylpropyl)pyridine | 322 | 110 | ◎ | × | × |
| COMPARATIVE EXAMPLE 2-235 | | | | | Benzyl Benzoate | 324 | 112 | ◎ | × | × |
| COMPARATIVE EXAMPLE 2-236 | | | | | 1,1-Bis(3,4-Dimethylphenyl)ethane | 333 | 121 | ◎ | × | × |

FIG. 37

<INK FOR FORMING POSITIVE HOLE TRANSPORT LAYER>
FIRST COMPONENT: SECOND COMPONENT = 20:80 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 2-237 | TFB poly(9,9-dioctylfluorene-co-N-(4-butylphenyl)-diphenylamine) | Diethylene glycol dibutyl ether | 256 | 24.9 | 1,3-Dipropoxybenzene | 251 | −5 | △ | × | × |
| COMPARATIVE EXAMPLE 2-238 | | | | | 4-Methoxybenzaldehyde Dimethyl Acetal | 253 | −3 | △ | × | × |
| COMPARATIVE EXAMPLE 2-239 | | | | | 4,4-Difluorodiphenylmethane | 258 | 2 | △ | × | × |
| COMPARATIVE EXAMPLE 2-240 | | | | | Diphenyl ether | 259 | 3 | △ | × | × |
| COMPARATIVE EXAMPLE 2-241 | | | | | 1,2-Dimethoxy-4-(1-propenyl)benzene | 264 | 8 | △ | × | × |
| COMPARATIVE EXAMPLE 2-242 | | | | | MDPE | 265 | 9 | △ | × | × |
| COMPARATIVE EXAMPLE 2-243 | | | | | Diphenyl methane | 265 | 9 | △ | × | × |
| COMPARATIVE EXAMPLE 2-244 | | | | | 2-Phenylpyridine | 268 | 12 | △ | × | × |
| COMPARATIVE EXAMPLE 2-245 | | | | | DMDPE | 270 | 14 | △ | × | × |
| COMPARATIVE EXAMPLE 2-246 | | | | | 3-Phenoxytoluene | 272 | 16 | △ | × | × |
| COMPARATIVE EXAMPLE 2-247 | | | | | 3-Phenylpyridine | 272 | 16 | △ | × | × |
| COMPARATIVE EXAMPLE 2-248 | | | | | 2-Phenylanisole | 274 | 18 | △ | × | × |
| COMPARATIVE EXAMPLE 2-249 | | | | | 2-Phenyltetrahydropyran | 275 | 19 | △ | × | × |
| COMPARATIVE EXAMPLE 2-250 | | | | | NPBP | 280 | 24 | △ | × | × |
| COMPARATIVE EXAMPLE 2-251 | | | | | 25DMDPE | 280 | 24 | △ | × | × |
| COMPARATIVE EXAMPLE 2-252 | | | | | Ethyl 2-Naphthyl Ether | 282 | 26 | △ | × | × |
| COMPARATIVE EXAMPLE 2-253 | | | | | 225MDPE | 290 | 34 | ◎ | × | × |
| COMPARATIVE EXAMPLE 2-254 | | | | | Dibenzyl Ether | 295 | 39 | ◎ | × | × |
| COMPARATIVE EXAMPLE 2-255 | | | | | 235TMDPE | 295 | 39 | ◎ | × | × |
| COMPARATIVE EXAMPLE 2-256 | | | | | N-Methyldiphenylamine | 297 | 41 | ◎ | × | × |
| COMPARATIVE EXAMPLE 2-257 | | | | | 4-Isopropylbiphenyl | 298 | 42 | ◎ | × | × |
| COMPARATIVE EXAMPLE 2-258 | | | | | α,α-Dichlorodiphenylmethane | 305 | 49 | ◎ | × | × |
| COMPARATIVE EXAMPLE 2-259 | | | | | 4-(3-phenylpropyl)pyridine | 322 | 66 | ◎ | × | × |
| COMPARATIVE EXAMPLE 2-260 | | | | | Benzyl Benzoate | 324 | 68 | ◎ | × | × |
| COMPARATIVE EXAMPLE 2-261 | | | | | 1,1-Bis(3,4-Dimethylphenyl)ethane | 333 | 77 | ◎ | × | × |

FIG. 38

⟨INK FOR FORMING POSITIVE HOLE TRANSPORT LAYER⟩

FIRST COMPONENT : SECOND COMPONENT = 20 : 80 THIRD COMPONENT 0.5 wt%

| No. | THIRD COMPONENT | | SECOND COMPONENT | | | FIRST COMPONENT | | | WETTING SPREAD DEFECT | STAIN | LIGHT EMITTING FAILURE IN DARK SPOT OR BRIGHT SPOT |
|---|---|---|---|---|---|---|---|---|---|---|---|
| | COMPONENT NAME | SOLVENT NAME | BOILING POINT (°C) | SURFACE TENSION (mN/m) | | SOLVENT NAME | BOILING POINT (°C) | Δbp(°C) | | | |
| COMPARATIVE EXAMPLE 2-262 | TFB poly(9,9-dioctyl-fluorene-co-N-(4-butylphenyl)-diphenylamine) | Tetraethyleneglycol dimethyl ether | 275 | 31.8 | | 1,3-Dipropoxybenzene | 251 | -24 | × | × | × |
| COMPARATIVE EXAMPLE 2-263 | | | | | | 4-Methoxybenzaldehyde Dimethyl Acetal | 253 | -22 | × | × | × |
| COMPARATIVE EXAMPLE 2-264 | | | | | | 4,4'-Difluorodiphenylmethane | 258 | -17 | × | × | × |
| COMPARATIVE EXAMPLE 2-265 | | | | | | Diphenyl ether | 259 | -16 | × | × | × |
| COMPARATIVE EXAMPLE 2-266 | | | | | | 1,2-Dimethoxy-4-(1-propenyl)benzene | 264 | -11 | × | × | × |
| COMPARATIVE EXAMPLE 2-267 | | | | | | MDPE | 265 | -10 | × | × | × |
| COMPARATIVE EXAMPLE 2-268 | | | | | | Diphenyl methane | 265 | -10 | × | × | × |
| COMPARATIVE EXAMPLE 2-269 | | | | | | 2-Phenylpyridine | 268 | -7 | × | × | × |
| COMPARATIVE EXAMPLE 2-270 | | | | | | DMDPE | 270 | -5 | △ | × | × |
| COMPARATIVE EXAMPLE 2-271 | | | | | | 3-Phenoxytoluene | 272 | -3 | △ | × | × |
| COMPARATIVE EXAMPLE 2-272 | | | | | | 3-Phenylpyridine | 272 | -3 | △ | × | × |
| COMPARATIVE EXAMPLE 2-273 | | | | | | 2-Phenylanisole | 274 | -1 | △ | × | × |
| COMPARATIVE EXAMPLE 2-274 | | | | | | 2-Phenoxytetrahydropuran | 275 | 0 | △ | × | × |
| COMPARATIVE EXAMPLE 2-275 | | | | | | NPBP | 280 | 5 | △ | × | × |
| COMPARATIVE EXAMPLE 2-276 | | | | | | 25DMDPE | 280 | 5 | △ | × | × |
| COMPARATIVE EXAMPLE 2-277 | | | | | | Ethyl 2-Naphtyl Ether | 282 | 7 | △ | × | × |
| COMPARATIVE EXAMPLE 2-278 | | | | | | 225TMDPE | 290 | 15 | △ | × | × |
| COMPARATIVE EXAMPLE 2-279 | | | | | | Dibenzyl Ether | 295 | 20 | △ | × | × |
| COMPARATIVE EXAMPLE 2-280 | | | | | | 235TMDPE | 295 | 20 | △ | × | × |
| COMPARATIVE EXAMPLE 2-281 | | | | | | N-Methyldiphenylamine | 297 | 22 | △ | × | × |
| COMPARATIVE EXAMPLE 2-282 | | | | | | 4-Isopropylbiphenyl | 298 | 23 | △ | × | × |
| COMPARATIVE EXAMPLE 2-283 | | | | | | α,α-Dichlorodiphenylmethane | 305 | 30 | ○ | × | × |
| COMPARATIVE EXAMPLE 2-284 | | | | | | 4-(3-phenylpropyl)pyridine | 322 | 47 | ◎ | × | × |
| COMPARATIVE EXAMPLE 2-285 | | | | | | Benzyl Benzoate | 324 | 49 | ◎ | × | × |
| COMPARATIVE EXAMPLE 2-286 | | | | | | 1,1-Bis(3,4-Dimethylphenyl)ethane | 333 | 58 | ◎ | × | × |

FIG. 39

<INK FOR FORMING LIGHT EMITTING LAYER>

FIRST COMPONENT : SECOND COMPONENT : THIRD COMPONENT = 100 : 0 : 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | WETTING SPREAD DEFECT | STAIN | LIGHT EMITTING FAILURE IN DARK SPOT OR BRIGHT SPOT |
|---|---|---|---|---|---|---|---|---|---|
| COMPARATIVE EXAMPLE 3-1 | TDAPB+Ir(ppy)3 | NOT INCLUDED | | | 1,3-Dipropoxybenzene | 251 | △ | △ | △ |
| COMPARATIVE EXAMPLE 3-2 | | | | | 4-Methoxybenzaldehyde Dimethyl Acetal | 253 | △ | △ | △ |
| COMPARATIVE EXAMPLE 3-3 | | | | | 4,4'-Difluorodiphenylmethane | 258 | △ | △ | △ |
| COMPARATIVE EXAMPLE 3-4 | | | | | Diphenyl ether | 259 | △ | △ | △ |
| COMPARATIVE EXAMPLE 3-5 | | | | | 1,2-Dimethoxy-4-(1-propenyl)benzene | 264 | △ | △ | △ |
| COMPARATIVE EXAMPLE 3-6 | | | | | MDPE | 265 | △ | △ | △ |
| COMPARATIVE EXAMPLE 3-7 | | | | | Diphenyl methane | 265 | △ | △ | △ |
| COMPARATIVE EXAMPLE 3-8 | | | | | 2-Phenylpyridine | 268 | △ | △ | △ |
| COMPARATIVE EXAMPLE 3-9 | | | | | DMDPE | 270 | △ | △ | △ |
| COMPARATIVE EXAMPLE 3-10 | | | | | 3-Phenoxytoluene | 272 | △ | △ | △ |
| COMPARATIVE EXAMPLE 3-11 | | | | | 3-Phenylpyridine | 272 | △ | △ | △ |
| COMPARATIVE EXAMPLE 3-12 | | | | | 2-Phenylanisole | 274 | △ | △ | △ |
| COMPARATIVE EXAMPLE 3-13 | | | | | 2-Phenoxytetrahydropyran | 275 | △ | △ | △ |
| COMPARATIVE EXAMPLE 3-14 | | | | | NPBP | 280 | △ | △ | △ |
| COMPARATIVE EXAMPLE 3-15 | | | | | 25DMDPE | 280 | △ | △ | △ |
| COMPARATIVE EXAMPLE 3-16 | | | | | Ethyl 2-Naphthyl Ether | 282 | △ | △ | △ |
| COMPARATIVE EXAMPLE 3-17 | | | | | 22STMDPE | 290 | △ | △ | △ |
| COMPARATIVE EXAMPLE 3-18 | | | | | Dibenzyl Ether | 295 | △ | △ | △ |
| COMPARATIVE EXAMPLE 3-19 | | | | | 235TMDPE | 295 | △ | △ | △ |
| COMPARATIVE EXAMPLE 3-20 | | | | | N-Methyldiphenylamine | 297 | △ | △ | △ |
| COMPARATIVE EXAMPLE 3-21 | | | | | 4-Isopropylbiphenyl | 298 | △ | △ | △ |
| COMPARATIVE EXAMPLE 3-22 | | | | | α,α-Dichlorodiphenylmethane | 305 | △ | △ | △ |
| COMPARATIVE EXAMPLE 3-23 | | | | | 4-(3-phenylpropyl)pyridine | 322 | △ | △ | △ |
| COMPARATIVE EXAMPLE 3-24 | | | | | Benzyl Benzoate | 324 | △ | △ | △ |
| COMPARATIVE EXAMPLE 3-25 | | | | | 1,1-Bis(3,4-Dimethylphenyl)ethane | 333 | △ | △ | △ |

FIG. 40

< INK FOR FORMING LIGHT EMITTING LAYER >

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-26 | TDAPB+Ir(ppy)3 | Diethyleneglycol butylmethyl ether | 212 | 24.1 | 1,3-Dipropoxybenzene | 251 | 39 | △ | △ | △ |
| COMPARATIVE EXAMPLE 3-27 | | | | | 4-Methoxybenzaldehyde Dimethyl Acetal | 253 | 41 | △ | △ | △ |
| COMPARATIVE EXAMPLE 3-28 | | | | | 4,4'-Difluorodiphenylmethane | 258 | 46 | △ | △ | △ |
| COMPARATIVE EXAMPLE 3-29 | | | | | Diphenyl ether | 259 | 47 | △ | △ | △ |
| COMPARATIVE EXAMPLE 3-30 | | | | | 1,2-Dimethoxy-4-(1-propenyl)benzene | 264 | 52 | △ | △ | △ |
| COMPARATIVE EXAMPLE 3-31 | | | | | MDPE | 265 | 53 | △ | △ | △ |
| COMPARATIVE EXAMPLE 3-32 | | | | | Diphenyl methane | 265 | 53 | △ | △ | △ |
| COMPARATIVE EXAMPLE 3-33 | | | | | 2-Phenylpyridine | 268 | 56 | △ | △ | △ |
| COMPARATIVE EXAMPLE 3-34 | | | | | DMDPE | 270 | 58 | △ | △ | △ |
| COMPARATIVE EXAMPLE 3-35 | | | | | 2-Phenoxytoluene | 272 | 60 | △ | △ | △ |
| COMPARATIVE EXAMPLE 3-36 | | | | | 3-Phenylpyridine | 272 | 60 | △ | △ | △ |
| COMPARATIVE EXAMPLE 3-37 | | | | | 2-Phenylanisole | 274 | 62 | △ | △ | △ |
| COMPARATIVE EXAMPLE 3-38 | | | | | 2-Phenoxytetrahydrofuran | 275 | 63 | △ | △ | △ |
| COMPARATIVE EXAMPLE 3-39 | | | | | NPBP | 280 | 68 | △ | △ | △ |
| COMPARATIVE EXAMPLE 3-40 | | | | | 250MDPE | 280 | 68 | △ | △ | △ |
| COMPARATIVE EXAMPLE 3-41 | | | | | Ethyl 2-Naphthyl Ether | 282 | 70 | △ | △ | △ |
| COMPARATIVE EXAMPLE 3-42 | | | | | 225TMDPE | 290 | 78 | △ | △ | △ |
| COMPARATIVE EXAMPLE 3-43 | | | | | Dibenzyl Ether | 295 | 83 | △ | △ | △ |
| COMPARATIVE EXAMPLE 3-44 | | | | | 235TMDPE | 295 | 83 | △ | △ | △ |
| COMPARATIVE EXAMPLE 3-45 | | | | | N-Methyldiphenylamine | 297 | 85 | △ | △ | △ |
| COMPARATIVE EXAMPLE 3-46 | | | | | 4-Isopropylbiphenyl | 298 | 86 | △ | △ | △ |
| COMPARATIVE EXAMPLE 3-47 | | | | | α,α-Dichlorodiphenylmethane | 305 | 93 | △ | △ | △ |
| COMPARATIVE EXAMPLE 3-48 | | | | | 4-(3-phenylpropyl)pyridine | 322 | 110 | △ | △ | △ |
| COMPARATIVE EXAMPLE 3-49 | | | | | Benzyl Benzoate | 324 | 112 | △ | △ | △ |
| COMPARATIVE EXAMPLE 3-50 | | | | | 1,1-Bis(3,4-Dimethylphenyl)methane | 333 | 121 | △ | △ | △ |

FIRST COMPONENT : SECOND COMPONENT = 80 : 20  THIRD COMPONENT 0.5 wt%

FIG. 41

<INK FOR FORMING LIGHT EMITTING LAYER>

FIRST COMPONENT : SECOND COMPONENT : THIRD COMPONENT = 80 : 20 : THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-51 | TDAPB+Ir(ppy)3 | Diethyleneglycol dibutyl ether | 256 | 24.9 | 1,3-Dipropoxybenzene | 251 | -5 | △ | △ | △ |
| COMPARATIVE EXAMPLE 3-52 | | | | | 4-Methoxybenzaldehyde Dimethyl Acetal | 253 | -3 | △ | △ | △ |
| COMPARATIVE EXAMPLE 3-53 | | | | | 4,4'-Difluorodiphenylmethane | 258 | 2 | △ | △ | △ |
| COMPARATIVE EXAMPLE 3-54 | | | | | Diphenyl ether | 259 | 3 | △ | △ | △ |
| COMPARATIVE EXAMPLE 3-55 | | | | | 1,2-Dimethoxy-4-(1-propenyl)benzene | 264 | 8 | △ | △ | △ |
| COMPARATIVE EXAMPLE 3-56 | | | | | MDPE | 265 | 9 | △ | △ | △ |
| COMPARATIVE EXAMPLE 3-57 | | | | | Diphenyl methane | 265 | 9 | △ | △ | △ |
| COMPARATIVE EXAMPLE 3-58 | | | | | 2-Phenylpyridine | 268 | 12 | △ | △ | △ |
| COMPARATIVE EXAMPLE 3-59 | | | | | DMDPE | 270 | 14 | △ | △ | △ |
| COMPARATIVE EXAMPLE 3-60 | | | | | 3-Phenoxytoluene | 272 | 16 | △ | △ | △ |
| COMPARATIVE EXAMPLE 3-61 | | | | | 3-Phenylpyridine | 272 | 16 | △ | △ | △ |
| COMPARATIVE EXAMPLE 3-62 | | | | | 2-Phenylanisole | 274 | 18 | △ | △ | △ |
| COMPARATIVE EXAMPLE 3-63 | | | | | 2-Phenoxytetrahydropuran | 275 | 19 | △ | △ | △ |
| COMPARATIVE EXAMPLE 3-64 | | | | | NPBP | 280 | 24 | △ | △ | △ |
| COMPARATIVE EXAMPLE 3-65 | | | | | 26DMDPE | 280 | 24 | △ | △ | △ |
| COMPARATIVE EXAMPLE 3-66 | | | | | Ethyl 2-Naphthyl Ether | 282 | 26 | △ | △ | △ |
| COMPARATIVE EXAMPLE 3-67 | | | | | 22STMDPE | 290 | 34 | △ | △ | △ |
| COMPARATIVE EXAMPLE 3-68 | | | | | Dibenzyl Ether | 295 | 39 | △ | △ | △ |
| COMPARATIVE EXAMPLE 3-69 | | | | | 23STMDPE | 295 | 39 | △ | △ | △ |
| COMPARATIVE EXAMPLE 3-70 | | | | | N-Methyldiphenylamine | 297 | 41 | △ | △ | △ |
| COMPARATIVE EXAMPLE 3-71 | | | | | 4-Isopropylbiphenyl | 298 | 42 | △ | △ | △ |
| COMPARATIVE EXAMPLE 3-72 | | | | | α,α-Dichlorodiphenylmethane | 305 | 49 | △ | △ | △ |
| COMPARATIVE EXAMPLE 3-73 | | | | | 4-(3-phenylpropyl)pyridine | 322 | 66 | △ | △ | △ |
| COMPARATIVE EXAMPLE 3-74 | | | | | Benzyl Benzoate | 324 | 68 | △ | △ | △ |
| COMPARATIVE EXAMPLE 3-75 | | | | | 1,1-Bis(3,4-Dimethylphenyl)methane | 333 | 77 | △ | △ | △ |

FIG. 42

<INK FOR FORMING LIGHT EMITTING LAYER>

FIRST COMPONENT : SECOND COMPONENT = 80 : 20  THIRD COMPONENT 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-76 | TDAPB+Ir(ppy)3 | Tetraethylene glycol dimethyl ether | 275 | 31.8 | 1,3-Dipropoxybenzene | 251 | -24 | △ | △ | △ |
| COMPARATIVE EXAMPLE 3-77 | | | | | 4-Methoxybenzaldehyde Dimethyl Acetal | 253 | -22 | △ | △ | △ |
| COMPARATIVE EXAMPLE 3-78 | | | | | 4,4'-Difluorodiphenylmethane | 258 | -17 | △ | △ | △ |
| COMPARATIVE EXAMPLE 3-79 | | | | | Diphenyl ether | 259 | -16 | △ | △ | △ |
| COMPARATIVE EXAMPLE 3-80 | | | | | 1,2-Dimethoxy-4-(1-propenyl)benzene | 264 | -11 | △ | △ | △ |
| COMPARATIVE EXAMPLE 3-81 | | | | | MDPE | 265 | -10 | △ | △ | △ |
| COMPARATIVE EXAMPLE 3-82 | | | | | Diphenyl methane | 265 | -10 | △ | △ | △ |
| COMPARATIVE EXAMPLE 3-83 | | | | | 2-Phenylpyridine | 268 | -7 | △ | △ | △ |
| COMPARATIVE EXAMPLE 3-84 | | | | | DMDPE | 270 | -5 | △ | △ | △ |
| COMPARATIVE EXAMPLE 3-85 | | | | | 3-Phenoxytoluene | 272 | -3 | △ | △ | △ |
| COMPARATIVE EXAMPLE 3-86 | | | | | 3-Phenylpyridine | 272 | -3 | △ | △ | △ |
| COMPARATIVE EXAMPLE 3-87 | | | | | 2-Phenylanisole | 274 | -1 | △ | △ | △ |
| COMPARATIVE EXAMPLE 3-88 | | | | | 2-Phenoxytetrahydropuran | 275 | 0 | △ | △ | △ |
| COMPARATIVE EXAMPLE 3-89 | | | | | NPBP | 280 | 5 | △ | △ | △ |
| COMPARATIVE EXAMPLE 3-90 | | | | | 26DMDPE | 280 | 5 | △ | △ | △ |
| COMPARATIVE EXAMPLE 3-91 | | | | | Ethyl 2-Naphthyl Ether | 282 | 7 | △ | △ | △ |
| COMPARATIVE EXAMPLE 3-92 | | | | | 225TMDPE | 290 | 15 | △ | △ | △ |
| COMPARATIVE EXAMPLE 3-93 | | | | | Dibenzyl Ether | 295 | 20 | △ | △ | △ |
| COMPARATIVE EXAMPLE 3-94 | | | | | 235TMDPE | 295 | 20 | △ | △ | △ |
| COMPARATIVE EXAMPLE 3-95 | | | | | N-Methyldiphenylamine | 297 | 22 | △ | △ | △ |
| COMPARATIVE EXAMPLE 3-96 | | | | | 4-isopropylbiphenyl | 298 | 23 | △ | △ | △ |
| COMPARATIVE EXAMPLE 3-97 | | | | | α,α-Dichlorodiphenylmethane | 305 | 30 | △ | △ | △ |
| COMPARATIVE EXAMPLE 3-98 | | | | | 4-(3-phenylpropyl)pyridine | 322 | 47 | △ | △ | △ |
| COMPARATIVE EXAMPLE 3-99 | | | | | Benzyl Benzoate | 324 | 49 | △ | △ | △ |
| COMPARATIVE EXAMPLE 3-100 | | | | | 1,1-Bis(3,4-Dimethylphenyl)ethane | 333 | 58 | △ | △ | △ |

FIG. 43

<INK FOR FORMING LIGHT EMITTING LAYER>

FIRST COMPONENT : SECOND COMPONENT = 70 : 30 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 3-1 | TDAPB+Ir(ppy)3 | Diethyleneglycol butylmethyl ether | 212 | 24.1 | 1,3-Dipropoxybenzene | 251 | 39 | ◎ | ○ | ◎ |
| EXAMPLE 3-2 | | | | | 4-Methoxybenzaldehyde Dimethyl Acetal | 253 | 41 | ◎ | ○ | ◎ |
| EXAMPLE 3-3 | | | | | 4,4'-Difluorodiphenylmethane | 258 | 46 | ◎ | ○ | ◎ |
| EXAMPLE 3-4 | | | | | Diphenyl ether | 259 | 47 | ◎ | ○ | ◎ |
| EXAMPLE 3-5 | | | | | 1,2-Dimethoxy-4-(1-propenyl)benzene | 264 | 52 | ◎ | ○ | ◎ |
| EXAMPLE 3-6 | | | | | MDPE | 265 | 53 | ◎ | ○ | ◎ |
| EXAMPLE 3-7 | | | | | Diphenyl methane | 265 | 53 | ◎ | ○ | ◎ |
| EXAMPLE 3-8 | | | | | 2-Phenylpyridine | 268 | 56 | ◎ | ○ | ◎ |
| EXAMPLE 3-9 | | | | | DMDPE | 270 | 58 | ◎ | ○ | ◎ |
| EXAMPLE 3-10 | | | | | 3-Phenoxytoluene | 272 | 60 | ◎ | ○ | ◎ |
| EXAMPLE 3-11 | | | | | 3-Phenylpyridine | 272 | 60 | ◎ | ○ | ◎ |
| EXAMPLE 3-12 | | | | | 2-Phenylanisole | 274 | 62 | ◎ | ○ | ◎ |
| EXAMPLE 3-13 | | | | | 2-Phenoxytetrahydropuran | 275 | 63 | ◎ | ○ | ◎ |
| EXAMPLE 3-14 | | | | | NPBP | 280 | 68 | ◎ | ○ | ◎ |
| EXAMPLE 3-15 | | | | | 26DMDPE | 280 | 68 | ◎ | ○ | ◎ |
| EXAMPLE 3-16 | | | | | Ethyl 2-Naphtyl Ether | 282 | 70 | ◎ | ○ | ◎ |
| EXAMPLE 3-17 | | | | | 225TMDPE | 290 | 78 | ◎ | ○ | ◎ |
| EXAMPLE 3-18 | | | | | Dibenzyl Ether | 295 | 83 | ◎ | ○ | ◎ |
| EXAMPLE 3-19 | | | | | 235TMDPE | 295 | 83 | ◎ | ○ | ◎ |
| EXAMPLE 3-20 | | | | | N-Methyldiphenylamine | 297 | 85 | ◎ | ○ | ◎ |
| EXAMPLE 3-21 | | | | | 4-Isopropylbiphenyl | 298 | 86 | ◎ | ○ | ◎ |
| EXAMPLE 3-22 | | | | | α,α-Dichlorodiphenylmethane | 305 | 93 | ◎ | ○ | ◎ |
| EXAMPLE 3-23 | | | | | 4-(3-phenylpropyl)pyridine | 322 | 110 | ◎ | ○ | ◎ |
| EXAMPLE 3-24 | | | | | Benzyl Benzoate | 324 | 112 | ○ | ○ | ◎ |
| EXAMPLE 3-25 | | | | | 1,1-Bis(3,4-Dimethylphenyl)ethane | 333 | 121 | ○ | ○ | ◎ |

FIG. 44

<INK FOR FORMING LIGHT EMITTING LAYER>
FIRST COMPONENT: SECOND COMPONENT: THIRD COMPONENT = 70:30 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-101 | TDAPB+Ir(ppy)3 | Diethyleneglycol dibutyl ether | 256 | 24.9 | 1,3-Dipropoxybenzene | 251 | -5 | △ | △ | △ |
| COMPARATIVE EXAMPLE 3-102 | | | | | 4-Methoxybenzaldehyde Dimethyl Acetal | 253 | -3 | △ | △ | △ |
| COMPARATIVE EXAMPLE 3-103 | | | | | 4,4'-Difluorodiphenylmethane | 258 | 2 | △ | △ | △ |
| COMPARATIVE EXAMPLE 3-104 | | | | | Diphenyl ether | 259 | 3 | △ | △ | △ |
| COMPARATIVE EXAMPLE 3-105 | | | | | 1,2-Dimethoxy-4-(1-propenyl)benzene | 264 | 8 | △ | △ | △ |
| COMPARATIVE EXAMPLE 3-106 | | | | | MDPE | 265 | 9 | △ | △ | △ |
| COMPARATIVE EXAMPLE 3-107 | | | | | Diphenyl methane | 265 | 9 | △ | △ | △ |
| COMPARATIVE EXAMPLE 3-108 | | | | | 2-Phenylpyridine | 268 | 12 | △ | △ | △ |
| COMPARATIVE EXAMPLE 3-109 | | | | | DMDPE | 270 | 14 | △ | △ | △ |
| COMPARATIVE EXAMPLE 3-110 | | | | | 3-Phenoxytoluene | 272 | 16 | △ | △ | △ |
| COMPARATIVE EXAMPLE 3-111 | | | | | 3-Phenylpyridine | 272 | 16 | △ | △ | △ |
| COMPARATIVE EXAMPLE 3-112 | | | | | 2-Phenylanisole | 274 | 18 | △ | △ | △ |
| COMPARATIVE EXAMPLE 3-113 | | | | | 2-Phenoxytetrahydrofuran | 275 | 19 | △ | △ | △ |
| COMPARATIVE EXAMPLE 3-114 | | | | | NPBP | 280 | 24 | △ | △ | △ |
| COMPARATIVE EXAMPLE 3-115 | | | | | 25DMDPE | 280 | 24 | △ | △ | △ |
| COMPARATIVE EXAMPLE 3-116 | | | | | Ethyl 2-Naphthyl Ether | 282 | 26 | △ | △ | △ |
| EXAMPLE 3-26 | | | | | 225TMDPE | 290 | 34 | ○ | ○ | ○ |
| EXAMPLE 3-27 | | | | | Dibenzyl Ether | 295 | 39 | ◎ | ◎ | ◎ |
| EXAMPLE 3-28 | | | | | 235TMDPE | 295 | 39 | ◎ | ◎ | ◎ |
| EXAMPLE 3-29 | | | | | N-Methyldiphenylamine | 297 | 41 | ◎ | ◎ | ◎ |
| EXAMPLE 3-30 | | | | | 4-Isopropylbiphenyl | 298 | 42 | ◎ | ◎ | ◎ |
| EXAMPLE 3-31 | | | | | α,α'-Dichlorodiphenylmethane | 305 | 49 | ◎ | ◎ | ◎ |
| EXAMPLE 3-32 | | | | | 4-(3-phenylpropyl)pyridine | 322 | 66 | ◎ | ◎ | ◎ |
| EXAMPLE 3-33 | | | | | Benzyl Benzoate | 324 | 68 | ◎ | ◎ | ◎ |
| EXAMPLE 3-34 | | | | | 1,1-Bis(3,4-Dimethylphenyl)ethane | 333 | 77 | ◎ | ◎ | ◎ |

FIG. 45

<INK FOR FORMING LIGHT EMITTING LAYER>
FIRST COMPONENT : SECOND COMPONENT : THIRD COMPONENT = 70 : 30 THIRD COMPONENT 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-117 | TDAPB+Ir(ppy)3 | Tetraethyleneglycol dimethyl ether | 275 | 31.8 | 1,3-Dipropoxybenzene | 251 | −24 | × | × | × |
| COMPARATIVE EXAMPLE 3-118 | | | | | 4-Methoxybenzaldehyde Dimethyl Acetal | 253 | −22 | × | × | × |
| COMPARATIVE EXAMPLE 3-119 | | | | | 4,4'-Difluorodiphenylmethane | 258 | −17 | × | × | × |
| COMPARATIVE EXAMPLE 3-120 | | | | | Diphenyl ether | 259 | −16 | × | × | × |
| COMPARATIVE EXAMPLE 3-121 | | | | | 1,2-Dimethoxy-4-(1-propenyl)benzene | 264 | −11 | × | × | × |
| COMPARATIVE EXAMPLE 3-122 | | | | | MDPE | 265 | −10 | × | × | × |
| COMPARATIVE EXAMPLE 3-123 | | | | | Diphenyl methane | 265 | −10 | × | × | × |
| COMPARATIVE EXAMPLE 3-124 | | | | | 2-Phenylpyridine | 268 | −7 | × | × | × |
| COMPARATIVE EXAMPLE 3-125 | | | | | DMDPE | 270 | −5 | × | × | △ |
| COMPARATIVE EXAMPLE 3-126 | | | | | 3-Phenoxytoluene | 272 | −3 | △ | △ | △ |
| COMPARATIVE EXAMPLE 3-127 | | | | | 3-Phenylpyridine | 272 | −3 | △ | △ | △ |
| COMPARATIVE EXAMPLE 3-128 | | | | | 2-Phenylanisole | 274 | −1 | △ | △ | △ |
| COMPARATIVE EXAMPLE 3-129 | | | | | 2-Phenoxytetrahydropyran | 275 | 0 | △ | △ | △ |
| COMPARATIVE EXAMPLE 3-130 | | | | | NPBP | 280 | 5 | △ | △ | △ |
| COMPARATIVE EXAMPLE 3-131 | | | | | 25DMDPE | 280 | 5 | △ | △ | △ |
| COMPARATIVE EXAMPLE 3-132 | | | | | Ethyl 2-Naphthyl Ether | 282 | 7 | △ | △ | △ |
| COMPARATIVE EXAMPLE 3-133 | | | | | 225TMDPE | 290 | 15 | △ | △ | △ |
| COMPARATIVE EXAMPLE 3-134 | | | | | Dibenzyl Ether | 295 | 20 | △ | △ | △ |
| COMPARATIVE EXAMPLE 3-135 | | | | | 235TMDPE | 295 | 20 | △ | △ | △ |
| COMPARATIVE EXAMPLE 3-136 | | | | | N-Methyldiphenylamine | 297 | 22 | △ | △ | △ |
| COMPARATIVE EXAMPLE 3-137 | | | | | 4-Isopropylbiphenyl | 298 | 23 | △ | △ | △ |
| EXAMPLE 3-35 | | | | | α,α-Dichlorodiphenylmethane | 305 | 30 | ○ | ○ | ○ |
| EXAMPLE 3-36 | | | | | 4-(3-phenylpropyl)pyridine | 322 | 47 | ◎ | ◎ | ◎ |
| EXAMPLE 3-37 | | | | | Benzyl Benzoate | 324 | 49 | ◎ | ◎ | ◎ |
| EXAMPLE 3-38 | | | | | 1,1-Bis(3,4-Dimethylphenyl)ethane | 333 | 58 | ◎ | ◎ | ◎ |

FIG. 46

<INK FOR FORMING LIGHT EMITTING LAYER>

FIRST COMPONENT : SECOND COMPONENT : THIRD COMPONENT = 50 : 50 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 3-39 | TDAPB+Ir(ppy)3 | Diethyleneglycol butylmethyl ether | 212 | 24.1 | 1,3-Dipropoxybenzene | 251 | 39 | ◎ | ○ | ◎ |
| EXAMPLE 3-40 | | | | | 4-Methoxybenzaldehyde Dimethyl Acetal | 253 | 41 | ◎ | ○ | ◎ |
| EXAMPLE 3-41 | | | | | 4,4-Difluorodiphenylmethane | 258 | 46 | ◎ | ○ | ◎ |
| EXAMPLE 3-42 | | | | | Diphenyl ether | 259 | 47 | ◎ | ○ | ◎ |
| EXAMPLE 3-43 | | | | | 1,2-Dimethoxy-4-(1-propenyl)benzene | 264 | 52 | ◎ | ○ | ◎ |
| EXAMPLE 3-44 | | | | | MDPE | 265 | 53 | ◎ | ○ | ◎ |
| EXAMPLE 3-45 | | | | | Diphenyl methane | 265 | 53 | ◎ | ○ | ◎ |
| EXAMPLE 3-46 | | | | | 2-Phenylpyridine | 268 | 56 | ◎ | ○ | ◎ |
| EXAMPLE 3-47 | | | | | DMDPE | 270 | 58 | ◎ | ○ | ◎ |
| EXAMPLE 3-48 | | | | | 3-Phenoxytoluene | 272 | 60 | ◎ | ○ | ◎ |
| EXAMPLE 3-49 | | | | | 3-Phenylpyridine | 272 | 60 | ◎ | ○ | ◎ |
| EXAMPLE 3-50 | | | | | 2-Phenylanisole | 274 | 62 | ◎ | ○ | ◎ |
| EXAMPLE 3-51 | | | | | 2-Phenoxytetrahydropuran | 275 | 63 | ◎ | ○ | ◎ |
| EXAMPLE 3-52 | | | | | NPBP | 280 | 68 | ◎ | ○ | ◎ |
| EXAMPLE 3-53 | | | | | 25DMDPE | 280 | 68 | ◎ | ○ | ◎ |
| EXAMPLE 3-54 | | | | | Ethyl 2-Naphthyl Ether | 282 | 70 | ◎ | ○ | ◎ |
| EXAMPLE 3-55 | | | | | 225TMDPE | 290 | 78 | ◎ | ○ | ◎ |
| EXAMPLE 3-56 | | | | | Dibenzyl Ether | 295 | 83 | ◎ | ○ | ◎ |
| EXAMPLE 3-57 | | | | | 235TMDPE | 295 | 83 | ◎ | ○ | ◎ |
| EXAMPLE 3-58 | | | | | N-Methyldiphenylamine | 297 | 85 | ◎ | ○ | ◎ |
| EXAMPLE 3-59 | | | | | 4-Isopropylbiphenyl | 298 | 86 | ◎ | ○ | ◎ |
| EXAMPLE 3-60 | | | | | α,α-Dichlorodiphenylmethane | 305 | 93 | ◎ | ○ | ◎ |
| EXAMPLE 3-61 | | | | | 4-(3-phenylpropyl)pyridine | 322 | 110 | ◎ | ○ | ◎ |
| EXAMPLE 3-62 | | | | | Benzyl Benzoate | 324 | 112 | ◎ | ○ | ◎ |
| EXAMPLE 3-63 | | | | | 1,1-Bis(3,4-Dimethylphenyl)ethane | 333 | 121 | ◎ | ○ | ◎ |

FIG. 47

<INK FOR FORMING LIGHT EMITTING LAYER>

FIRST COMPONENT : SECOND COMPONENT = 50 : 50  THIRD COMPONENT 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-138 | TDAPB+Ir(ppy)3 | Diethyleneglycol dibutyl ether | 256 | 24.9 | 1,3-Dipropoxybenzene | 251 | -5 | △ | △ | △ |
| COMPARATIVE EXAMPLE 3-139 | | | | | 4-Methoxybenzaldehyde Dimethyl Acetal | 253 | -3 | △ | △ | △ |
| COMPARATIVE EXAMPLE 3-140 | | | | | 4,4'-Difluorodiphenylmethane | 258 | 2 | △ | △ | △ |
| COMPARATIVE EXAMPLE 3-141 | | | | | Diphenyl ether | 259 | 3 | △ | △ | △ |
| COMPARATIVE EXAMPLE 3-142 | | | | | 1,2-Dimethoxy-4-(1-propenyl)benzene | 264 | 8 | △ | △ | △ |
| COMPARATIVE EXAMPLE 3-143 | | | | | MDPE | 265 | 9 | △ | △ | △ |
| COMPARATIVE EXAMPLE 3-144 | | | | | Diphenyl methane | 265 | 9 | △ | △ | △ |
| COMPARATIVE EXAMPLE 3-145 | | | | | 2-Phenylpyridine | 268 | 12 | △ | △ | △ |
| COMPARATIVE EXAMPLE 3-146 | | | | | DMDPE | 270 | 14 | △ | △ | △ |
| COMPARATIVE EXAMPLE 3-147 | | | | | 3-Phenoxytoluene | 272 | 16 | △ | △ | △ |
| COMPARATIVE EXAMPLE 3-148 | | | | | 3-Phenylpyridine | 272 | 16 | △ | △ | △ |
| COMPARATIVE EXAMPLE 3-149 | | | | | 2-Phenylanisole | 274 | 18 | △ | △ | △ |
| COMPARATIVE EXAMPLE 3-150 | | | | | 2-Phenoxytetrahydropyran | 275 | 19 | △ | △ | △ |
| COMPARATIVE EXAMPLE 3-151 | | | | | NPBP | 280 | 24 | △ | △ | △ |
| COMPARATIVE EXAMPLE 3-152 | | | | | 25DMDPE | 280 | 24 | △ | △ | △ |
| COMPARATIVE EXAMPLE 3-153 | | | | | Ethyl 2-Naphthyl Ether | 282 | 26 | △ | △ | △ |
| EXAMPLE 3-64 | | | | | 225TMDPE | 290 | 34 | ○ | ○ | ○ |
| EXAMPLE 3-65 | | | | | Dibenzyl Ether | 295 | 39 | ◎ | ◎ | ◎ |
| EXAMPLE 3-66 | | | | | 235TMDPE | 295 | 39 | ◎ | ◎ | ◎ |
| EXAMPLE 3-67 | | | | | N-Methyldiphenylamine | 297 | 41 | ◎ | ◎ | ◎ |
| EXAMPLE 3-68 | | | | | 4-Isopropylbiphenyl | 298 | 42 | ◎ | ◎ | ◎ |
| EXAMPLE 3-69 | | | | | α,α-Dichlorodiphenylmethane | 305 | 49 | ◎ | ◎ | ◎ |
| EXAMPLE 3-70 | | | | | 4-(3-phenylpropyl)pyridine | 322 | 66 | ◎ | ◎ | ◎ |
| EXAMPLE 3-71 | | | | | Benzyl Benzoate | 324 | 68 | ◎ | ◎ | ◎ |
| EXAMPLE 3-72 | | | | | 1,1-Bis(3,4-Dimethylphenyl)ethane | 333 | 77 | ◎ | ◎ | ◎ |

FIG. 48

<INK FOR FORMING LIGHT EMITTING LAYER>

| No. | THIRD COMPONENT | SECOND COMPONENT | | | FIRST COMPONENT | | | WETTING SPREAD DEFECT | STAIN | LIGHT EMITTING FAILURE IN DARK SPOT OR BRIGHT SPOT |
|---|---|---|---|---|---|---|---|---|---|---|
| | COMPONENT NAME | SOLVENT NAME | BOILING POINT (°C) | SURFACE TENSION (mN/m) | SOLVENT NAME | BOILING POINT (°C) | Δbp(°C) | | | |
| COMPARATIVE EXAMPLE 3-154 | TDAPB+Ir(ppy)3 | Tetraethyleneglycol dimethyl ether | 275 | 31.8 | 1,3-Dipropoxybenzene | 251 | -24 | × | × | × |
| COMPARATIVE EXAMPLE 3-155 | | | | | 4-Methoxybenzaldehyde Dimethyl Acetal | 253 | -22 | × | × | × |
| COMPARATIVE EXAMPLE 3-156 | | | | | 4,4'-Difluorodiphenylmethane | 258 | -17 | × | × | × |
| COMPARATIVE EXAMPLE 3-157 | | | | | Diphenyl ether | 259 | -16 | × | × | × |
| COMPARATIVE EXAMPLE 3-158 | | | | | 1,2-Dimethoxy-4-(1-propenyl)benzene | 264 | -11 | × | × | × |
| COMPARATIVE EXAMPLE 3-159 | | | | | MDPE | 265 | -10 | × | × | × |
| COMPARATIVE EXAMPLE 3-160 | | | | | Diphenyl methane | 265 | -10 | × | × | × |
| COMPARATIVE EXAMPLE 3-161 | | | | | 2-Phenylpyridine | 268 | -7 | × | × | × |
| COMPARATIVE EXAMPLE 3-162 | | | | | DMDPE | 270 | -5 | △ | △ | △ |
| COMPARATIVE EXAMPLE 3-163 | | | | | 3-Phenoxytoluene | 272 | -3 | △ | △ | △ |
| COMPARATIVE EXAMPLE 3-164 | | | | | 3-Phenylpyridine | 272 | -3 | △ | △ | △ |
| COMPARATIVE EXAMPLE 3-165 | | | | | 2-Phenylanisole | 274 | -1 | △ | △ | △ |
| COMPARATIVE EXAMPLE 3-166 | | | | | 2-Phenoxytetrahydropyran | 275 | 0 | △ | △ | △ |
| COMPARATIVE EXAMPLE 3-167 | | | | | NPBP | 280 | 5 | △ | △ | △ |
| COMPARATIVE EXAMPLE 3-168 | | | | | 25DMDPE | 280 | 5 | △ | △ | △ |
| COMPARATIVE EXAMPLE 3-169 | | | | | Ethyl 2-Naphthyl Ether | 282 | 7 | △ | △ | △ |
| COMPARATIVE EXAMPLE 3-170 | | | | | 225TMDPE | 290 | 15 | △ | △ | △ |
| COMPARATIVE EXAMPLE 3-171 | | | | | Dibenzyl Ether | 295 | 20 | △ | △ | △ |
| COMPARATIVE EXAMPLE 3-172 | | | | | 235TMDPE | 295 | 20 | △ | △ | △ |
| COMPARATIVE EXAMPLE 3-173 | | | | | N-Methyldiphenylamine | 297 | 22 | △ | △ | △ |
| COMPARATIVE EXAMPLE 3-174 | | | | | 4-isopropylbiphenyl | 298 | 23 | △ | △ | △ |
| EXAMPLE 3-73 | | | | | α,α-Dichlorodiphenylmethane | 305 | 30 | ○ | ○ | ○ |
| EXAMPLE 3-74 | | | | | 4,(3-phenylpropyl)pyridine | 322 | 47 | ◎ | ◎ | ◎ |
| EXAMPLE 3-75 | | | | | Benzyl Benzoate | 324 | 49 | ◎ | ◎ | ◎ |
| EXAMPLE 3-76 | | | | | 1,1-Bis(3,4-Dimethylphenyl)ethane | 333 | 58 | ◎ | ◎ | ◎ |

FIRST COMPONENT: SECOND COMPONENT: THIRD COMPONENT = 50:50 THIRD COMPONENT 0.5 wt%

FIG. 49

<INK FOR FORMING LIGHT EMITTING LAYER>

FIRST COMPONENT: SECOND COMPONENT: THIRD COMPONENT = 30:70 THIRD COMPONENT 0.5 wt%

| No. | THIRD COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| EXAMPLE 3-77 | TDAPB+Ir(ppy)3 | Diethyleneglycol butylmethyl ether | 212 | 24.1 | 1,3-Dipropoxybenzene | 251 | 39 | ◎ | ○ | ◎ |
| EXAMPLE 3-78 | | | | | 4-Methoxybenzaldehyde Dimethyl Acetal | 253 | 41 | ◎ | ○ | ◎ |
| EXAMPLE 3-79 | | | | | 4,4'-Difluorodiphenylmethane | 258 | 46 | ◎ | ○ | ◎ |
| EXAMPLE 3-80 | | | | | Diphenyl ether | 259 | 47 | ◎ | ○ | ◎ |
| EXAMPLE 3-81 | | | | | 1,2-Dimethoxy-4-(1-propenyl)benzene | 264 | 52 | ◎ | ○ | ◎ |
| EXAMPLE 3-82 | | | | | MDPE | 265 | 53 | ◎ | ○ | ◎ |
| EXAMPLE 3-83 | | | | | Diphenyl methane | 265 | 53 | ◎ | ○ | ◎ |
| EXAMPLE 3-84 | | | | | 2-Phenylpyridine | 268 | 56 | ◎ | ○ | ◎ |
| EXAMPLE 3-85 | | | | | DMDPE | 270 | 58 | ◎ | ○ | ◎ |
| EXAMPLE 3-86 | | | | | 3-Phenoxytoluene | 272 | 60 | ◎ | ○ | ◎ |
| EXAMPLE 3-87 | | | | | 3-Phenylpyridine | 272 | 60 | ◎ | ○ | ◎ |
| EXAMPLE 3-88 | | | | | 2-Phenylanisole | 274 | 62 | ◎ | ○ | ◎ |
| EXAMPLE 3-89 | | | | | 2-Phenoxytetrahydropuran | 275 | 63 | ◎ | ○ | ◎ |
| EXAMPLE 3-90 | | | | | NPBP | 280 | 68 | ◎ | ○ | ◎ |
| EXAMPLE 3-91 | | | | | 25DMDPE | 280 | 68 | ◎ | ○ | ◎ |
| EXAMPLE 3-92 | | | | | Ethyl 2-Naphthyl Ether | 282 | 70 | ◎ | ○ | ◎ |
| EXAMPLE 3-93 | | | | | 225TMDPE | 290 | 78 | ◎ | ○ | ◎ |
| EXAMPLE 3-94 | | | | | Dibenzyl Ether | 295 | 83 | ◎ | ○ | ◎ |
| EXAMPLE 3-95 | | | | | 235TMDPE | 295 | 83 | ◎ | ○ | ◎ |
| EXAMPLE 3-96 | | | | | N-Methyldiphenylamine | 297 | 85 | ◎ | ○ | ◎ |
| EXAMPLE 3-97 | | | | | 4-Isopropylbiphenyl | 298 | 86 | ◎ | ○ | ◎ |
| EXAMPLE 3-98 | | | | | α,α-Dichlorodiphenylmethane | 305 | 93 | ◎ | ○ | ◎ |
| EXAMPLE 3-99 | | | | | 4-(3-phenylisopropyl)pyridine | 322 | 110 | ◎ | ○ | ◎ |
| EXAMPLE 3-100 | | | | | Benzyl Benzoate | 324 | 112 | ◎ | ○ | ◎ |
| EXAMPLE 3-101 | | | | | 1,1-Bis(3,4-Dimethylphenyl)methane | 333 | 121 | ◎ | ○ | ◎ |

FIG. 50

<INK FOR FORMING LIGHT EMITTING LAYER>
FIRST COMPONENT: SECOND COMPONENT: THIRD COMPONENT = 30:70, THIRD COMPONENT 0.5 wt%

| No. | THIRD COMPONENT COMPONENT NAME | SECOND COMPONENT SOLVENT NAME | SECOND COMPONENT BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-173 | TDAPB+Ir(ppy)3 | Diethyleneglycol dibutyl ether | 256 | 24.9 | 1,3-Dipropoxybenzene | 251 | -5 | △ | △ | △ |
| COMPARATIVE EXAMPLE 3-175 | | | | | 4-Methoxybenzaldehyde Dimethyl Acetal | 253 | -3 | △ | △ | △ |
| COMPARATIVE EXAMPLE 3-177 | | | | | 4,4'-Difluorodiphenylmethane | 258 | 2 | △ | △ | △ |
| COMPARATIVE EXAMPLE 3-178 | | | | | Diphenyl ether | 259 | 3 | △ | △ | △ |
| COMPARATIVE EXAMPLE 3-179 | | | | | 1,2-Dimethoxy-4-(1-propenyl)benzene | 264 | 8 | △ | △ | △ |
| COMPARATIVE EXAMPLE 3-180 | | | | | MDPE | 265 | 9 | △ | △ | △ |
| COMPARATIVE EXAMPLE 3-181 | | | | | Diphenyl methane | 265 | 9 | △ | △ | △ |
| COMPARATIVE EXAMPLE 3-182 | | | | | 2-Phenylpyridine | 268 | 12 | △ | △ | △ |
| COMPARATIVE EXAMPLE 3-183 | | | | | DMDPE | 270 | 14 | △ | △ | △ |
| COMPARATIVE EXAMPLE 3-184 | | | | | 3-Phenoxytoluene | 272 | 16 | △ | △ | △ |
| COMPARATIVE EXAMPLE 3-185 | | | | | 3-Phenylpyridine | 272 | 16 | △ | △ | △ |
| COMPARATIVE EXAMPLE 3-186 | | | | | 2-Phenylanisole | 274 | 18 | △ | △ | △ |
| COMPARATIVE EXAMPLE 3-187 | | | | | 2-Phenoxytetrahydropyran | 275 | 19 | △ | △ | △ |
| COMPARATIVE EXAMPLE 3-188 | | | | | NPBP | 280 | 24 | △ | △ | △ |
| COMPARATIVE EXAMPLE 3-189 | | | | | 25DMDPE | 280 | 24 | △ | △ | △ |
| COMPARATIVE EXAMPLE 3-190 | | | | | Ethyl 2-Naphthyl Ether | 282 | 26 | △ | △ | △ |
| EXAMPLE 3-102 | | | | | 22STMDPE | 290 | 34 | ○ | ○ | ○ |
| EXAMPLE 3-103 | | | | | Dibenzyl Ether | 295 | 39 | ◎ | ◎ | ◎ |
| EXAMPLE 3-104 | | | | | 23STMDPE | 295 | 39 | ◎ | ◎ | ◎ |
| EXAMPLE 3-105 | | | | | N-Methyldiphenylamine | 297 | 41 | ◎ | ◎ | ◎ |
| EXAMPLE 3-106 | | | | | 4-Isopropyldiphenyl | 298 | 42 | ◎ | ◎ | ◎ |
| EXAMPLE 3-107 | | | | | α,α-Dichlorodiphenylmethane | 305 | 49 | ◎ | ○ | ◎ |
| EXAMPLE 3-108 | | | | | 4-(3-phenylpropyl)pyridine | 322 | 66 | ○ | ◎ | ◎ |
| EXAMPLE 3-109 | | | | | Benzyl Benzoate | 324 | 68 | ◎ | ○ | ◎ |
| EXAMPLE 3-110 | | | | | 1,1-Bis(3,4-Dimethylphenyl)methane | 333 | 77 | ◎ | ○ | ◎ |

FIG. 51

<INK FOR FORMING LIGHT EMITTING LAYER>

FIRST COMPONENT: SECOND COMPONENT: THIRD COMPONENT = 30:70 THIRD COMPONENT 0.5 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp (°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-191 | TDAPB+Ir(ppy)3 | Tetraethyleneglycol dimethyl ether | 275 | 31.8 | 1,3-Dipropoxybenzene | 251 | -24 | × | × | × |
| COMPARATIVE EXAMPLE 3-192 | | | | | 4-Methoxybenzaldehyde Dimethyl Acetal | 253 | -22 | × | × | × |
| COMPARATIVE EXAMPLE 3-193 | | | | | 4,4-Difluorodiphenylmethane | 258 | -17 | × | × | × |
| COMPARATIVE EXAMPLE 3-194 | | | | | Diphenyl ether | 259 | -16 | × | × | × |
| COMPARATIVE EXAMPLE 3-195 | | | | | 1,2-Dimethoxy-4-(1-propenyl)benzene | 264 | -11 | × | × | × |
| COMPARATIVE EXAMPLE 3-196 | | | | | MDPE | 265 | -10 | × | × | × |
| COMPARATIVE EXAMPLE 3-197 | | | | | Diphenyl methane | 265 | -10 | × | × | × |
| COMPARATIVE EXAMPLE 3-198 | | | | | 2-Phenylpyridine | 268 | -7 | × | × | × |
| COMPARATIVE EXAMPLE 3-199 | | | | | DMDPE | 270 | -5 | × | × | × |
| COMPARATIVE EXAMPLE 3-200 | | | | | 3-Phenoxytoluene | 272 | -3 | △ | △ | △ |
| COMPARATIVE EXAMPLE 3-201 | | | | | 3-Phenylpyridine | 272 | -3 | △ | △ | △ |
| COMPARATIVE EXAMPLE 3-202 | | | | | 2-Phenylanisole | 274 | -1 | △ | △ | △ |
| COMPARATIVE EXAMPLE 3-203 | | | | | 2-Phenoxytetrahydropuran | 275 | 0 | △ | △ | △ |
| COMPARATIVE EXAMPLE 3-204 | | | | | NPBP | 280 | 5 | △ | △ | △ |
| COMPARATIVE EXAMPLE 3-205 | | | | | 25DMDPE | 280 | 5 | △ | △ | △ |
| COMPARATIVE EXAMPLE 3-206 | | | | | Ethyl 2-Naphthyl Ether | 282 | 7 | △ | △ | △ |
| COMPARATIVE EXAMPLE 3-207 | | | | | 225TMDPE | 290 | 15 | △ | △ | △ |
| COMPARATIVE EXAMPLE 3-208 | | | | | Dibenzyl Ether | 295 | 20 | △ | △ | △ |
| COMPARATIVE EXAMPLE 3-209 | | | | | 235TMDPE | 295 | 20 | △ | △ | △ |
| COMPARATIVE EXAMPLE 3-210 | | | | | N-Methyldiphenylamine | 297 | 22 | △ | △ | △ |
| COMPARATIVE EXAMPLE 3-211 | | | | | 4-Isopropylbiphenyl | 298 | 23 | △ | △ | △ |
| EXAMPLE 3-111 | | | | | α,α-Dichlorodiphenylmethane | 305 | 30 | ◎ | ○ | ◎ |
| EXAMPLE 3-112 | | | | | 4-(3-phenylpropyl)pyridine | 322 | 47 | ◎ | ○ | ◎ |
| EXAMPLE 3-113 | | | | | Benzyl Benzoate | 324 | 49 | ◎ | ○ | ◎ |
| EXAMPLE 3-114 | | | | | 1,1-Bis(3,4-Dimethylphenyl)methane | 333 | 58 | ◎ | ○ | ◎ |

FIG. 52

<INK FOR FORMING LIGHT EMITTING LAYER>
FIRST COMPONENT:SECOND COMPONENT:THIRD COMPONENT = 20:80:0.6 wt%

| No. | THIRD COMPONENT COMPONENT NAME | SECOND COMPONENT SOLVENT NAME | SECOND COMPONENT BOILING POINT (°C) | SECOND COMPONENT SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-212 | TDAPB+Ir(ppy)3 | Diethyleneglycol butylmethyl ether | 212 | 24.1 | 1,3-Dipropoxybenzene | 251 | 39 | ◎ | × | × |
| COMPARATIVE EXAMPLE 3-213 | | | | | 4-Methoxybenzaldehyde Dimethyl Acetal | 253 | 41 | ◎ | × | × |
| COMPARATIVE EXAMPLE 3-214 | | | | | 4,4-Difluorodiphenylmethane | 258 | 46 | ◎ | × | × |
| COMPARATIVE EXAMPLE 3-215 | | | | | Diphenyl ether | 259 | 47 | ◎ | × | × |
| COMPARATIVE EXAMPLE 3-216 | | | | | 1,2-Dimethoxy-4-(1-propenyl)benzene | 264 | 52 | ◎ | × | × |
| COMPARATIVE EXAMPLE 3-217 | | | | | MDPE | 265 | 53 | ◎ | × | × |
| COMPARATIVE EXAMPLE 3-218 | | | | | Diphenyl methane | 265 | 53 | ◎ | × | × |
| COMPARATIVE EXAMPLE 3-219 | | | | | 2-Phenylpyridine | 268 | 56 | ◎ | × | × |
| COMPARATIVE EXAMPLE 3-220 | | | | | DMDPE | 270 | 58 | ◎ | × | × |
| COMPARATIVE EXAMPLE 3-221 | | | | | 3-Phenoxytoluene | 272 | 60 | ◎ | × | × |
| COMPARATIVE EXAMPLE 3-222 | | | | | 3-Phenylpyridine | 272 | 60 | ◎ | × | × |
| COMPARATIVE EXAMPLE 3-223 | | | | | 2-Phenylanisole | 274 | 62 | ◎ | × | × |
| COMPARATIVE EXAMPLE 3-224 | | | | | 2-Phenoxytetrahydropuran | 275 | 63 | ◎ | × | × |
| COMPARATIVE EXAMPLE 3-225 | | | | | NPBP | 280 | 68 | ◎ | × | × |
| COMPARATIVE EXAMPLE 3-226 | | | | | 25DMDPE | 280 | 68 | ◎ | × | × |
| COMPARATIVE EXAMPLE 3-227 | | | | | Ethyl 2-Naphthyl Ether | 282 | 70 | ◎ | × | × |
| COMPARATIVE EXAMPLE 3-228 | | | | | 225TMDPE | 290 | 78 | ◎ | × | × |
| COMPARATIVE EXAMPLE 3-229 | | | | | Dibenzyl Ether | 295 | 83 | ◎ | × | × |
| COMPARATIVE EXAMPLE 3-230 | | | | | 235TMDPE | 295 | 83 | ◎ | × | × |
| COMPARATIVE EXAMPLE 3-231 | | | | | N-Methyldiphenylamine | 297 | 85 | ◎ | × | × |
| COMPARATIVE EXAMPLE 3-232 | | | | | 4-Isopropylbiphenyl | 298 | 86 | ◎ | × | × |
| COMPARATIVE EXAMPLE 3-233 | | | | | α,α-Dichlorodiphenylmethane | 305 | 93 | ◎ | × | × |
| COMPARATIVE EXAMPLE 3-234 | | | | | 4-(3-phenylpropyl)pyridine | 322 | 110 | ◎ | × | × |
| COMPARATIVE EXAMPLE 3-235 | | | | | Benzyl Benzoate | 324 | 112 | ◎ | × | × |
| COMPARATIVE EXAMPLE 3-236 | | | | | 1,1-Bis(3,4-Dimethylphenyl)ethane | 333 | 121 | ◎ | × | × |

FIG. 53

<INK FOR FORMING LIGHT EMITTING LAYER>

FIRST COMPONENT : SECOND COMPONENT : THIRD COMPONENT = 20 : 80 : THIRD COMPONENT 0.5 wt%

| No. | THIRD COMPONENT COMPONENT NAME | SECOND COMPONENT SOLVENT NAME | SECOND COMPONENT BOILING POINT (°C) | SURFACE TENSION (mN/m) | FIRST COMPONENT SOLVENT NAME | FIRST COMPONENT BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-237 | TDAPB+Ir(ppy)3 | Diethyleneglycol dibutyl ether | 256 | 24.9 | 1,3-Dipropoxybenzene | 251 | -5 | △ | × | × |
| COMPARATIVE EXAMPLE 3-238 | | | | | 4-Methoxybenzaldehyde Dimethyl Acetal | 253 | -3 | △ | × | × |
| COMPARATIVE EXAMPLE 3-239 | | | | | 4,4-Difluorodiphenylmethane | 258 | 2 | △ | × | × |
| COMPARATIVE EXAMPLE 3-240 | | | | | Diphenyl ether | 259 | 3 | △ | × | × |
| COMPARATIVE EXAMPLE 3-241 | | | | | 1,2-Dimethoxy-4-(1-propenyl)benzene | 264 | 8 | △ | × | × |
| COMPARATIVE EXAMPLE 3-242 | | | | | MDPE | 265 | 9 | △ | × | × |
| COMPARATIVE EXAMPLE 3-243 | | | | | Diphenyl methane | 265 | 9 | △ | × | × |
| COMPARATIVE EXAMPLE 3-244 | | | | | 2-Phenylpyridine | 268 | 12 | △ | × | × |
| COMPARATIVE EXAMPLE 3-245 | | | | | DMDPE | 270 | 14 | △ | × | × |
| COMPARATIVE EXAMPLE 3-246 | | | | | 3-Phenoxytoluene | 272 | 16 | △ | × | × |
| COMPARATIVE EXAMPLE 3-247 | | | | | 3-Phenylpyridine | 272 | 16 | △ | × | × |
| COMPARATIVE EXAMPLE 3-248 | | | | | 2-Phenylanisole | 274 | 18 | △ | × | × |
| COMPARATIVE EXAMPLE 3-249 | | | | | 2-Phenoxytetrahydrofuran | 275 | 19 | △ | × | × |
| COMPARATIVE EXAMPLE 3-250 | | | | | NPBP | 280 | 24 | △ | × | × |
| COMPARATIVE EXAMPLE 3-251 | | | | | 26DMDPE | 280 | 24 | △ | × | × |
| COMPARATIVE EXAMPLE 3-252 | | | | | Ethyl 2-Naphthyl Ether | 282 | 26 | △ | × | × |
| COMPARATIVE EXAMPLE 3-253 | | | | | 225TMDPE | 290 | 34 | ○ | × | × |
| COMPARATIVE EXAMPLE 3-254 | | | | | Dibenzyl Ether | 295 | 39 | ◎ | × | × |
| COMPARATIVE EXAMPLE 3-255 | | | | | 235TMDPE | 295 | 39 | ◎ | × | × |
| COMPARATIVE EXAMPLE 3-256 | | | | | N-Methyldiphenylamine | 297 | 41 | ◎ | × | × |
| COMPARATIVE EXAMPLE 3-257 | | | | | 4-Isopropylbiphenyl | 298 | 42 | ◎ | × | × |
| COMPARATIVE EXAMPLE 3-258 | | | | | α,α-Dichlorodiphenylmethane | 305 | 49 | ◎ | × | × |
| COMPARATIVE EXAMPLE 3-259 | | | | | 4-(3-phenylpropyl)pyridine | 322 | 66 | ◎ | × | × |
| COMPARATIVE EXAMPLE 3-260 | | | | | Benzyl Benzoate | 324 | 68 | ◎ | × | × |
| COMPARATIVE EXAMPLE 3-261 | | | | | 1,1-Bis(3,4-Dimethylphenyl)ethane | 333 | 77 | ◎ | × | × |

FIG. 54

<INK FOR FORMING LIGHT EMITTING LAYER>

First Component : Second Component : Third Component = 21.80 : 0.5 wt%

| No. | THIRD COMPONENT COMPONENT NAME | SECOND COMPONENT SOLVENT NAME | BOILING POINT (°C) | SURFACE TENSION (mN/m) | FIRST COMPONENT SOLVENT NAME | BOILING POINT (°C) | Δbp(°C) | WETTING SPREAD DEFECT | STAIN | LIGHT EMITTING FAILURE IN DARK SPOT OR BRIGHT SPOT |
|---|---|---|---|---|---|---|---|---|---|---|
| COMPARATIVE EXAMPLE 3-262 | TDAPB+Ir(ppy)3 | Tetraethyleneglycol dimethyl ether | 275 | 31.8 | 1,3-Dipropoxybenzene | 251 | -24 | × | × | × |
| COMPARATIVE EXAMPLE 3-263 | | | | | 4-Methoxybenzaldehyde Dimethyl Acetal | 253 | -22 | × | × | × |
| COMPARATIVE EXAMPLE 3-264 | | | | | 4,4'-Difluorodiphenylmethane | 258 | -17 | × | × | × |
| COMPARATIVE EXAMPLE 3-265 | | | | | Diphenyl ether | 259 | -16 | × | × | × |
| COMPARATIVE EXAMPLE 3-266 | | | | | 1,2-Dimethoxy-4-(1-propenyl)benzene | 264 | -11 | × | × | × |
| COMPARATIVE EXAMPLE 3-267 | | | | | MDPE | 265 | -10 | × | × | × |
| COMPARATIVE EXAMPLE 3-268 | | | | | Diphenyl methane | 265 | -10 | × | × | × |
| COMPARATIVE EXAMPLE 3-269 | | | | | 2-Phenylpyridine | 268 | -7 | × | × | × |
| COMPARATIVE EXAMPLE 3-270 | | | | | DMDPE | 270 | -5 | × | × | × |
| COMPARATIVE EXAMPLE 3-271 | | | | | 3-Phenoxytoluene | 272 | -3 | △ | × | × |
| COMPARATIVE EXAMPLE 3-272 | | | | | 3-Phenylpyridine | 272 | -3 | △ | × | × |
| COMPARATIVE EXAMPLE 3-273 | | | | | 2-Phenylanisole | 274 | -1 | △ | × | × |
| COMPARATIVE EXAMPLE 3-274 | | | | | 2-Phenoxytetrahydropyran | 275 | 0 | △ | × | × |
| COMPARATIVE EXAMPLE 3-275 | | | | | NPBP | 280 | 5 | △ | × | × |
| COMPARATIVE EXAMPLE 3-276 | | | | | 25DMDPE | 280 | 5 | △ | × | × |
| COMPARATIVE EXAMPLE 3-277 | | | | | Ethyl 2-Naphthyl Ether | 282 | 7 | △ | × | × |
| COMPARATIVE EXAMPLE 3-278 | | | | | 225TMDPE | 290 | 15 | △ | × | × |
| COMPARATIVE EXAMPLE 3-279 | | | | | Dibenzyl Ether | 295 | 20 | △ | × | × |
| COMPARATIVE EXAMPLE 3-280 | | | | | 235TMDPE | 295 | 20 | △ | × | × |
| COMPARATIVE EXAMPLE 3-281 | | | | | N-Methyldiphenylamine | 297 | 22 | △ | × | × |
| COMPARATIVE EXAMPLE 3-282 | | | | | 4-Isopropylbiphenyl | 298 | 23 | △ | × | × |
| COMPARATIVE EXAMPLE 3-283 | | | | | α,α-Dichlorodiphenylmethane | 305 | 30 | ◎ | × | × |
| COMPARATIVE EXAMPLE 3-284 | | | | | 4-(3-phenylpropyl)pyridine | 322 | 47 | ◎ | × | × |
| COMPARATIVE EXAMPLE 3-285 | | | | | Benzyl Benzoate | 324 | 49 | ◎ | × | × |
| COMPARATIVE EXAMPLE 3-286 | | | | | 1,1-Bis(3,4-Dimethylphenyl)ethane | 333 | 58 | ◎ | × | × |

INK FOR FORMING FUNCTIONAL LAYER, INK CONTAINER, DISCHARGHING APPARATUS, METHOD FOR FORMING FUNCTIONAL LAYER, METHOD FOR MANUFACTURING ORGANIC EL ELEMENT, LIGHT EMITTING DEVICE, AND ELECTRONIC APPARATUS

BACKGROUND

1. Technical Field

The present invention relates to an ink for forming a functional layer, an ink container, a discharging apparatus, a method for forming a functional layer, a method for manufacturing an organic electroluminescence (EL) element, a light emitting device, and an electronic apparatus.

2. Related Art

Recently, as a method for forming a colored layer (filter layer) of a color filter, a light emitting layer of an organic EL element, an electrode of a semiconductor such as an organic thin film transistor, or a functional layer such as a semiconductor layer, a method that uses a liquid phase process has been developed. In the liquid phase process, an ink jet method (also referred to as a droplet discharging method) has attracted attention, since the method is possible to apply accurately a predetermined amount of ink (solution) as a droplet at a desired position from a discharging head (ink jet head).

On the other hand, the ink (solution) which is used in the ink jet method causes to deposit solid contents on a nozzle of the discharging head due to drying and to clog the nozzle with solid contents, thus a discharging failure in which an impact position of the droplet varies and a discharged amount of the droplet discharged from the nozzle varies occurs. Therefore, the ink (solution) in which the discharging failure hardly occurs is required. Further, since a functional layer (functional film) is formed by applying and drying the ink (solution), it is required to evenly apply the ink on a desired area in an object to be applied such as a substrate.

For example, Japanese Patent No. 4616596 discloses that an ink composition for forming an amorphous film includes a first solvent of which a solubility of an organic material is more than or equal to 0.5 wt % and a second solvent that contains an alcohol compound of which a boiling point is higher than or equal to 120° C. in a solubility of less than or equal to 0.1 wt % of an organic material, in which the boiling point of the first solvent is higher than the boiling point of the second solvent. According to Japanese Patent No. 4616596, it is disclosed that the ink composition for forming an amorphous film is suitable for the ink jet method.

Furthermore, for example, in Japanese Patent No. 4707658, it is disclosed that an application liquid includes a mixed solvent and a functional material, in which the mixed solvent having two aromatic rings or more includes a first solvent that is formed by a compound having a symmetrical stricture and other solvent. If this application liquid is used, an occurrence of the nozzle clogging is difficult in the ink jet method, thus a stable discharge can be realized.

Moreover, for example, in Japanese Patent No. 5019454, it is disclosed that a solution of an organic semiconductor includes at least one kind of organic solvent A as a good solvent of the organic semiconductor and at least one kind of organic solvent B as a poor solvent of the organic semiconductor, in which a boiling point of the organic solvent A is higher than a boiling point of the organic solvent B. According to this solution, even film formation is possible since it is difficult to aggregate and deposit an organic semiconductor material during drying, thus an organic semiconductor having stable electrical properties can be formed.

However, in the ink composition of Japanese Patent No. 4616596, since the second solvent is the alcohol compound, there is a problem that the organic material is easily aggregated in a drying process of the applied ink composition. Furthermore, in Japanese Patent No. 4707658, since both of the first solvent and other solvent are aromatic compounds, there is a problem that a wetting spread is difficult and an uneven application easily occurs when the application liquid as a droplet is discharged on a conductive film such as a metal and a metal oxide. Moreover, in the solution of the organic semiconductor of Japanese Patent No. 5019454, since the boiling point of the organic solvent B is lower than the boiling point of the organic solvent A and a preferable ratio of the organic solvent B to the solution is less than or equal to 30 vol %, the organic solvent B evaporates earlier than the organic solvent A and an evaporating timing of the organic solvent B is relatively fast, in a drying process of the applied solution. Accordingly, there is a problem that wettability of the remaining organic solvent A as a good solvent is poor with respect to the object to be applied when the organic solvent A remains after evaporation of the organic solvent B and the uneven application easily occurs. In other words, in a solution configuration shown in Japanese Patent No. 4616596, Japanese Patent No. 4707658, and Japanese Patent No. 5019454, there is a problem that a functional layer (functional film) cannot be evenly formed.

SUMMARY

The invention can be realized in the following forms or application examples.

Application Example 1

According to this application example, there is provided an ink for forming a functional layer including a first component that contains at least one kind of aromatic solvent of which a boiling point is higher than or equal to 250° C. and lower than or equal to 350° C., a second component that contains at least one kind of aliphatic solvent of which a boiling point is higher than or equal to 200° C., and a third component for forming a functional layer, in which a solubility of the third component in the first component is higher than that of the third component in the second component, a mixing ratio of the second component is more than or equal to 30 vol % and less than or equal to 70 vol %, the boiling point of the first component is higher than that of the second component, and a difference between the boiling point of the first component and the boiling point of the second component is higher than or equal to 30° C.

According to this application example, since the mixed solvent is formed by combining with the aromatic solvent and the aliphatic solvent with respect to the third component, it is easy to adjust the surface tension and the solubility of the third component in comparison with the case of the aromatic solvent alone. Further, since the boiling point of the second component (aliphatic solvent) is lower than that of the first component (aromatic solvent) that dissolves the third component and the boiling point of the second component is higher than or equal to 200° C., a nozzle clogging of the discharging head due to drying is difficult to occur. Moreover, since the second component is the aliphatic solvent, it is shown that the second component has excellent wettability even with respect to the conductive film, and the uneven application is difficult to occur. Furthermore, the difference between the boiling point of the first component and the boiling point of the second component is higher than or equal to 30° C. and the mixing ratio of the second component to whole ink is more than or equal to 30 vol % and less than or equal to 70 vol %. Therefore, in comparison with the case where the mixing ratio of the second component is less than 30 vol %, the second component is prevented from evaporating immediately in the drying process and the uneven application due to drying rate of the second component is difficult to occur. That is, it is possible to provide the ink for forming a functional layer which is suitable for an ink jet method (droplet discharging method).

Application Example 2

In the ink for forming a functional layer according to the application example, a surface tension of the second component is smaller than that of the first component, and the surface tension of the second component is less than or equal to 0.32 mN/m.

According to the application example, it is shown that the second component has the excellent wettability with respect to an object to be applied, thus it is possible to provide the ink for forming a functional layer in which the uneven application is further difficult to occur.

Application Example 3

In the ink for forming a functional layer according to the application example, the second component is an aliphatic ether represented by the following formula in which n is more than or equal to 2.

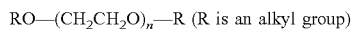

RO—(CH$_2$CH$_2$O)$_n$—R (R is an alkyl group)

Application Example 4

In the ink for forming a functional layer according to the application example, the second component is selected from diethylene glycol buthyl methyl ether or diethylene glycol dibuthyl ether.

According to the application example, the surface tension of the second component is smaller than that of the aromatic solvent of the first component, thus it may be realized that the surface tension of the second component is less than or equal to 32 mN/m.

Application Example 5

In the ink for forming a functional layer according to the application example, the first component is an aromatic compound including any one of nitrogen, oxygen, fluorine, and chlorine as a side chain.

Application Example 6

In the ink for forming a functional layer according to the application example, the first component is selected from dibenzyl ether, 3-phenoxy toluene, or 1,1-bis(3,4 dimethylphenyl)ethane.

The boiling point of the aromatic solvents is higher than or equal to 250° C. and the aromatic solvents have excellent solubility with respect to the organic semiconductor material.

Application Example 7

In the ink for forming a functional layer according to the application example, it is preferable that the first component dissolves more than or equal to 0.1 wt % of the third component.

Application Example 8

In the ink for forming a functional layer according to the application example, a mixed solvent of the first component and the second component may dissolve more than or equal to 0.1 wt % of the third component.

According to the application example, it is possible to stably form even a functional layer of which film thickness is relatively thin, using the ink jet method.

Application Example 9

In the ink for forming a functional layer according to the application example, the first component includes plural kinds of aromatic solvents.

According to the application example, in comparison with the case of using one kind of aromatic solvent, it is easy to adjust the solubility or the wettability of the third component with respect to the object to be applied.

Application Example 10

In the ink for forming a functional layer according to the application example, the third component includes an organic compound which is a π-conjugated high molecular material or a π-conjugated low molecular material.

If this ink for forming a functional layer is used, the functional layer containing the organic compound can be formed without an occurrence of the uneven application. In addition, the low molecular material of the organic compound indicates that a molecular weight of the low molecular material is less than 1000. Moreover, the high molecular material of the organic compound indicates that a molecular weight of the high molecular material is more than or equal to 1000 and the high molecular material has a structure in which basic skeletons are repeated.

Application Example 11

In the ink for forming a functional layer according to the application example, the third component further includes a metal complex.

If the ink for forming a functional layer is used, for example, a light emitting layer can be formed as a functional layer in which the metal complex is a light emitting material and the organic compound is a host material, without the occurrence of the uneven application.

Application Example 12

In the ink for forming a functional layer according to the application example, the third component includes plural kinds of organic compounds.

If the ink for forming a functional layer is used, the functional layer containing plural kinds of organic compounds can be formed without the occurrence of the uneven application.

Application Example 13

According to the application example, there is provided an ink container containing the ink for forming a functional layer according to the application example.

Application Example 14

According to the application example, there is provided a discharging apparatus including the ink container according to Application Example 13, and a discharging head to which the ink for forming a functional layer is supplied from the ink container, in which the discharging head discharges the ink for forming a functional layer as a droplet from a nozzle.

According to the application example, by an ink jet method (droplet discharging method), it is possible to provide the discharging apparatus that is capable of forming the functional layer with less uneven application.

Application Example 15

According to the application example, there is provided a method for forming a functional layer including applying the ink for forming a functional layer according to the application example to a film formation area of an object to be applied, and forming a functional layer in the film formation area by drying and solidifying the applied ink for forming a functional layer.

According to the application example, by a liquid phase process, it is possible to provide the method for forming a functional layer that is capable of forming the functional layer with fewer uneven application.

Application Example 16

In the method for forming a functional layer according to Application Example 15, it is preferable that the film formation area is divided by a diaphragm having liquid repellency against the ink for forming a functional layer.

According to this method, the ink for forming a functional layer is evenly filled in the film formation area divided by the diaphragm.

Application Example 17

According to this application example, there is provided a method for manufacturing an organic EL element, which has a functional layer having a light emitting layer between an anode and a cathode, including forming an insulating layer that divides the anode so as to constitute an opening on the anode and overlaps an outer edge of the anode, applying the ink for forming a functional layer according to Application Examples described above to the opening, forming at least one layer of the functional layer by drying and solidifying the applied ink for forming a functional layer, and forming the cathode by covering the insulating layer and the functional layer.

According to the application example, since at least one kind of functional layer is formed in the state of less uneven application, it is possible to manufacture the organic EL element having the desired light emitting properties with high yield rate.

Application Example 18

According to this application example, there is provided a light emitting device including an organic EL element which is manufactured using the method for manufacturing an organic EL element according to the application example.

According to the application example, it is possible to provide the light emitting device which includes the organic EL element having the desired light emitting properties and achieves an excellent display quality.

Application Example 19

According to this application example, there is provided an electronic apparatus including the light emitting device according to the application example.

According to the application example, it is possible to provide the electronic apparatus having an excellent display quality.

BRIEF DESCRIPTION OF THE DRAWINGS

The invention will be described with reference to the accompanying drawings, wherein like numbers reference like elements.

FIG. 7 is a table illustrating configurations and evaluation results of Comparative Example 1-1 to Comparative Example 1-25 of an ink for forming a positive hole injection layer.

FIG. 8 is a table illustrating configurations and evaluation results of Comparative Example 1-26 to Comparative Example 1-50 of the ink for forming a positive hole injection layer.

FIG. 9 is a table illustrating configurations and evaluation results of Comparative Example 1-51 to Comparative Example 1-75 of the ink for forming a positive hole injection layer.

FIG. 10 is a table illustrating configurations and evaluation results of Comparative Example 1-76 to Comparative Example 1-100 of the ink for forming a positive hole injection layer.

FIG. 11 is a table illustrating configurations and evaluation results of Example 1-1 to Example 1-25 of the ink for forming a positive hole injection layer.

FIG. 12 is a table illustrating configurations and evaluation results of Comparative Example 1-101 to Comparative Example 1-116 and Example 1-26 to Example 1-34 of the ink for forming a positive hole injection layer.

FIG. 13 is a table illustrating configurations and evaluation results of Comparative Example 1-117 to Comparative Example 1-137 and Example 1-35 to Example 1-38 of the ink for forming a positive hole injection layer.

FIG. 14 is a table illustrating configurations and evaluation results of Example 1-39 to Example 1-63 of the ink for forming a positive hole injection layer.

FIG. 15 is a table illustrating configurations and evaluation results of Comparative Example 1-138 to Comparative Example 1-153 and Example 1-64 to Example 1-72 of the ink for forming a positive hole injection layer.

FIG. 16 is a table illustrating configurations and evaluation results of Comparative Example 1-154 to Comparative Example 1-174 and Example 1-73 to Example 1-76 of the ink for forming a positive hole injection layer.

FIG. 17 is a table illustrating configurations and evaluation results of Example 1-77 to Example 1-101 of the ink for forming a positive hole injection layer.

FIG. 18 is a table illustrating configurations and evaluation results of Comparative Example 1-175 to Comparative Example 1-190 and Example 1-102 to Example 1-110 of the ink for forming a positive hole injection layer.

FIG. 19 is a table illustrating configurations and evaluation results of Comparative Example 1-191 to Comparative Example 1-211 and Example 1-111 to Example 1-114 of the ink for forming a positive hole injection layer.

FIG. 20 is a table illustrating configurations and evaluation results of Comparative Example 1-212 to Comparative Example 1-236 of the ink for forming a positive hole injection layer.

FIG. 21 is a table illustrating configurations and evaluation results of Comparative Example 1-237 to Comparative Example 1-261 of the ink for forming a positive hole injection layer.

FIG. 22 is a table illustrating configurations and evaluation results of Comparative Example 1-262 to Comparative Example 1-286 of the ink for forming a positive hole injection layer.

FIG. 23 is a table illustrating configurations and evaluation results of Comparative Example 2-1 to Comparative Example 2-25 of an ink for forming a positive hole transport layer.

FIG. 24 is a table illustrating configurations and evaluation results of Comparative Example 2-26 to Comparative Example 2-50 of the ink for forming a positive hole transport layer.

FIG. 25 is a table illustrating configurations and evaluation results of Comparative Example 2-51 to Comparative Example 2-75 of the ink for forming a positive hole transport layer.

FIG. 26 is a table illustrating configurations and evaluation results of Comparative Example 2-76 to Comparative Example 2-100 of the ink for forming a positive hole transport layer.

FIG. 27 is a table illustrating configurations and evaluation results of Example 2-1 to Example 2-25 of the ink for forming a positive hole transport layer.

FIG. 28 is a table illustrating configurations and evaluation results of Comparative Example 2-101 to Comparative Example 2-116 and Example 2-26 to Example 2-34 of the ink for forming a positive hole transport layer.

FIG. 29 is a table illustrating configurations and evaluation results of Comparative Example 2-117 to Comparative Example 2-137 and Example 2-35 to Example 2-38 of the ink for forming a positive hole transport layer.

FIG. 20 is a table illustrating configurations and evaluation results of Example 2-39 to Example 2-63 of the ink for forming a positive hole transport layer.

FIG. 31 is a table illustrating configurations and evaluation results of Comparative Example 2-138 to Comparative Example 2-153 and Example 2-64 to Example 2-72 of the ink for forming a positive hole transport layer.

FIG. 32 is a table illustrating configurations and evaluation results of Comparative Example 2-154 to Comparative Example 2-174 and Example 2-73 to Example 2-76 of the ink for forming a positive hole transport layer.

FIG. 33 is a table illustrating configurations and evaluation results of Example 2-77 to Example 2-101 of the ink for forming a positive hole transport layer.

FIG. 34 is a table illustrating configurations and evaluation results of Comparative Example 2-175 to Comparative Example 2-190 and Example 2-102 to Example 2-110 of the ink for forming a positive hole transport layer.

FIG. 35 is a table illustrating configurations and evaluation results of Comparative Example 2-191 to Comparative Example 2-211 and Example 2-111 to Example 2-114 of the ink for forming a positive hole transport layer.

FIG. 36 is a table illustrating configurations and evaluation results of Comparative Example 2-212 to Comparative Example 2-236 of the ink for forming a positive hole transport layer.

FIG. 37 is a table illustrating configurations and evaluation results of Comparative Example 2-237 to Comparative Example 2-261 of the ink for forming a positive hole transport layer.

FIG. 38 is a table illustrating configurations and evaluation results of Comparative Example 2-262 to Comparative Example 2-286 of the ink for forming a positive hole transport layer.

FIG. 39 is a table illustrating configurations and evaluation results of Comparative Example 3-1 to Comparative Example 3-25 of an ink for forming a light emitting layer.

FIG. 40 is a table illustrating configurations and evaluation results of Comparative Example 3-26 to Comparative Example 3-50 of the ink for forming a light emitting layer.

FIG. 41 is a table illustrating configurations and evaluation results of Comparative Example 3-51 to Comparative Example 3-75 of the ink for forming a light emitting layer.

FIG. 42 is a table illustrating configurations and evaluation results of Comparative Example 3-76 to Comparative Example 3-100 of the ink for forming a light emitting layer.

FIG. 43 is a table illustrating configurations and evaluation results of Example 3-1 to Example 3-25 of the ink for forming a light emitting layer.

FIG. 44 is a table illustrating configurations and evaluation results of Comparative Example 3-101 to Comparative Example 3-116 and Example 3-26 to Example 3-34 of the ink for forming a light emitting layer.

FIG. 45 is a table illustrating configurations and evaluation results of Comparative Example 3-117 to Comparative Example 3-137 and Example 3-35 to Example 3-38 of the ink for forming a light emitting layer.

FIG. 46 is a table illustrating configurations and evaluation results of Example 3-39 to Example 3-63 of the ink for forming a light emitting layer.

FIG. 47 is a table illustrating configurations and evaluation results of Comparative Example 3-138 to Comparative Example 3-153 and Example 3-64 to Example 3-72 of the ink for forming a light emitting layer.

FIG. 48 is a table illustrating configurations and evaluation results of Comparative Example 3-154 to Comparative Example 3-174 and Example 3-73 to Example 3-76 of the ink for forming a light emitting layer.

FIG. 49 is a table illustrating configurations and evaluation results of Example 3-77 to Example 3-101 of the ink for forming a light emitting layer.

FIG. 50 is a table illustrating configurations and evaluation results of Comparative Example 3-175 to Comparative Example 3-190 and Example 3-102 to Example 3-110 of the ink for forming a light emitting layer.

FIG. 51 is a table illustrating configurations and evaluation results of Comparative Example 3-191 to Comparative Example 3-211 and Example 3-111 to Example 3-114 of the ink for forming a light emitting layer.

FIG. 52 is a table illustrating configurations and evaluation results of Comparative Example 3-212 to Comparative Example 3-236 of the ink for forming a light emitting layer.

FIG. 53 is a table illustrating configurations and evaluation results of Comparative Example 3-237 to Comparative Example 3-261 of the ink for forming a light emitting layer.

FIG. 54 is a table illustrating configurations and evaluation results of Comparative Example 3-262 to Comparative Example 3-286 of the ink for forming a light emitting layer.

DESCRIPTION OF EXEMPLARY EMBODIMENTS

Hereinafter, embodiments according to the invention will be described with reference to the accompanying drawings. In addition, the used reference drawings are shown to be appropriately enlarged or reduced, so as to recognize a described portion.

First Embodiment

Light Emitting Device

Figure 1:
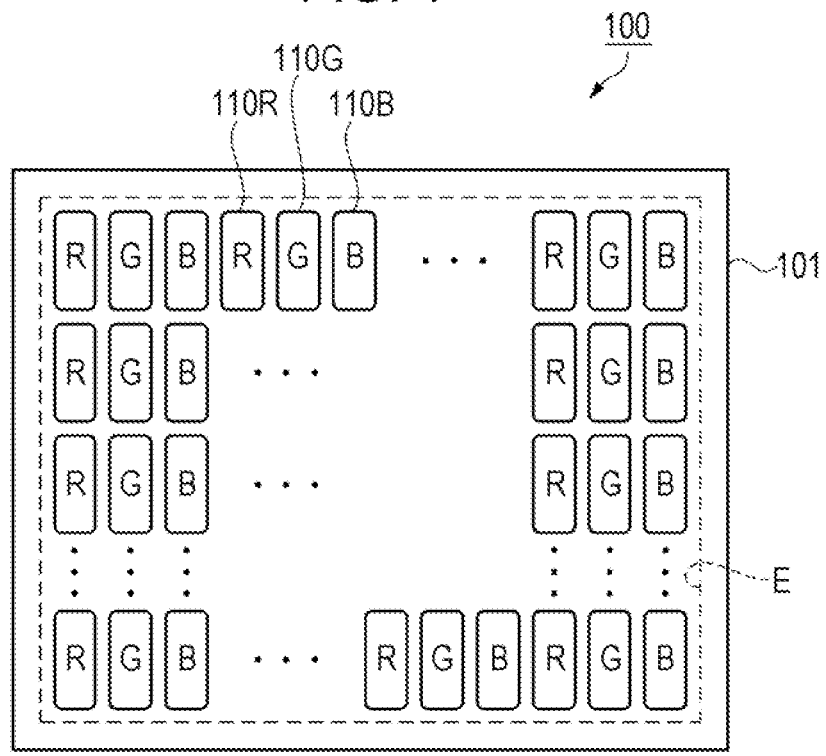
FIG. 1 is a plan view illustrating a configuration of a light emitting device schematically.
Figure 2:
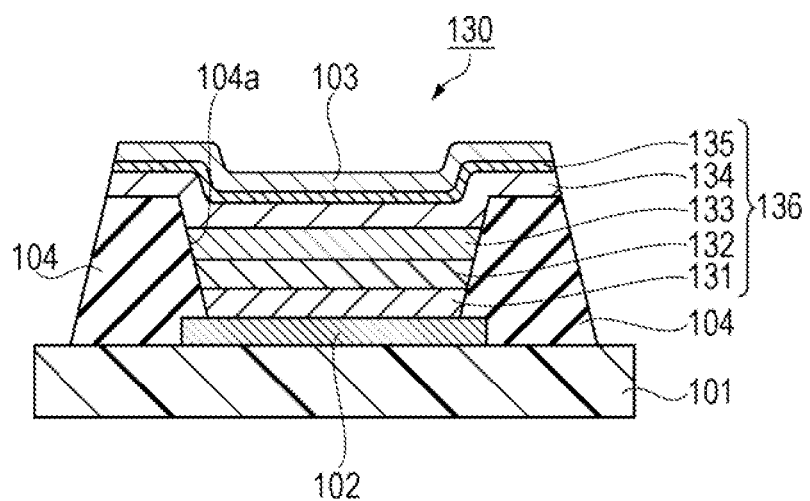
FIG. 2 is a schematic cross-sectional view illustrating a configuration of an organic EL element.

First, a light emitting device of a first embodiment will be described with reference to FIG. 1 and FIG. 2. FIG. 1 is a plan view illustrating a configuration of the light emitting device schematically. FIG. 2 is a schematic cross-sectional view illustrating a configuration of an organic EL element.

As shown in FIG. 1, a light emitting device 100 of the first embodiment includes an element substrate 101 in which sub pixels 110R, 110G and 110B that obtain light emitting (light emitting color) of red (R), green (C), and blue (B) are arranged. Each of the sub pixels 110R, 110G and 110B has an approximate rectangular shape and is arranged in a matrix form in a display area E of the element substrate 101. Hereinafter, a sub pixel 110 is also referred to the generic term of the sub pixels 110R, 110G and 110B. The sub pixel 110 of the same light emitting color is arranged in the vertical direction (column direction or longitudinal direction of the sub pixel 110) in FIG. 1, and the sub pixel 110 of different light emitting color is arranged in the order of R, G, and B in the horizontal direction (row direction or lateral direction of the sub pixel 110) in FIG. 1. That is, the sub pixels 110R, 110G and 110B of different light emitting colors are arranged by a so-called stripe method. Moreover, the shape of the sub pixels 110R, 110G and 110B, which is seen from above, and the arrangement of the sub pixels 110R, 110G and 110B are not limited thereto. Further, the approximate rectangular shape includes a square, a rectangle, a quadrangle of which the corners are round, and a quadrangle of which two faced side portions are arcuate.

In the sub pixel 110R, an organic electroluminescence (EL) element is installed as a light emitting element which obtains the light emitting of red (R). Similarly, the organic EL element is installed as a light emitting element which obtains the light emitting of green (G) in the sub pixel 110G and the organic EL element is installed as a light emitting element which obtains the light emitting of blue (B) in the sub pixel 110B.

In the light emitting device 100 as described above, three sub pixels 110R, 110G and 110B which obtain different light emitting colors become one display pixel unit and the sub pixels 110R, 110G and 110B are electrically controlled, respectively. Therefore, it is possible to be a full color display.

In each of the sub pixels 110R, 110G and the 110B, an organic EL element 130 is installed as a light emitting element, as shown in FIG. 2.

The organic EL element 130 includes a pixel electrode 102 that is placed on the element substrate 101, a counter electrode 103, and a functional layer 136 that is placed between the pixel electrode 102 and the counter electrode 103. The functional layer 136 includes a light emitting layer 133 which is formed of an organic thin film.

The pixel electrode 102 functions as an anode and is placed in each of the sub pixels 110R, 110G and 110B. The pixel electrode 102 is formed using a transparent conductive film such as indium tin oxide (ITO).

The functional layer 136 is formed by laminating in the order of the pixel electrode 102, a positive hole injection layer 131, a positive hole transport layer 132, the light emitting layer 133, an electron transport layer 134 and an electron injection layer 135. In particular, the formation material of the light emitting layer 133 is selected depending on the light emitting color, but the light emitting layer 133 is referred to as a generic term regardless of the light emitting color here. In addition, the configuration of the functional layer 136 is not limited thereto, and the functional layer 136 may include an intermediate layer for controlling a movement of a carrier (positive hole or electron) other than these layers.

The counter electrode 103 functions as a cathode and is placed as a common electrode which is common to the sub pixels 110R, 110G and the 110B. For example, the counter electrode 103 is formed using an alloy of aluminum (Al), silver (Ag) and magnesium (Mg).

The positive hole as a carrier is injected into the light emitting layer 133 from the pixel electrode 102 as an anode, and the electron as a carrier is injected into the light emitting layer 133 from the counter electrode 103 as a cathode. The injected positive hole and the injected electron are formed an exciton (the exciton means the state where the positive hole and the electron are bound to each other by Coulomb's force) in the light emitting layer 133. When the exciton disappears (when the positive hole and the electron are recombined), part of the energy is released in the form of fluorescence or phosphorescence.

In the light emitting device 100 according to the embodiment, since the pixel electrode 102 has light transmission properties when the counter electrode 103 is formed so as to have light reflection properties, it is possible to select the light emitting of the light emitting layer 133 from the element substrate 101. The light emitting method described above is called a bottom emission method. Furthermore, if the counter electrode 103 is formed so as to have light transmission properties by placing a reflective layer between the element substrate 101 and the pixel electrode 102, a top emission method in which the light emitting of the light emitting layer 133 is selected from the counter electrode 103 can be used. In the first embodiment, the case that the bottom emission method is used in the light emitting device 100 will be described.

The light emitting device 100 according to the embodiment of the invention includes a diaphragm 104 as an insulating layer so as to constitute an opening 104a, which overlaps an outer edge of the pixel electrode 102, on the pixel electrode 102 in the organic EL element 130 which is placed in each of the sub pixels 110R, 110G and 110B.

According to the embodiment, in the functional layer 136 of the organic EL element 130, at least one layer of the positive hole injection layer 131, the positive hole transport layer 132 and the light emitting layer 133 which forms the functional layer 136 is formed by a liquid phase process. The liquid phase process is a method that forms each of layers by applying a solution (hereinafter, referred to an ink for forming a functional layer) including a third component and a solvent which form each of layers to the opening portion 104a, which is a film formation area surrounded by the diaphragm 104, and drying the solution. In order to form each layer having a desired film thickness, it is necessary to apply a predetermined amount of the ink for forming a functional layer to the opening 104a accurately. In the first embodiment, an ink jet method (referred to a droplet discharging method) is adopted as a liquid phase process.

Discharging Apparatus

Figure 3:
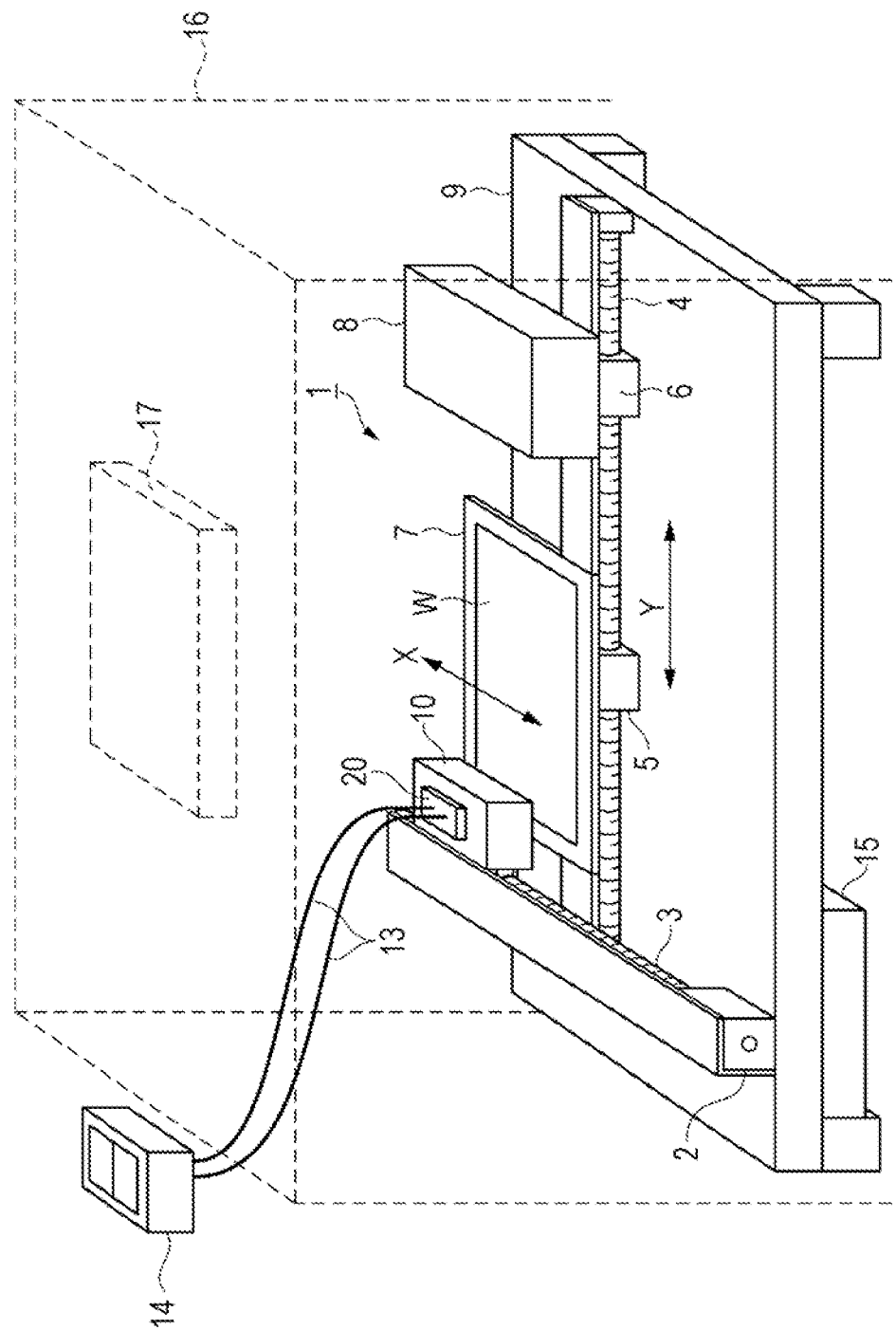
FIG. 3 is a schematic diagram illustrating a configuration of a discharging apparatus.
Figure 4:
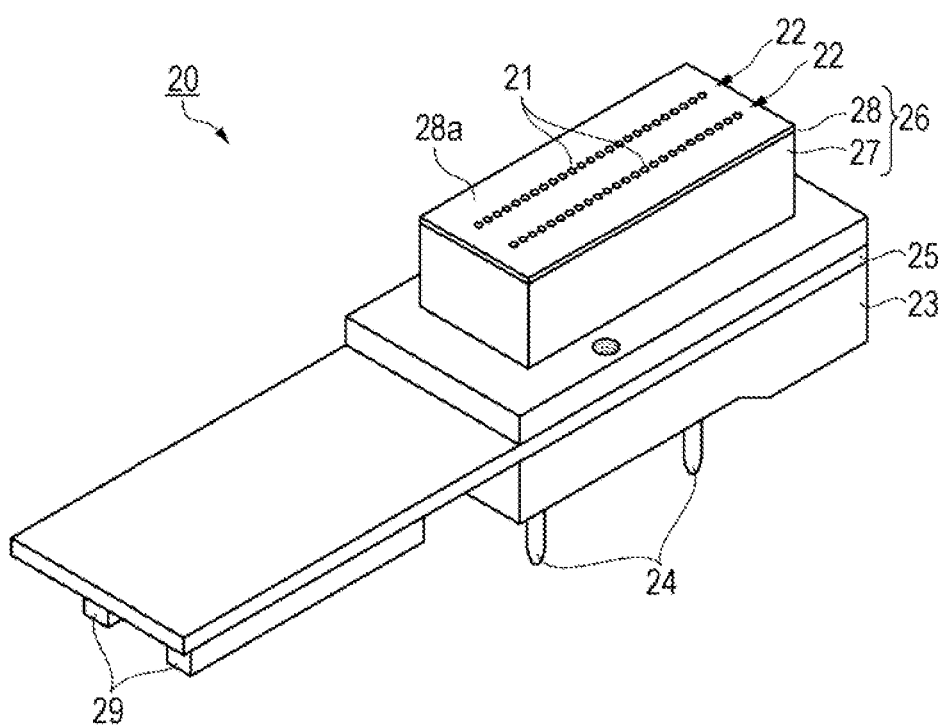
FIG. 4 is a perspective view illustrating a configuration of a discharging head schematically.
Figure 5A:
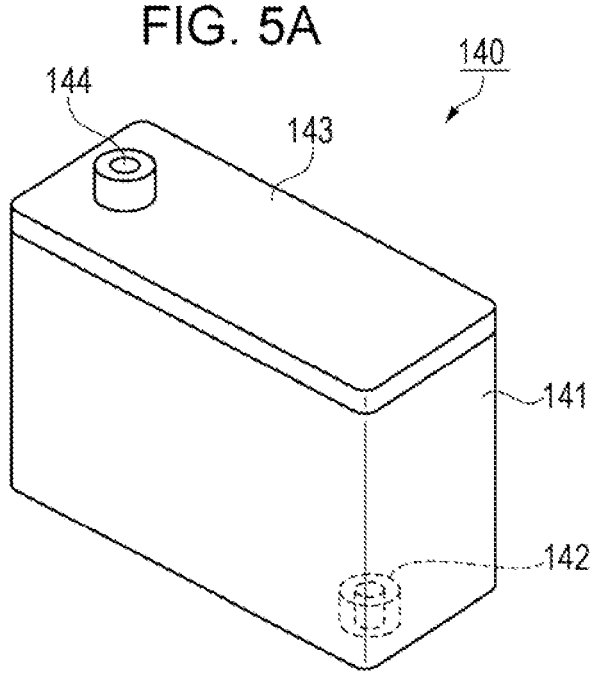
FIG. 5A is a perspective view illustrating an ink cartridge as an ink container and FIG. 5B is a cross-sectional view illustrating a structure of the ink cartridge.
Figure 5B:
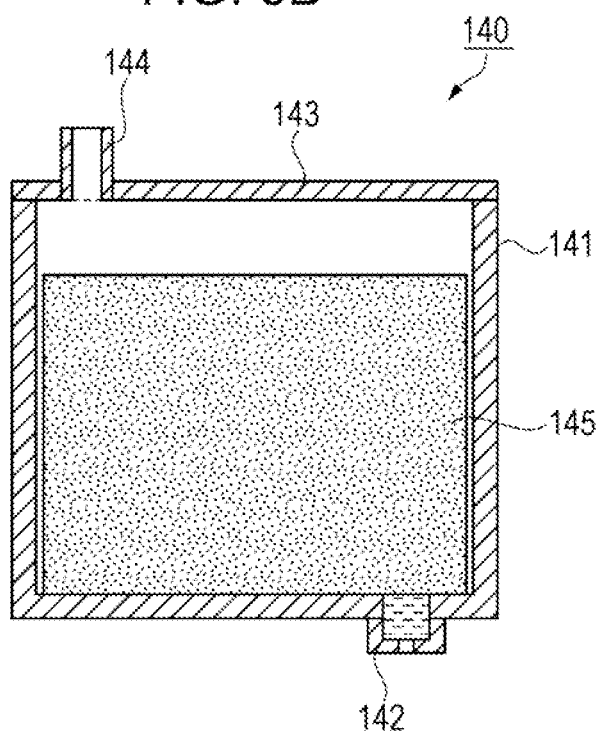

Next, a discharging apparatus adopting the ink jet method (droplet discharging method) according to the embodiment will be described with reference to FIG. 3 to FIG. 5B. FIG. 3 is a schematic diagram illustrating a configuration of the discharging apparatus, FIG. 4 is a perspective view illustrating a configuration of a discharging head schematically, FIG. 5A is a perspective view illustrating an ink cartridge as an ink container and FIG. 5B is a cross-sectional view illustrating a structure of the ink cartridge.

As shown in FIG. 3, a discharging apparatus 1 of the first embodiment includes a stage 7 of a mounting table on which a substrate W as a workpiece is mounted and a discharging head 20 which discharges the ink for forming a functional layer as a droplet to the mounted substrate W. In addition, the discharging apparatus 1 includes an ink supplier that supplies the ink for forming a functional layer to the discharging head 20 through a pipe 13 from an ink tank 14 of storing the ink for forming a functional layer.

The discharging apparatus 1 includes an X direction guide shaft 3 for driving a head holder 10 on which the discharging head 20 mounted in the sub scanning direction (X direction) and an X axis drive motor 2 for rotating the X direction guide shaft 3. Further, the discharging apparatus 1 includes a Y direction guide shaft 4 for driving the stage 7 in the main scanning direction (Y direction) and a Y axis drive motor 5 for rotating the Y direction guide shaft 4. In addition, the discharging apparatus 1 includes a base 9 in which the X direction guide shaft 3 and the Y direction guide shaft 4 are placed in an upper side of the base 9, and a control unit 15 is placed in a lower side of the base 9. The X direction guide shaft 3, the X axis drive motor 2, the Y direction guide shaft 4 and the Y axis drive motor 5 are transporters which relatively move the main scanning direction (Y direction) and the sub scanning direction (X direction) so as to face the stage 7 with respect to the discharging head 20.

In addition, the discharging apparatus 1 includes a cleaning mechanism 8 for cleaning the discharging head 20 (recovery treatment). Further, the cleaning mechanism 8 also includes a Y axis drive motor 6.

The discharging head 20 is mounted on the head holder 10 in which a nozzle surface 28a faces the stage 7 (see FIG. 4). The discharging head 20 can vary an amount (hereinafter, referred to discharge amount) of the droplet of the discharged ink for forming a functional layer depending on a discharge voltage supplied from the control unit 15.

The X axis drive motor 2 is not limited to this, but, for example, the X axis drive motor 2 is a stepping motor, when a drive pulse signal of the X direction is supplied from the control unit 15, the X axis drive motor 2 causes the X direction guide shaft 3 to rotate and the discharging head 20, which is engaged with the X direction guide shaft 3, to move in the X direction.

Similarly, the Y axis drive motors 5 and 6 is not limited to thereto, but, for example, the Y axis drive motors 5 and 6 are stepping motors, when a drive pulse signal of the Y direction is supplied from the control unit 15, the Y axis drive motors 5 and 6 cause the Y axis direction guide shaft 4 to rotate and the stage 7 and the cleaning mechanism 8 to move in the Y direction.

The cleaning mechanism 8 moves to a position facing the discharging head 20 and carries out a capping for absorbing the unnecessary ink for forming a functional layer which adheres to the nozzle surface 28a of the discharging head 20 (see FIG. 4), a wiping for wiping off the nozzle surface 28a on which the ink for forming a functional layer or the like is attached, a preliminary discharge for performing the discharge of the ink for forming a functional layer from all nozzles 21 of the discharging head 20 or a recovery treatment for receiving and discharging the unnecessary ink for forming a functional layer.

The whole of the discharging apparatus 1 is covered by a clean booth 16. Furthermore, the cleaned air is fed from a HEPA unit 17 which is placed in a ceiling of the clean booth 16 in the clean booth 16. Therefore, when the ink for forming a functional layer is discharged to a surface of the substrate W, cleanliness is secured not to adhere foreign materials to the surface of the substrate W.

As shown in FIG. 4, the discharging head 20 is a so-called two-set type of head, and includes an introduction section 23 of the ink for forming a functional layer having two-set connection needles 24, a head substrate 25 which is laminated on the introduction section 23, and a head body 26 which is placed on the head substrate 25, in which a head inward flow path of the ink for forming a functional layer is formed inside of the head body 26. The connection needle 24 is connected to the ink tank 14 described above through the pipe 13, and the ink for forming a functional layer is supplied to the head inward flow path through the connection needle 24. In the head substrate 25, two-set connectors 29 to be connected to a head drive unit through a flexible flat cable is placed.

The head body 26 includes a pressurization portion 27 having a cavity with an actuator such as a piezoelectric element and a nozzle plate 28 in which two nozzle rows 22 and 22 are formed to be parallel with each other on the nozzle surface 28a.

Two nozzle rows 22 and 22 are placed on the nozzle plate 28 in a state of shifting with each other in which each of plural (180) nozzles 21 is arranged at substantially same interval in two nozzle rows 22 and 22. A nozzle pitch according to the embodiment is approximately 140 Mm. Therefore, the 360 nozzles 21 are arranged at the nozzle pitch of 70 μm approximately, when the nozzles are seen from a direction orthogonal to the nozzle array 22.

In the discharging head 20, a driving waveform such as an electric signal is applied to the actuator from a head driving portion and the volume fluctuation of the cavity of the pressurization portion 27 occurs. Accordingly, the ink for forming a functional layer which is filled in the cavity is pressurized by a pump action, and it is possible to discharge the ink for forming a functional layer as a droplet from the nozzle 21 which is communicated with the cavity.

Ink Container

Next, an ink container according to the embodiment will be described with reference to FIG. 3 to FIG. 5B. FIG. 5A is a perspective view illustrating an ink cartridge as an ink container and FIG. 5B is a cross-sectional view illustrating a structure of the ink cartridge.

As shown in FIG. 3, the ink tank 14 is an example of the ink container according to the embodiment and is filled with the ink for forming a functional layer. The ink tank 14 is placed in the higher side than the discharging head 20 and the ink for forming a functional layer in the ink tank 14 is supplied to the discharging head 20 by the own weight thereof. As not shown in FIG. 3, for example, a valve, which controls the supply of the ink for forming a functional layer in the pipe 13 connecting the ink tank 14 and the discharging head 20, is placed. Two of the pipes 13 are used corresponding to the connection needle 24 of the discharging head 20.

As shown in FIG. 3, the ink container may be as the ink tank 14 having a large capacity. However, it is not desirable to store the ink for forming a functional layer in the ink tank 14 for a long time. For example, due to the storage of the long time, the solvent is reduced in the ink for forming a functional layer, the third component is deposited, a viscosity thereof changes or the droplet cannot be stably discharged from the nozzle 21 of the discharging head 20. Therefore, in order to supply a relatively new ink for forming a functional layer depending on the actual used amount, the ink cartridge 140 may be adopted as an ink container, as shown in FIG. 5A and FIG. 5B.

As shown in FIG. 5A, the ink cartridge 140 includes a box-shaped cartridge body 141 which stores an ink for forming a functional layer, and a lid portion 143 which is sealed to the cartridge body 141. An ink outlet port 142 is placed in a bottom side of the cartridge body 141. A communication port 144 is placed in the lid portion 143. The communication port 144 communicates with the inside of the cartridge body 141 which is sealed by the lid portion 143.

As shown in FIG. 58B, a porous member 145 is stored in the inside of the cartridge body 141, the ink for forming a functional layer is absorbed by the porous member 145, and the porous member 145 is filled in the cartridge body 141. For example, an urethane foam may be used as the porous member 145.

The ink cartridge 140 is filled with the ink for forming a functional layer, then the ink outlet port 142 and the communication port 144 are sealed by a sealing member such as a film. When the ink cartridge 140 is used, the sealing member is peeled off, thus the pipe 13 is connected to the ink outlet port 142. The Communication port 144 may be open to the air, or an inert gas may be introduced from the communication port 144.

In the discharging apparatus 1 according the first embodiment, the one discharging head 20 is attached to the head holder 10, but the configuration of the discharging apparatus 1 is not limited thereto. Plural discharging head 20 may be attached to the head holder 10, corresponding to the type of the ink for forming a functional layer. Accordingly, the plural ink tanks 14 or the plural ink cartridges 140 may be used, corresponds to the type of the ink for forming a functional layer. Moreover, in the configuration of attaching the ink cartridge 140, which is smaller than the ink tank 14, to the head holder 10, the length of the pipe 13 may be reduced, and the discharging head 20 and the ink cartridge 140 may be moved at the same time.

Method for Manufacturing Organic EL Element

Next, a method for manufacturing an organic EL element according to the embodiment will be described with reference to FIG. 6A to FIG. 6D. FIGS. 6A to 6D are cross-sectional views illustrating the method for manufacturing an organic EL element schematically.

The method for manufacturing an organic EL element according to the embodiment includes a process for forming a diaphragm (step S1), a process for performing a surface treatment (step S2), a process for forming a functional layer (step S3), and a process for forming a counter electrode (step S4). The process for forming a functional layer (step S3) means the method for forming a functional layer according to the embodiment.

Figure 6A:
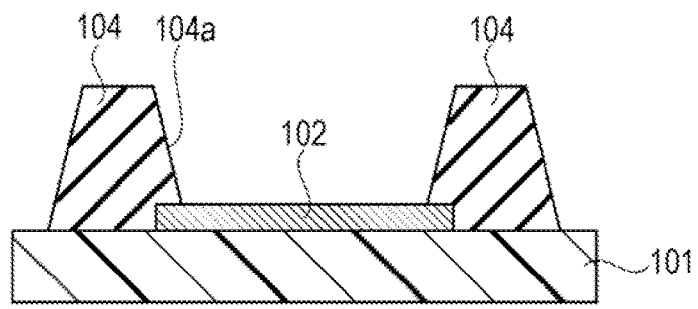
FIGS. 6A to 6D are cross-sectional views illustrating a method for manufacturing an organic EL element schematically.

As shown in FIG. 6A, in the process for forming a diaphragm of step S1, for example, a photosensitive resin material, which includes a liquid repellent material with the liquid repellency with respect to ink for forming a functional layer, is applied by the thickness of 1 m to 2 µm to the element substrate 101 in which the pixel electrode 102 is formed and is dried, thus a photosensitive resin layer is formed. As an application method, a transfer method or a slit coating method may be used. A fluorine compound and a siloxane compound may be used as a liquid repellent material. As a photosensitive resin material, a negative multifunctional acrylic resin may be used. The resultant photosensitive resin layer is exposed and developed using an exposure mask corresponding to the shape of the sub pixel 110, and the photosensitive resin layer forms the diaphragm 104 which overlaps the outer edge of the pixel electrode 102 and forms the opening 104a on the pixel electrode 102. The process proceeds to step S2.

In the process for performing a surface treatment of step S2, the surface treatment is performed on the element substrate 101 in which the diaphragm 104 is formed. The process for performing a surface treatment is performed in order to remove unnecessary substances such as residues of the diaphragm surface of the pixel electrode 102. Accordingly, the ink for forming a functional layer including the material for forming a functional layer evenly wetting-spreads in the opening 104a which is surrounded by the diaphragm 134, when the functional layer is formed by the ink jet method (droplet discharging method) in the next process. As the surface treatment method according to the embodiment, an excimer UV (ultraviolet ray) treatment is performed. The surface treatment is not limited to the excimer UV treatment, but it is sufficient that the surface of the pixel electrode 102 is clean. For example, washing process and drying process with the solvent may be performed. Moreover, if the surface of the pixel electrode 102 is clean, it is not necessary to carry out the process for performing a surface treatment. The process proceeds to step S3.

Figure 6B:
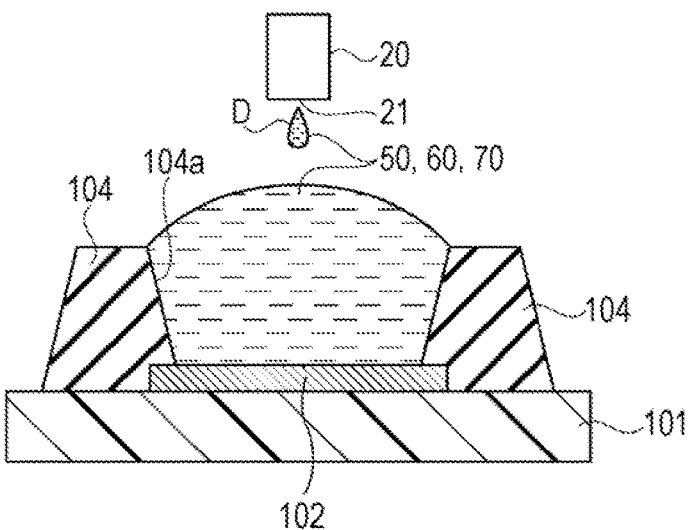
Figure 6C:
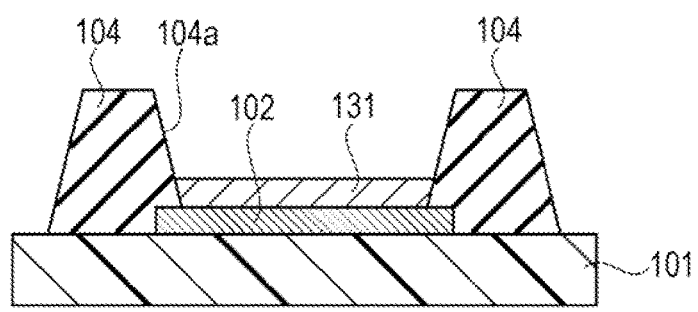
Figure 6D:
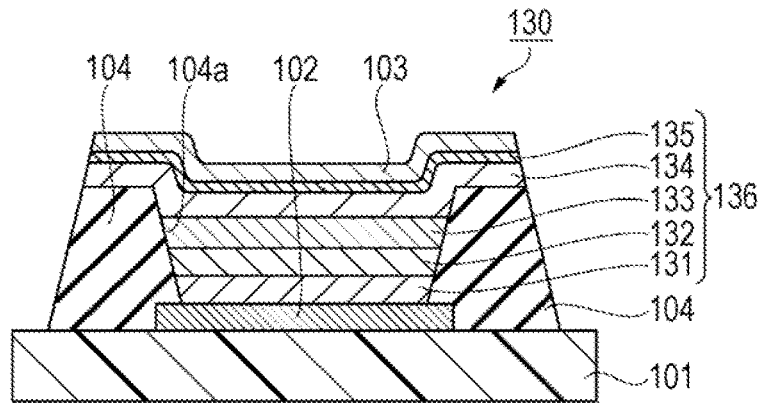

As shown in FIG. 6B, in the process for forming a functional layer of step S3, first, the ink 50 for forming a positive hole injection layer, which is the ink for forming a functional layer including the positive hole injection material, is applied to the opening portion 104a. In the application method of the ink 50 for forming a positive hole injection layer, the discharging apparatus 1 is used as described above. The ink 50 for forming a positive hole injection layer is discharged as a droplet D from the nozzle 21 of the discharging head 20. The discharged amount of the droplet D which is discharged from the discharging head 20 can be controlled by a pl unit, and the droplet D of the number which is obtained by dividing a predetermined amount of the droplet D by the discharged amount thereof, is discharged to the opening 104a. The discharged ink 50 for forming a positive hole injection layer is risen in the opening 104a by an interfacial tension with the diaphragm 104, but does not overflow. In other words, a concentration of the positive hole injection material (third component) in the ink 50 for forming a positive hole injection layer is adjusted in advance so as to obtain the predetermined amount that does not overflow from the opening 104a. The process proceeds to the drying process.

In the drying process, for example, the element substrate 101 to which the ink 50 for forming a positive hole injection layer is applied is left under the reduced pressure, thus the drying is achieved by evaporating the solvent from the ink 50 for forming a positive hole injection layer (reduced pressure drying). Then, the positive hole injection layer 131 is formed by the solidification of the applied ink 50 for forming a positive hole injection layer which is obtained by performing a heat treatment under an air pressure. The positive hole injection layer 131 is not limited to the selection of the positive hole injection material described later or to the relationship with the other layers in the functional layer 136 and is formed by the thickness of 20 nm to 40 nm approximately.

Next, as the ink for forming a functional layer including the positive hole transport material, the ink 60 for forming a positive hole transport layer forms the positive hole transport layer 132. The Method for forming the positive hole transport layer 132 is also performed using the discharging apparatus 1 described above, in the same manner of the positive hole injection layer 131. In other words, a predetermined amount of the ink 60 for forming a positive hole transport layer is discharged to the opening 104a as the droplet D from the nozzle 21 of the discharging head 20. Moreover, the ink 60 for forming a positive hole transport layer which is applied to the opening 104a is dried under the reduced pressure. Then, the positive hole transport layer 132 is formed by performing a heat treatment under the environment of an inert gas such as nitrogen. The positive hole transport layer 132 is not limited to the selection of the positive hole transport material described later or to the relationship with the other layers in the functional layer 136 and is formed by the thickness of 20 nm approximately.

Then, as the ink for forming a functional layer including the material for forming a light emitting layer, the ink 70 for forming a light emitting layer forms the light emitting layer 133. The Method for forming the light emitting layer 133 is also performed using the discharging apparatus 1 described above, in the same manner of the positive hole injection layer 131. In other words, a predetermined amount of the ink 70 for forming a light emitting layer is discharged to the opening 104a as the droplet D from the nozzle 21 of the discharging head 20. Moreover, the ink 70 for forming a light emitting layer which is applied to the opening 104a is dried under the reduced pressure. Then, the light emitting layer 133 is formed by performing a heat treatment under the environment of an inert gas such as nitrogen. The light emitting layer 133 is not limited to the selection of the material for forming a light emitting layer described later or to the relationship with the other layers in the functional layer 136 and is formed by the thickness of 30 nm to 80 nm approximately.

Next, the electron transport layer 134 is formed by covering the light emitting layer 133. The electron transport material which forms the electron transport layer 134 is not particularly limited, but an example of the electron transport material is BALq, 1,3,5-tri(5-(4-tert-buthylphenyl)-1,3,4-oxadiazole) (OXD-1), bathocuproine (BCP), (2-(4-biphenyl)-5-(4-tert-buthylphenyl)-1,2,4-oxadiazole (PBD), 3-(4-biphenyl)-5-(4-tert-buthylphenyl)-1,2,4-triazole (TAZ), 4,4'-bis(1,1-bis-diphenylethenyl)biphenyl (DPVBi), 2,5-bis (1-naphthyl)-1,3,4-oxadiazole (BND), 4,4'-bis(1,1-bis(4-methylphenyl)ethenyl)biphenyl (DTVBi), or 2,5-bis(4-biphenylyl)-1,3,4-oxadiazole (BBD), in order to form the electron transport layer using a vapor phase process such as a vacuum evaporation method.

In addition, an example of the electron transport material is tris-(8-quinolinolato)aluminum (Alq3), oxadiazole derivative, oxazole derivative, phenanthroline derivative, anthraquinodimethane derivative, benzoquinone derivative, naphthoquinone derivative, anthraquinone derivative, tetracyanoanthraquinodimethane derivate, fluorene derivative, diphenyldicyanoethylene derivative, diphenoquinone derivative, or hydroxyquinoline derivative. It is possible to use one kind thereof or a combination of two or more thereof.

The electron transport layer 134 is not limited to the selection of the electron transport material described above or to the relationship with the other layers in the functional layer 136, and is formed by the thickness of 20 nm to 40 nm approximately. Accordingly, it is possible to suitably transport the electron, which is injected from the counter electrode 103 as a cathode, into the light emitting layer 133.

Next, the electron injection layer 135 is formed by covering the transport layer 134. The electron injection material for forming the electron injection layer 135 is not particularly limited, but for example, an alkaline metal compound or alkaline earth metal compound may be used, so as to form the electron injection layer 135 using a vapor phase process such as a vacuum evaporation method.

An example of the alkaline metal compound is an alkaline metal salt such as LiF, $Li_2CO_3$, LiCl, NaF, NaCO, NaCl, CsF, $Cs_2CO_3$ and CsCl. In addition, an example of the alkaline earth metal compound is an alkaline earth metal salt such as $CaF_2$, $CaCO_3$, $SrF_2$, $SrCO_3$, $BaF_2$, and $BaCO_3$. It is possible to use one kind of the alkaline metal compound and the alkaline earth metal compound or a combination of two or more thereof.

The film thickness of the electron injection layer 135 is not particularly limited, but the film thickness of the electron injection layer 135 is preferably from 0.01 nm to 10 nm, and more preferably from 0.1 nm to 5 nm. Accordingly, it is possible to efficiently inject the electron into the electron transport layer 134 from the counter electrode 103 as a cathode.

Next, the counter electrode 103 is formed by covering the electron injection layer 135 as a cathode. It is preferable to use the material having a small work function as a configuration material of the counter electrode 103. In order to form the counter electrode 103 using the vapor phase process such as a vacuum evaporation method, Li, Mg, Ca, Sr, La, Ce, Er, Eu, Sc, Y, Yb, Ag, Cu, Al, Cs, Rb, Au or an alloy thereof is used as the configuration material of the counter electrode 103. It is possible to use one kind thereof or a combination of two or more thereof (for example, a laminated body having plural layers).

In particular, in the case that the light emitting device 100 of the bottom emission type is used according to the embodiment, optical transparency is not required to the counter electrode 103. Therefore, it is preferable to use a metal such as Al, Ag, AlAg and AlNd or an alloy thereof. It is possible to improve the electron injection efficiency and the stability of the counter electrode 103 by using the metal or the alloy described above as the configuration material of the counter electrode 103.

The film thickness of the counter electrode 103 is not particularly limited, but the film thickness of the counter electrode 103 is preferably from 50 nm to 1000 nm, and more preferably from 100 nm to 500 nm.

When the light emitting device 100 of the top emission type is used, it is preferable to use a metal such as MgAg, MgAl, MgAu and AlAg or an alloy thereof as the configuration material of the counter electrode 103. It is possible to maintain the optical transparency of the counter electrode 103 and to improve the electron injection efficiency and the stability of the counter electrode 103 by using the metal or the alloy described above.

The film thickness of the counter electrode 103 in the top emission type is not particularly limited, but the film thickness of the counter electrode 103 is preferably from 1 nm to 50 nm, and more preferably from 5 nm to 20 nm.

In the organic EL element 130 which is formed described above, when moisture and oxygen are entered from the outside or the light emitting function is inhibited in the functional layer 136, a dark spot where the light emitting luminance partially decreases or light emitting does not occur is generated. Furthermore, there is a possibility that a light emitting lifetime is shortened. Therefore, it is preferable to cover the organic EL element 130 by a sealing layer (not shown) in order to protect the organic EL element 130 against entering of moisture or oxygen. As the sealing layer, for example, it is possible to use an inorganic insulating material such as silicon oxynitride (SiON) having low permeability with respect to oxygen and moisture. Moreover, a sealing substrate such as a transparent glass and an opaque ceramic adheres to the element substrate 101 in which the organic EL element 130 is formed, by an adhesive, thus the organic EL element 130 may be sealed.

In the method for manufacturing the organic EL element 130 described above, the positive hole injection layer 131, the positive hole transport layer 132 and the light emitting layer 133 are formed by the liquid phase process (ink jet method) in the functional layer 136, but one layer of the layers may be formed by the liquid phase process (ink jet method) and the other layers may be formed using the vapor phase process such as a vacuum evaporation method.

The configuration material (third component), which is capable of forming the positive hole injection layer 131, the positive hole transport layer 132 and the light emitting layer 133 using the liquid phase process or the vapor phase process, will be described.

Positive Hole Injection Material

An example of the positive hole injection material which is suitable for forming the positive hole injection layer 131 described above, may be copper phthalocyanine (CuPc), 1,1-bis[4-(di-p-tolyl)aminophenyl]cyclohexane (TAPC), N,N'-diphenyl-N,N'-bis-(3-methylphenyl)-1,1'biphenyl-4,4'-diamine (TPD), N,N'-diphenyl-N,N'-bis-(1-naphthyl)-1,1'biphenyl-4,4'-diamine (α-NPD), 4,4',4''-tris(N-3-methylphenylamino)triphenylamine (m-MTDATA), 4,4',4''-tris(N,N-(2-naphthyl)phenylamino)triphenylamine (2-TNATA), 4,4',4''-tri(N-carbazole group)triphenylamine (TCTA), 1,3,5-tris-(N, N-bis-(4-methoxy-phenyl)aminophenyl)benzene (TDAPB), tris-(4-carbazol-9-yl-phenyl)-amine (Supiro TAD), DPPD (DTP), tris-p-tolylamine (HTM1), 1,1-bis[(di-4-tolylamino)phenyl]cyclohexane (HTM2), 1,3,5-tris(4-pyridyl)-2,4,6-triazine (TPT1) or triphenylamine tetramer (TPTE).

Positive Hole Transport Material

As the positive hole transport material which is suitable for forming the positive hole transport layer 132, it is possible to use the positive hole injection material described above. In addition to the positive hole injection material described above, an example of the positive hole transport material may be a high molecular organic material including amine compound such as triphenylamine-based polymer which is represented by poly(9,9 dioctyl-fluorene-co-N-(4-buthylphenyl)-diphenylamine) (TFB), or polysilane compound such as polyfluorene derivative (PF), poly-paraphenyl vinylene derivatives (PPV), polyparaphenylene derivative (PPP), polyvinyl carbazole (PVK), polythiophene derivative and poly methyl phenyl silane (PMPS).

The light emitting layer 133 includes a dopant (guest material) which is a light emitting material, and a host material. The host material has the function of generating the exciton which recombines the positive hole and the electron, and moving (Foerster movement or Dexter movement) the energy of the exciton to the light emitting material. When the light emitting is guided due to the energy that is obtained by recombining the positive hole and the electron, the light emitting material may be any one of the fluorescence and the phosphorescence depending on the light emitting material. Hereinafter, preferable examples of the host material and the dopant (guest material) will be described.

Host Material

An example of a host material that is common to the light emitting layer 133 for obtaining each light emitting of red, green and blue, is 4,4'-bis(9-dicarbazolyl)-2,2'-biphenyl (CBP), bis-(2-methyl-8-quinolinolate)-4-(phenylphenolate) aluminium) (BAlq), N,N-dicarbazolyl-3,5-benzene (CBP derivative) (mCp), 4,4'-bis(9-carbazolyl)-2,2'-dimethyl-biphenyl) (CDBP), N,N'-Dicarbazolyl-1,4-dimethene-benzene) (DCB), 2,7-bis(diphenylphosphine oxide)-9,9-dimethylfluorene) (P06), 3,5-bis(9-carbazolyl)tetraphenylsilane (SimCP), W-bis(triphenylsilyl)benzene (UGH3) ox 1,3,5-tris[4-(diphenylamino)phenyL]benzene (TDAPB).

Red Light Emitting Material (Dopant)

An example of a dopant (guest material) for obtaining red light emitting is an iridium complex such as bis(2-phenyl-benxothiozolato-N,C2')iridium(III) (acetylacetonate) (Bt2Ir(acac)) and bis(2-2'-benzothienyl)-pyridinato-N,C3) iridium (acetylacetonate) (Btp2Ir(acac)), or a platinum complex such as 2,3,7,8,12,13,17,18-Octaethyl-21H,23H-porphine, platinum(II) (PtOEP). It is possible to obtain red phosphorescence by adding the dopant to the host material described above.

An example of the high molecular red light emitting material (dopant) which is used in the liquid phase process is a fluorene derivative which is obtained by the following formula (1) or (2).

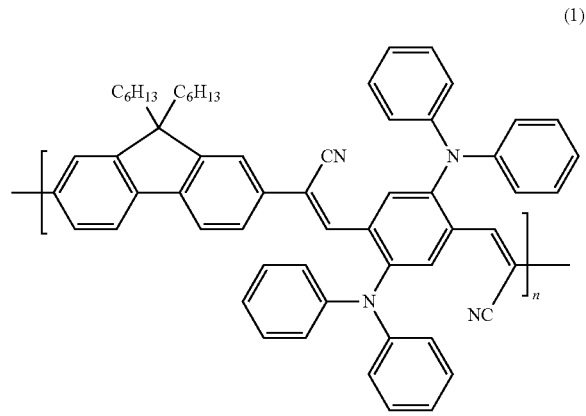

(1)

-continued (2)

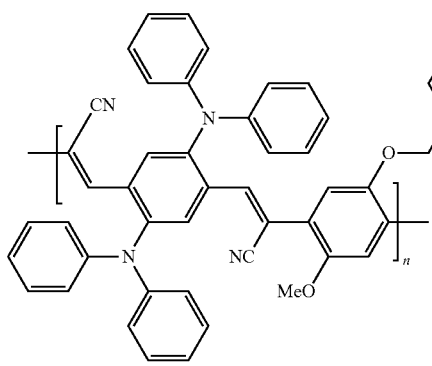

Green Light Emitting Material (Dopant)

An example of a dopant (guest material) for obtaining green light emitting is an iridium complex such as Fac-tris (2-phenypyridine) iridium (Ir(ppy)3) and bis(2-phenyl-pyridinato-N,C2) iridium(acetylacetone) (Ppy2Ir(acac)). It is possible to obtain green phosphorescence by adding the dopant to the host material described above.

An example of the high molecular green light emitting material (dopant) which is used in the liquid phase process is a phenylene vinylene derivative which is obtained by the following formula (3) or (4).

(3)

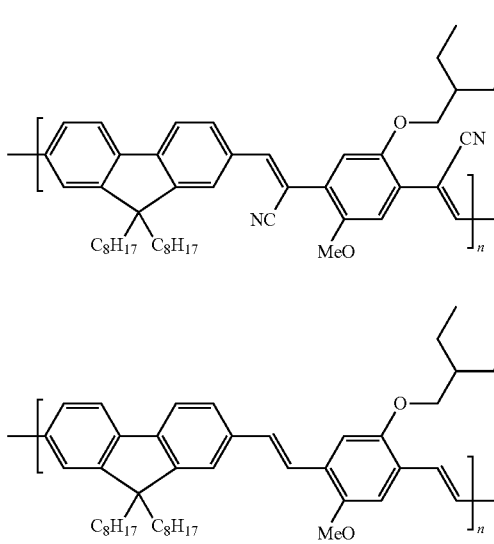

(4)

Blue Light Emitting Material (Dopant)

An example of a dopant (guest material) for obtaining blue light emitting is an iridium complex such as iridium-bis(4,6difluorophenyl-pyridinato-N,C. 2.)-Picolinate (FIrpic), iridium-tris(1-phenyl-3-methylbenzimidazolin-2-ylidene-C,C(2)' (Ir(pmb)3), ((iridium(iii)bis(4,6-difluoro-phenylpyridinato) (5-(pyridin-2-yl)-tetrazolate (FIrN4), and (iridium(III)bis(4,6-difluorophenylpyridinato) (5-(pyridine-2-yl)-1,2,4-triazo-late (Firtaz). It is possible to obtain blue phosphorescence by adding the dopant to the host material described above.

In particular, in the case of the blue light emitting layer 133 which is formed by a gas phase process such as reduced pressure evaporation, it is preferable that the guest material thereof is a styryl derivative of the following formula (5), (6), (7) or (8). It is preferable that the host material thereof is an anthracene derivative of the following formula (9), (10) or (11).

(5)

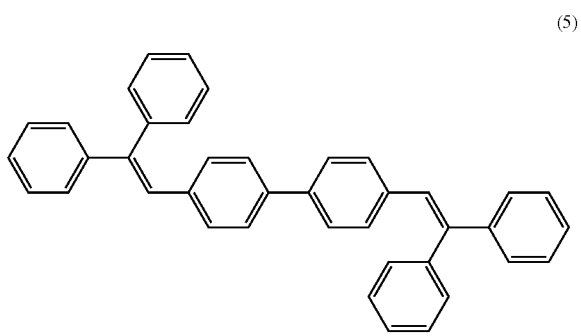

(6)

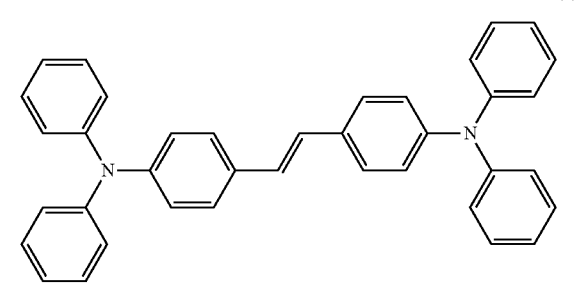

(7)

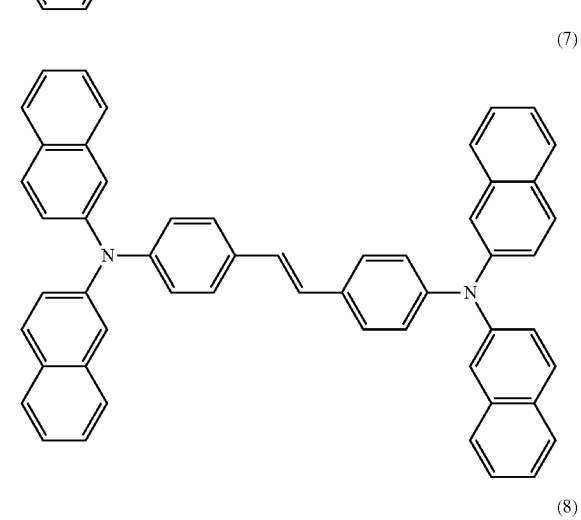

(8)

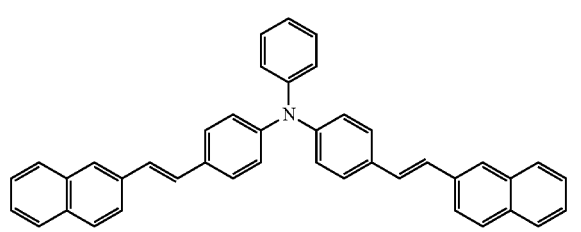

-continued

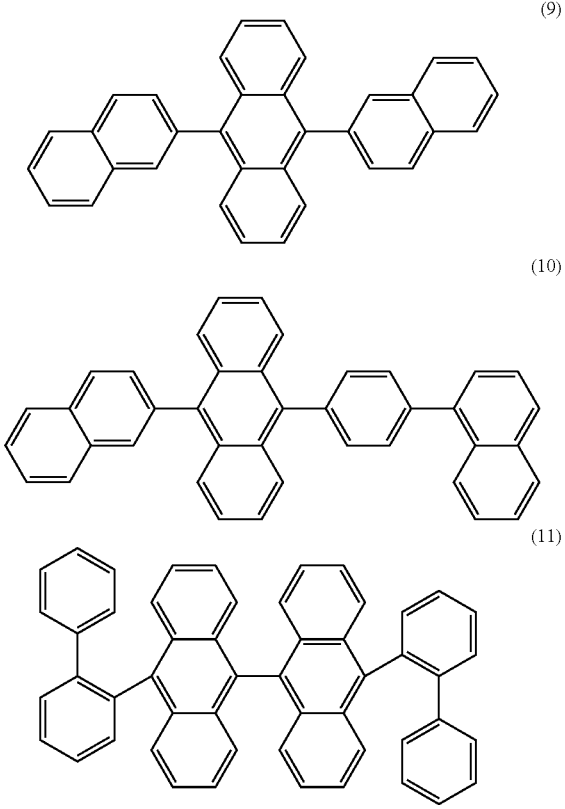

(9)

(10)

(11)

An example of the light emitting material (dopant) for obtaining fluorescence is (8-hydroxyquinolinate)aluminun (Alq3), rubrene, perylene, 9.10-diphenyl anthracene, tetraphenyl butadiene, nile red, coumarin 6, or quinacridone.

An example of the light emitting material (dopant) for obtaining blue fluorescence is a styrylbenzene derivative of 1,4-bis(2-methylstyryl)benzene, 1,4-(3-methylstyryl)benzene, 1,4-bis-(2-methylstyryl)benzene, 1,4-(3-methylstyryl)benzene, 1,4-bis(4-methylstyryl)benzene, distyrylbenzene, 1,4-bis(2-ethylstyryl)benzene, 1,4-bis(3-ethylstyryl)benzene, and 1,4-bis(2-methylstyryl)-2-methylbenzene.

Ink for Forming Functional Layer

Next, a configuration of the ink for forming a functional layer of the first embodiment will be described. In the functional layer 136 of the organic EL element 130 according to the embodiment, when each of the positive hole injection layer 131, the positive hole transport layer 132 and the light emitting layer 133 is formed by the liquid phase process (ink jet method), the basic configuration of the ink which is suitable for the formation of the functional layers is as follows.

The ink for forming a functional layer includes a first component that contains at least one kind of aromatic solvent of which a boiling point is higher than or equal to 250° C. and lower than or equal to 350° C., a second component that contains at least one kind of aliphatic solvent of which a boiling point is higher than or equal to 200° C., and a third component for forming a functional layer. It is preferable that a solubility of the third component in the first component is higher than the solubility of the third component in the second component, a mixing ratio of the second component is more than or equal to 30 vol % and less than or equal to 70 vol %, the boiling point of the first component is higher than the boiling point of the second component, and a difference between the boiling point of the first component and the boiling point of the second component is higher than or equal to 30° C.

An example of the aromatic solvent of which the boiling point is higher than or equal to 250° C. and lower than or equal to 350° C. as a first component is 1,3-Dipropoxybenzene (boiling point 251° C.), 4-Methoxybenzaldehyde-Dimethyl-Acetal (boiling point 253° C.), 4,4'-Difluorodiphenylmethane (boiling point 258° C.), Diphenylether (boiling point 259° C.), 1,2-Dimethoxy-4-(1-propenyl)benzene (boiling point 264° C.), 2-Phenoxytoluene (MDPE) (boiling point 265° C.), Diphenylmethane (boiling point 265° C.), 2-Phenylpyridine (boiling point 268° C.), Dimethyl benzyl ether (DMDPE) (boiling point 270° C.), 3-Phenoxytoluene (boiling point 272° C.), 3-Phenylpyridine (boiling point 272° C.), 2-Phenylanisole (boiling point 274° C.), 2-Phenoxytetrahydrofuran (boiling point 275° C.), 1-Propyl-4-Phenyl benzene (NPBP) (boiling point 280° C.), 2-Phenoxy 1,4-dimethyl benzene (25DMDPE) (boiling point 280° C.), Ethyl-2-Napht-Ether (boiling point 282° C.), 2,2,5-Trimethyl-diphenyl ether (225TMDPE) (boiling point 290° C.), Dibenzyl-Ether (boiling point 295° C.), 2,3,5-Tri-methyl diphenyl ether (235TMDPE) (boiling point 295° C.), N-Methyldiphenylamine (boiling point 297° C.), 4-Isopropylbiphenyl (boiling point 298° C.), α, α-Dichlorodiphenylmethane (boiling point 305° C.), 4-(3-phenylpropyl)pyridine (boiling point 322° C.), Benzyl-Benzoate (boiling point 324° C.), or 1,1-Bis(3,4-Dimethylphenyl)ethane (boiling point 333° C.).

In particular, in the consideration of a good solubility of the host material and the dopant (guest material), with respect to the third component for forming the functional layer such as the positive hole injection material, the positive hole transport material and the light emitting layer 133, and the variation of the boiling point, it is preferable that the third component is selected from the material having the boiling point of 270° C. or higher such as 3-Phenoxytoluene (boiling point 272° C.), Dibenzyl-Ether (boiling point 295° C.) and 1,1-Bis(3,4-Dimethylphenyl)ethane (boiling point 333° C.).

An example of the aliphatic solvent of which the boiling point is higher than or equal to 200° C. as a second component is an aliphatic ether of Diethyleneglycol-butylmethyl-ether (boiling point 212° C.), Triprophyleneglycol-dimethyl-ether (boiling point 215° C.), Triethyleneglycol-dimethyl-ether (boiling point 216° C.), Diethyleneglycol-monobuthyl-ether (boiling point 230° C.), Diethyleneglycol-dibuthyl-ether (boiling point 256° C.), Diethyleneglycol-butylmethyl-ether (boiling point 261° C.) or Tetraethyleneglycol-dimethyl-ethyl-ether (boiling point 275° C.).

In particular, it is preferable that the second component is selected from Diethyleneglycol-butylmethyl-ether (boiling point 212° C.) and Diethyleneglycol-dibuthyl-ether of (boiling point 256° C.) in order to realize less than or equal to 32 mN/m of the surface tension, since the surface tension of the second component is smaller than the first component.

If the mixed solvent of the first component of the aromatic solvent and the second component of the aliphatic solvent is used, since the boiling point of the mixed solvent is higher to or equal to 200° C., even after filling the discharging head 20, the clogging of the nozzle 21 hardly occurs due to the drying of the ink for forming a functional layer and the deposition of the third component in the nozzle 21 in the normal working environment. In other words, it is possible to secure the stable discharge properties in discharging head 20. That is, it is possible to achieve the ink for forming a functional layer which is suitable for the ink jet method (droplet discharging method).

Furthermore, to achieve the desired light emitting properties in the organic EL element 130, the functional layer, where the film formation defect (the film is not formed in the necessary area) does not occur and the unevenness or the irregularity is small with respect to a predetermined film thickness, is required. The functional layer containing the third component is formed by removing the solvent component from the ink, which is discharged as the droplet D from the nozzle 21 the discharging head 20 to the opening 104*a* of the diaphragm 104 as described above, using the method such as a reduced pressure drying. Therefore, it is important that the discharge ink for forming a functional layer evenly wetting-spreads to the opening 104*a*. The ink for forming a functional layer according to the embodiment includes the first component of aromatic solvent in which the solubility of the third component in the first component is excellent and the second component of aliphatic solvent of which the surface tension is smaller than the surface tension of the first component, thus the wetting spread easily occurs in the opening 104*a*.

Moreover, the drying unevenness of the solvent component easily occurs between the central portion and the outer circumference portion on the substrate W, since the drying of the solvent component proceeds in the natural drying before a forced drying process such as a reduced pressure drying and a heated-air drying is carried out. Therefore, in the plural openings 104*a* on the substrate W, the film thickness unevenness may occur or the film thickness irregularity may increase in the functional layer which is formed by the forced drying process. Since the ink for forming a functional layer according to the embodiment includes the mixed solution including the first component and the second component of which the boiling point is higher than or equal to 200° C., the natural drying hardly proceeds and the film thickness unevenness or the film thickness irregularity can be reduced after the forced drying process.

Hereinafter, evaluation results of the ink for forming a functional layer according to the embodiment will be described with reference to Comparative Examples and Examples thereof.

In the evaluation of the ink for forming a functional layer, when the ink for forming a functional layer is discharged to the opening 104*a* and the 60000 organic EL element is formed, the evaluations are carried out using the evaluation substrate that forms the diaphragm 104 which constitutes the 60000 opening 104*a*. Three evaluation properties of the wetting spread defect, the film thickness unevenness of the functional layer and the light emitting failure of the dark spot or the bright spot are evaluated.

In addition, the wetting spread defects include not only the application unevenness defect due to the wetting spread of the ink for forming a functional layer which is discharged into the opening 104*a* but also the defect of the third component such as the aggregation and the deposition due to the drying unevenness of the solvent component in the drying process of the ink for forming a functional layer.

In the evaluations of the wetting spread defect and the light emitting failure among the three evaluation properties, an incidence thereof lower than 1% is "A", the incidence of 1% to 5% is "B", the incidence of 5% or more and lower than 10% is "C" and the incidence of 10% or more is "D".

In the evaluations of the film thickness unevenness of the functional layer, less than or equal to ±1% of an average film thickness is "A", less than or equal to ±2.5% of the average film thickness is "B", less than or equal to ±5% of the average film thickness is "C" and the average film thickness exceeding ±5% is "D" in the central portion of the opening 104*a*.

Ink for Forming Positive Hole Injection Layer

FIG. 7 is a table illustrating configurations and evaluation results of Comparative Example 1-1 to Comparative Example 1-25 of an ink for forming a positive hole injection layer. FIG. 8 is a table illustrating configurations and evaluation results of Comparative Example 1-26 to Comparative Example 1-50 of the ink for forming a positive hole injection layer. FIG. 9 is a table illustrating configurations and evaluation results of Comparative Example 1-51 to Comparative Example 1-75 of the ink for forming a positive hole injection layer. FIG. 10 is a table illustrating configurations and evaluation results of Comparative Example 1-76 to Comparative Example 1-100 of the ink for forming a positive hole injection layer. FIG. 11 is a table illustrating configurations and evaluation results of Example 1-1 to Example 1-25 of the ink for forming a positive hole injection layer. FIG. 12 is a table illustrating configurations and evaluation results of Comparative Example 1-101 to Comparative Example 1-116 and Example 1-26 to Example 1-34 of the ink for forming a positive hole injection layer. FIG. 13 is a table illustrating configurations and evaluation results of Comparative Example 1-117 to Comparative Example 1-137 and Example 1-35 to Example 1-38 of the ink for forming a positive hole injection layer. FIG. 14 is a table illustrating configurations and evaluation results of Example 1-39 to Example 1-63 of the ink for forming a positive hole injection layer. FIG. 15 is a table illustrating configurations and evaluation results of Comparative Example 1-138 to Comparative Example 1-153 and Example 1-64 to Example 1-72 of the ink for forming a positive hole injection layer. FIG. 16 is a table illustrating configurations and evaluation results of Comparative Example 1-154 to Comparative Example 1-174 and Example 1-73 to Example 1-76 of the ink for forming a positive hole injection layer. FIG. 17 is a table illustrating configurations and evaluation results of Example 1-77 to Example 1-101 of the ink for forming a positive hole injection layer. FIG. 18 is a table illustrating configurations and evaluation results of Comparative Example 1-175 to Comparative Example 1-190 and Example 1-102 to Example 1-110 of the ink for forming a positive hole injection layer. FIG. 19 is a table illustrating configurations and evaluation results of Comparative Example 1-191 to Comparative Example 1-211 and Example 1-111 to Example 1-114 of the ink for forming a positive hole injection layer. FIG. 20 is a table illustrating configurations and evaluation results of Comparative Example 1-212 to Comparative Example 1-236 of the ink for forming a positive hole injection layer. FIG. 21 is a table illustrating configurations and evaluation results of Comparative Example 1-237 to Comparative Example 1-261 of the ink for forming a positive hole injection layer. FIG. 22 is a table illustrating configurations and evaluation results of Comparative Example 1-262 to Comparative Example 1-286 of the ink for forming a positive hole injection layer. In the tables of FIG. 7 to FIG. 22, 25 kinds of aromatic solvents of the first component are used as an example, and it is recited that the boiling points thereof increase from top to bottom of the table.

The positive hole injection layer 131 is formed using the ink for forming a positive hole injection layer of Comparative Example 1-1 to Comparative Example 1-286 and Example 1-1 to Example 1-114. Then, by the evaporation method, the positive hole transport layer 132, the light emitting layer 133, the electron transport layer 134, and the electron injection layer 135 are formed. The material configuration of the layer is as follows, respectively. The positive hole transport layer is α-NPD, the host material of the light emitting layer 133 is CBP, dopant is Ir(ppy)3, the electron transport layer 134 is BAlq, and the electron injection layer 135 is LiF.

Comparative Example 1-1 to Comparative Example 1-25

As shown in FIG. 7, in Comparative Example 1-1 to Comparative Example 1-25, the ink for forming a positive hole injection layer includes 4,4',4"-Tris(N-3-methylphenyl-N-phenylamino)-triphnylamine[m-MTDATA] of 0.3 wt % as a positive hole injection material (third component) with respect to each of 25 kinds of aromatic solvents as a first component described above. The m-MTDATA is the π-conjugated low molecular organic compound. The aliphatic solvent of the second component is not included. In other words, in the volume fraction of each component occupying in the mixed solvent of the first component and the second component, the volume fraction of the first component is 100 vol % and the volume fraction of the second component is 0 vol %. The first component is a good solvent which is capable of dissolving the positive hole injection material of 0.1 wt % or more as a third component.

In the ink for forming a positive hole injection layer of Comparative Example 1-1 to Comparative Example 1-25, the wetting spread properties thereof are poor with respect to the pixel electrode 102 which is formed of ITO in the opening portion 104a, and it is observed that the pixel electrode 102 is partially exposed by aggregating the positive hole injection material as a third component in the drying process of the first component. All of the evaluations of the wetting spread defect are "D". Further, the evaluations of the film thickness unevenness are poor in the positive hole injection layer 131, such that the evaluations of the film thickness unevenness are "C". The evaluations of the frequent light emitting failure are also "D".

Comparative Example 1-26 to Comparative Example 1-50

As shown in FIG. 8, the ink for forming a positive hole injection layer of Comparative Example 1-26 to Comparative Example 1-50 includes m-MTDATA as a positive hole injection material (third component) of 0.3 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 80 vol % and the volume fraction of the second component is 20 vol % in the mixed solvent of the first component and the second component. The boiling point of the first component is higher than the boiling point of the second component, and the difference Δbp between the boiling points thereof is from 39° C. in minimum to 121° C. in maximum. The solubility of the third component in the second component is lower than the solubility of the third component in the first component. Further, the surface tension of the second component is smaller than the surface tension of the first component.

When Diethyleneglycol-butylmethyl-ether having the boiling point of 212° C. is included as 20 vol % as a second component, in the same manner of Comparative Example 1-1 to Comparative Example 1-25, it is observed that the pixel electrode 102 is partially exposed by aggregating the positive hole injection material as a third component. All of the evaluations of the wetting spread defect are "D". Further, the evaluations of the film thickness unevenness of the positive hole injection layer 131 are "C", and the evaluations of the light emitting failure are also "D".

Comparative Example 1-51 to Comparative Example 1-75

As shown in FIG. 9, the ink for forming a positive hole injection layer of Comparative Example 1-51 to Comparative Example 1-75 includes m-MTDATA as a positive hole injection material (third component) of 0.3 wt % in which each of 25 kinds of aromatic solvents as a first component described above is combined to Diethyleneglycol-dibuthyl-ether having the boiling point of 256° C. among seven kinds of aliphatic solvents as a second component described above. The volume fraction of the first component is 80 vol %, and the volume fraction of the second component is 20 vol % in the mixed solvent of the first component and the second component. The boiling point of the first component is not necessarily higher than the boiling point of the second component, and the difference Δbp between the boiling points thereof is from −5° C. to 77° C. The solubility of the third component in the second component is lower than the solubility of the third component in the first component. Further, the surface tension of the second component is smaller than the surface tension of the first component.

When the volume fraction of Diethyleneglycol-dibuthyl-ether having the boiling point of 256° C. as a second component is 20 vol %, in the same manner of Comparative Example 1-1 to Comparative Example 1-25, it is observed that the pixel electrode 102 is partially exposed by aggregating the positive hole injection material as a third component. All of the evaluations of the wetting spread defect are "D". Further, the evaluations of the film thickness unevenness are "C" with respect to the positive hole injection layer 131, and the evaluations of the light emitting failure are also "D".

Comparative Example 1-76 to Comparative Example 1-100

As shown in FIG. 10, the ink for forming a positive hole injection layer of Comparative Example 1-76 to Comparative Example 1-100 includes m-MTDATA as a positive hole injection material (third component) of 0.3 wt % in which each of 25 kinds of aromatic solvents as a first component described above is combined to Tetraethyleneglycol-dimethyl-ether having the boiling point of 275° C. among seven kinds of aliphatic solvents as a second component described above. The volume fraction of the first component in the mixed solvent of the first component and the second component is 80 vol %, and the volume fraction of the second component is 20 vol %. The boiling point of the first component is not necessarily higher than the boiling point of the second component, and the difference Δbp between the boiling points thereof is from −24° C. to 58° C. The solubility of the third component in the second component is lower than the solubility of the third component in the first component. Further, the surface tension of the second component is smaller than the surface tension of the first component.

When the volume fraction of Tetraethyleneglycol-dimethyl-ether having the boiling point of 275° C. as a second component is 20 vol %, in the same manner of Comparative Example 1-1 to Comparative Example 1-25, it is observed that the pixel electrode 102 is partially exposed by aggregating the positive hole injection material as a third component. All of the evaluations of the wetting spread defect are "D". Further, the evaluations of the film thickness unevenness of the positive hole injection layer 131 are "C", and the evaluations of the light emitting failure are also "D".

Example 1-1 to Example 1-25

As shown in FIG. 11, the ink for forming a positive hole injection layer of Example 1-1 to Example 1-25 includes m-MTDATA as a positive hole injection material (third component) of 0.3 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 70 vol % and the volume fraction of the second component is 30 vol % in the mixed solvent of the first component and the second component. In other words, the volume fraction of the second component in Example 1-1 to Example 1-25 increases by 10 vol % with respect to Comparative Example 1-26 to Comparative Example 1-50.

In the ink for forming a positive hole injection layer of Example 1-1 to Example 1-25, since the second component of which the surface tension is smaller than the surface tension of the first component is included as 30 volt, the wetting spread properties with respect to the opening 104a is are improved than Comparative Example 1-26 to Comparative Example 1-50. Moreover, since the second component of which the boiling point is lower than the boiling of the first component is included as 30 vol %, in comparison with Comparative Example 1-26 to Comparative Example 1-50, the drying is proceeded while the state of the wetting spread of the ink for forming a positive hole injection layer on the opening 104a is maintained in the reduced pressure drying of the solvent, and the film thickness unevenness of the positive hole injection layer 131 is also reduced. Therefore, the occurrence of the light emitting failure in the dark spot or the bright spot due to the wetting spread defect or the film thickness unevenness is suppressed. In Example 1-1 to Example 1-21 in which the difference Δbp between the boiling point of the first component and the boiling point of the second component is from 39° C. to 86° C., all of three evaluation items are "B". In Example 1-22 to Example 1-25 in which the difference Δbp between the boiling points thereof is from 98° C. to 121° C., the evaluations of the film thickness unevenness and the evaluations of the light emitting failure are "C". It is considered that to evaporate the aromatic solvent of the first component evenly is difficult when the boiling point of the first component exceeds 300° C., but it is considered that the evaluation can be improved by the reconsideration of the drying conditions (for example, the reduced pressure level in the reduced pressure drying).

Comparative Example 1-101 to Comparative Example 1-116

As shown in FIG. 12, the ink for forming a positive hole injection layer of Comparative Example 1-101 to Comparative Example 1-116 includes m-MT DATA as a positive hole injection material (third component) of 0.3 wt % in which each of 16 kinds of the first components in order from the lowest boiling point among 25 kinds of aromatic solvents described above is combined to Diethyleneglycol-dibuthyl-ether having the boiling point of 256° C. among seven kinds of aliphatic solvents as a second component described above. The volume fraction of the first component in the mixed solvent of the first component and the second component is 70 vol %, and the volume fraction of the second component is 30 vol %. The boiling point of the first component is not necessarily higher than the boiling point of the second component, and the difference Δbp between the boiling points thereof is from −5° C. to 26° C. The solubility of the third component in the second component is lower than the solubility of the third component in the first component. Further, the surface tension of the second component is smaller than the surface tension of the first component.

In Comparative Example 1-101 to Comparative Example 1-116 in which the difference Δbp between the boiling point of the first component and the boiling point of the second component is from −5° C. to 260, the wetting spread defect is observed even when the ink for forming a positive hole injection layer includes 30 vol % of the second component of which the surface tension is smaller than the surface tension of the first component. The increase of the difference Δbp between the boiling points thereof causes the degree of the light emitting failure with the wetting spread defect and the film thickness unevenness to be improved, but the evaluations thereof are from "C" to "D".

Example 1-26 to Example 1-34

As shown in FIG. 12, the ink for forming a positive hole injection layer of Example 1-26 to Example 1-34 includes m-MTDATA as a positive hole injection material (third component) of 0.3 wt % in which each of nine kinds of the first components in order from the highest boiling point among 25 kinds of aromatic solvents described above is combined to Diethyleneglycol-dibuthyl-ether having the boiling point of 256° C. among seven kinds of aliphatic solvents as a second component described above. The volume fraction of the first component in the mixed solvent of the first component and the second component is 70 vol %, and the volume fraction of the second component is 30 vol %. In other words, the volume fraction of the second component in Example 1-26 to Example 1-34 increases by 10 vol % with respect to Comparative Example 1-67 to Comparative Example 1-75.

In the ink for forming a positive hole injection layer of Example 1-26 to Example 1-34 in which the difference Δbp between the boiling point of the first component and the boiling point of the second component is from 34° C. to 77° C., since the second component of which the surface tension is smaller than the surface tension of the first component is included as 30 vol %, the wetting spread properties with respect to the opening 104a is improved than Comparative Example 1-67 to Comparative Example 1-75 and Comparative Example 1-101 to Comparative Example 1-116. All of the wetting spread defect evaluations are "B". In the evaluations of the film thickness unevenness, Example 1-26 to Example 1-29 are "A", Example 1-30 is "B", and Example 1-31 to Example 1-34 in which the boiling point of the first component exceeds 300° C. are "C" as expected. In the evaluations of the light emitting failure, Example 1-26 to Example 1-30 are "B", and Example 1-31 to Example 1-34 in which the boiling point of the first component exceeds 300° C. are "C" as expected. The evaluations of which the film thickness unevenness and the light emitting failure are "C" can be improved by the reconsideration of the reduced pressure drying conditions described above.

Comparative Example 1-117 to Comparative Example 1-137

As shown in FIG. 13, the ink for forming a positive hole injection layer of Comparative Example 1-117 to Comparative Example 1-137 includes m-MTDATA as a positive hole injection material (third component) of 0.3 wt % in which each of 21 kinds of the first components in order from the lowest boiling point among 25 kinds of aromatic solvents described above is combined to Tetraethyleneglycol-dimethyl-ether having the boiling point of 275° C. among seven kinds of aliphatic solvents as a second component described above. The volume fraction of the first component in the mixed solvent of the first component and the second component is 70 vol %, and the volume fraction of the second component is 30 vol %. The boiling point of the first component is not necessarily higher than the boiling point of the second component, and the difference Δbp between the boiling points thereof is from −24° C. to 23° C. The solubility of the third component in the second component is lower than the solubility of the third component in the first component. Further, the surface tension of the second component is smaller than the surface tension of the first component.

In Comparative Example 1-117 to Comparative Example 1-137 in which the difference Δbp between the boiling point of the first component and the boiling point of the second component is from −24° C. to 23° C., the wetting spread defect is observed even when the ink for forming a positive hole injection layer includes 30 vol % of the second component of which the surface tension is smaller than the surface tension of the first component. The increase of the difference Δbp between the boiling points thereof causes the degrees of the light emitting failure with the wetting spread defect and the film thickness unevenness to be improved, but the evaluations thereof are from "C" to "D".

Example 1-35 to Example 1-38

As shown in FIG. 13, the ink for forming a positive hole injection layer of Example 1-35 to Example 1-38 includes m-MTDATA as a positive hole injection material (third component) of 0.3 wt % in which each of four kinds of the first components in order from the highest boiling point among 25 kinds of aromatic solvents described above is combined to Tetraethyleneglycol-dimethyl-ether having the boiling point of 275° C. among seven kinds of aliphatic solvents as a second component described above. The volume fraction of the first component in the mixed solvent of the first component and the second component is 70 vol %, and the volume fraction of the second component is 30 vol %. In other words, the volume fraction of the second component in Example 1-35 to Example 1-38 increases by 10 vol % with respect to Comparative Example 1-97 to Comparative Example 1-100.

In the ink for forming a positive hole injection layer of Example 1-35 to Example 1-38 in which the difference Δbp between the boiling point of the first component and the boiling point of the second component is from 30° C. to 58° C., since the second component of which the surface tension is smaller than the surface tension of the first component is included as 30 vol %, the wetting spread properties with respect to the opening 104a is improved than Comparative Example 1-97 to Comparative Example 1-100 and Comparative Example 1-117 to Comparative Example 1-137. All of the wetting spread defect evaluations are "B". In the film thickness unevenness and the light emitting failure, the evaluations thereof are "C" described above, since it is difficult to perform the drying of the mixed solvent evenly when the boiling point of the first component exceeds 300° C. However, the evaluations thereof can be improved by the reconsideration of the reduced pressure drying conditions.

Example 1-39 to Example 1-63

As shown in FIG. 14, the ink for forming a positive hole injection layer of Example 1-39 to Example 1-63 includes m-MTDATA as a positive hole injection material of the third component of 0.3 wt % in which each of 25 kinds of aromatic solvents as a first component described above is combined by the volume fraction of 50% to Diethyleneglycol-butylmethyl-ether having the boiling point of 212° C. among seven kinds of aliphatic solvents as a second component described above. That is, the volume fraction of the second component increases by 30 vol % with respect to Comparative Example 1-26 to Comparative Example 1-50. In other words, the volume fraction of the second component increases by 20 vol % in comparison with the volume fraction of the second component in Example 1-1 to Example 1-25.

In the ink for forming a positive hole injection layer of Example 1-39 to Example 1-63, since the second component of which the surface tension is smaller than the surface tension of the first component is included as 50 volt, the wetting spread properties with respect to the opening 104a is improved than Comparative Example 1-26 to Comparative Example 1-50. Moreover, since the second component of which the boiling point is lower than the boiling of the first component is included as 50 vol %, in comparison with Comparative Example 1-26 to Comparative Example 1-50, the drying is proceeded while the state of the wetting spread of the ink for forming a positive hole injection layer on the opening 104a is maintained in the reduced pressure drying, and the film thickness unevenness of the positive hole injection layer 131 is also reduced. Furthermore, in comparison with Example 1-22 to Example 1-25, the occurrence of the film thickness unevenness is difficult even when the boiling point of the first component exceeds 300° C. Accordingly, the occurrence of the light emitting failure in the dark spot or the bright spot due to the wetting spread defect or the film thickness unevenness is suppressed. Therefore, all of three evaluation properties are "B".

Comparative Example 1-138 to Comparative Example 1-153

As shown in FIG. 15, the ink for forming a positive hole injection layer of Comparative Example 1-138 to Comparative Example 1-153 includes m-MTDATA as a positive hole injection material of the third component of 0.3 wt % in which each of 16 kinds of the first components in order from the lowest boiling point among 25 kinds of aromatic solvents described above is combined by the volume fraction of 50% to Diethyleneglycol-dibuthyl-ether having the boiling point of 256° C. among seven kinds of aliphatic solvents as a second component described above.

In Comparative Example 1-138 to Comparative Example 1-153 in which the difference Δbp between the boiling point of the first component and the boiling point of the second component is from −5° C. to 26°, the wetting spread defect is observed even when the ink for forming a positive hole injection layer includes 50 vol % of the second component of which the surface tension is smaller than the surface tension of the first component. The increase of the difference Δbp between the boiling points thereof causes the degrees of the light emitting failure with the wetting spread defect and the film thickness unevenness to be improved, but the evaluations thereof are from "C" to "D".

Example 1-64 to Example 1-72

As shown in FIG. 15, the ink for forming a positive hole injection layer of Example 1-64 to Example 1-72 includes m-MTDATA as a positive hole injection material of the third component of 0.3 wt % in which each of nine kinds of the first components in order from the highest boiling point among 25 kinds of aromatic solvents described above is combined by the volume fraction of 50% to Diethyleneglycol-dibuthyl-ether having the boiling point of 256° C. among seven kinds of aliphatic solvents as a second component described above. In other words, the volume fraction of the second component in Example 1-26 to Example 1-34 increases by 30 vol % with respect to Comparative Example 1-67 to Comparative Example 1-75.

In the ink for forming a positive hole injection layer of Example 1-64 to Example 1-72 in which the difference Δbp between the boiling point of the first component and the boiling point of the second component is from 34° C. to 77° C., since the second component of which the surface tension is smaller than the surface tension of the first component is included as 50 vol %, the wetting spread properties with respect to the opening 104*a* is improved than Comparative Example 1-67 to Comparative Example 1-75 and Comparative Example 1-138 to Comparative Example 1-153. All of the wetting spread defect evaluations are "B". In the evaluations of the film thickness unevenness, Example 1-64 to Example 1-67 are "A", Example 1-68 and Example 1-69 are "B", and Example 1-70 to Example 1-72 are "C". All of the light emitting failure evaluations are "B".

Comparative Example 1-154 to Comparative Example 1-174

As shown in FIG. 16, the ink for forming a positive hole injection layer of Comparative Example 1-154 to Comparative Example 1-174 includes m-MTDATA as a positive hole injection material of the third component of 0.3 wt % in which each of 21 kinds of the first components in order from the lowest boiling point among 25 kinds of aromatic solvents described above is combined by the volume fraction of 50% to Tetraethyleneglycol-dibuthyl-ether having the boiling point of 275° C. among seven kinds of aliphatic solvents as a second component described above. The boiling point of the first component is not necessarily higher than the boiling point of the second component, and the difference Δbp between the boiling points thereof is from −24° C. to 23° C. The solubility of the third component in the second component is lower than the solubility of the third component in the first component. Further, the surface tension of the second component is smaller than the surface tension of the first component.

In Comparative Example 1-154 to Comparative Example 1-174 in which the difference Δbp between the boiling point of the first component and the boiling point of the second component is from −24° C. to 23°, the wetting spread defect is observed even when the ink for forming a positive hole injection layer includes 50 vol % of the second component of which the surface tension is smaller than the surface tension of the first component. The increase of the difference Δbp between the boiling points thereof causes the degrees of the light emitting failure with the wetting spread defect and the film thickness unevenness to be improved, but the evaluations thereof are from "C" to "D".

Example 1-73 to Example 1-76

As shown in FIG. 16, the ink for forming a positive hole injection layer of Example 1-73 to Example 1-76 includes m-MTDATA as a positive hole injection material of the third component of 0.3 wt % in which each of four kinds of the first components in order from the highest boiling point among 25 kinds of aromatic solvents described above is combined by the volume fraction of 50% to Tetraethyleneglycol-dimethyl-ether having the boiling point of 275° C. among seven kinds of aliphatic solvents as a second component described above. That is, the volume fraction of the second component increases by 30 vol % with respect to Comparative Example 1-97 to Comparative Example 1-100. In other words, the volume fraction of the second component increases by 20 vol % with respect to Example 1-35 to Example 1-38.

In the ink for forming a positive hole injection layer of Example 1-73 to Example 1-76 in which the difference Δbp between the boiling point of the first point and the boiling point of the second component is from 30° C. to 58° C., since the second component of which the surface tension is smaller than the surface tension of the first component is included as 50 vol %, the wetting spread properties with respect to the opening 104*a* is improved than Comparative Example 1-97 to Comparative Example 1-100 and Comparative Example 1-154 to Comparative Example 1-174. All of the wetting spread defect evaluations are "B". In the film thickness unevenness and the light emitting failure, the evaluations thereof are "C", since it is difficult to perform the drying of the mixed solvent evenly when the boiling point of the first component exceeds 300° C., as described above. The evaluations of three evaluation items are equivalent to the evaluations of Example 1-35 to Example 1-38.

Example 1-77 to Example 1-101

As shown in FIG. 17, the ink for forming a positive hole injection layer of Example 1-77 to Example 1-101 includes m-MTDATA as a positive hole injection material of the third component of 0.3 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component in the mixed solvent of the first component and the second component is 30 vol %, and the volume fraction of the second component is 70 vol %. In other words, the volume fraction of the second component increases by 20 vol % with respect to Example 1-39 to Example 1-63.

In the ink for forming a positive hole injection layer of Example 1-77 to Example 1-202 in which the difference Δbp between the boiling point of the first component and the boiling point of the second component is from 39° C. to 121° C., since the second component of which the surface tension is smaller than the surface tension of the first component is included as 70 vol %, the wetting spread properties with respect to the opening 104*a* are similar to Example 1-39 to Example 1-63. All of the wetting spread defect evaluations are "B". In the film thickness unevenness and the light emitting failure, the evaluations of Example 1-77 to Example 1-97 are "B". In Example 1-98 to Example 101 in which the boiling point of the first component exceeds 300° C., since it is difficult to perform the drying evenly after evaporation of the second component, the evaluations of the film thickness unevenness and the light emitting failure are "C", but the evaluation can be improved by the reconsideration of the reduced pressure drying conditions.

Comparative Example 1-175 to Comparative Example 1-190

As shown in FIG. 18, the ink for forming a positive hole injection layer of Comparative Example 1-175 to Comparative Example 1-190 includes m-MTDATA as a positive hole injection material of the third component of 0.3 wt % in which each of 16 kinds of the first components in order from the lowest boiling point among 25 kinds of aromatic solvents described above is combined to Diethyleneglycol-dibuthyl-ether having the boiling point of 256° C. among seven kinds of aliphatic solvents as a second component described above. The volume fraction of the first component in the mixed solvent of the first component and the second component is 30 vol %, and the volume fraction of the second component is 70 vol %. The boiling point of the first component is not necessarily higher than the boiling point of the second component, and the difference Δbp between the boiling points thereof is from −5° C. to 26° C. The solubility of the third component in the second component is lower than the solubility of the third component in the first component. Further, the surface tension of the second component is smaller than the surface tension of the first component.

In Comparative Example 1-175 to Comparative Example 1-190 in which the difference Δbp between the boiling point of the first component and the boiling point of the second component is from −5° C. to 26°, the wetting spread defect is observed even when the ink for forming a positive hole injection layer includes 70 vol % of the second component of which the surface tension is smaller than the surface tension of the first component. The increase of the difference Δbp between the boiling points thereof causes the degrees of the light emitting failure with the wetting spread defect and the film thickness unevenness to be improved, but the evaluations thereof are from "C" to "D".

Example 1-102 to Example 1-110

As shown in FIG. 18, the ink for forming a positive hole injection layer of Example 1-102 to Example 1-110 includes m-MTDATA as a positive hole injection material (third component) of 0.3 wt % in which each of nine kinds of the first components in order from the highest boiling point among 25 kinds of aromatic solvents described above is combined to Diethyleneglycol-dibuthyl-ether having the boiling point of 256° C. among seven kinds of aliphatic solvents as a second component described above. The volume fraction of the first component in the mixed solvent of the first component and the second component is 30 vol %, and the volume fraction of the second component is 70 vol %. In other words, the volume fraction of the second component increases by 50 vol % with respect to Comparative Example 1-67 to Comparative Example 1-75. The volume fraction of the second component increases by 20 vol % with respect to Example 1-64 to Example 1-72.

In the ink for forming a positive hole injection layer of Example 1-102 to Example 1-110 in which the difference Δbp between the boiling point of the first component and the boiling point of the second component is from 34° C. to 77° C., since the second component of which the surface tension is smaller than the surface tension of the first component is included as 70 vol %, the wetting spread properties with respect to the opening 104*a* is improved than Comparative Example 1-67 to Comparative Example 1-75 and Comparative Example 1-175 to Comparative Example 1-190. All of the wetting spread defect evaluations are "B". In the evaluations of the film thickness unevenness, Example 1-102 to Example 1-105 are "A", Example 1-106 is "B", and Example 1-107 to Example 1-110 in which the boiling point of the first component exceeds 300° C. are "C" as expected. In the evaluations of the light emitting failure, Example 1-102 to Example 1-106 are "B", and Example 1-107 to Example 1-110 in which the boiling point of the first component exceeds 300° C. are "C" as expected. The evaluations of which the film thickness unevenness and the light emitting failure are "C" can be improved by the reconsideration of the reduced pressure drying conditions described above.

Comparative Example 1-191 to Comparative Example 1-211

As shown in FIG. 19, the ink for forming a positive hole injection layer of Comparative Example 1-191 to Comparative Example 1-211 includes m-MT DATA as a positive hole injection material of the third component of 0.3 wt % in which each of 21 kinds of the first components in order from the lowest boiling point among 25 kinds of aromatic solvents described above is combined to Tetraethyleneglycol-dimethyl-ether having the boiling point of 275° C. among seven kinds of aliphatic solvents as a second component described above. The volume fraction of the first component in the mixed solvent of the first component and the second component is 30 vol %, and the volume fraction of the second component is 70 vol %. The boiling point of the first component is not necessarily higher than the boiling point of the second component, and the difference Δbp between the boiling points thereof is from −24° C. to 23° C. The solubility of the third component in the second component is lower than the solubility of the third component in the first component. Further, the surface tension of the second component is smaller than the surface tension of the first component.

In Comparative Example 1-191 to Comparative Example 1-211 in which the difference Δbp between the boiling point of the first component and the boiling point of the second component is from −24° C. to 23°, the wetting spread defect is observed even when the ink for forming a positive hole injection layer includes 70 vol % of the second component of which the surface tension is smaller than the surface tension of the first component. The increase of the difference Δbp between the boiling points thereof causes the degrees of the light emitting failure with the wetting spread defect and the film thickness unevenness to be improved, but the evaluations thereof are from "C" to "D".

Example 1-111 to Example 1-114

As shown in FIG. 19, the ink for forming a positive hole injection layer of Example 1-111 to Example 1-114 includes m-MTDATA as a positive hole injection material (third component) of 0.3 wt % in which each of four kinds of the first components in order from the highest boiling point among 25 kinds of aromatic solvents described above is combined to Tetraethyleneglycol-dimethyl-ether having the boiling point of 275° C. among seven kinds of aliphatic solvents as a second component described above. The volume fraction of the first component in the mixed solvent of the first component and the second component is 30 vol %, and the volume fraction of the second component is 70 vol %. That is, the volume fraction of the second component in Example 1-35 to Example 1-38 increases by 50 vol % with respect to Comparative Example 1-97 to Comparative Example 1-100. In other words, the volume fraction of the second component increases by 20 vol % with respect to Example 1-73 to Example 1-76.

In the ink for forming a positive hole injection layer of Example 1-111 to Example 1-114 in which the difference Δbp between the boiling point of the first component and the boiling point of the second component is from 30° C. to 58° C., since the second component of which the surface tension is smaller than the surface tension of the first component is included as 70 vol %, the wetting spread properties with respect to the opening 104a is improved than Comparative Example 1-191 to Comparative Example 1-211. All of the wetting spread defect evaluations are "B" in the same manner of Example 1-73 to Example 1-76. In the film thickness unevenness and the light emitting failure, the evaluations thereof are "C", since it is difficult to perform the drying of the mixed solvent evenly when the boiling point of the first component exceeds 300° C. However, the evaluations thereof can be improved by the reconsideration of the reduced pressure drying conditions.

Comparative Example 1-212 to Comparative Example 1-236

As shown in FIG. 20, the ink for forming a positive hole injection layer of Comparative Example 1-212 to Comparative Example 1-236 includes m-MTDATA as a positive hole injection material of the third component of 0.3 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component in the mixed solvent of the first component and the second component is 20 vol %, and the volume fraction of the second component is 80 vol %. The boiling point of the first component is higher than the boiling point of the second component, and the difference Δbp between the boiling points thereof is from 39° C. to 121° C. The solubility of the third component in the second component is lower than the solubility of the third component in the first component. Further, the surface tension of the second component is smaller than the surface tension of the first component.

In Comparative Example 1-212 to Comparative Example 1-236 in which the difference Δbp between the boiling point of the first component and the boiling point of the second component is 39° C. to 121° C., the ink for forming a positive hole injection layer includes 80 vol % of the second component of which the surface tension is smaller than the surface tension of the first component, thus the evaluations of the wetting spread defect are "B". In addition, in the reduced pressure drying, since the second component of which the boiling point is lower than the boiling point of the first component evaporates earlier, the remaining amount of the first component become small in comparison with Example 1-77 to Example 1-101, and the film thickness unevenness occurs due to the aggregation and the deposition of the third component. Therefore, the evaluations of the film thickness unevenness and the light emitting failure are "D".

Comparative Example 1-237 to Comparative Example 1-261

As shown in FIG. 21, the ink for forming a positive hole injection layer of Comparative Example 1-237 to Comparative Example 1-261 includes m-MTDATA as a positive hole injection material (third component) of 0.3 wt % in which each of 25 kinds of aromatic solvents as a first component described above is combined to Diethyleneglycol-dibuthyl-ether having the boiling point of 256° C. among seven kinds of aliphatic solvents as a second component described above. Volume fraction of the first component in the mixed solvent of the first component and the second component is 20 vol %, and the volume fraction of the second component is 80 vol %. The boiling point of the first component is not necessarily higher than the boiling point of the second component, and the difference Δbp between the boiling points thereof is from −5° C. to 77° C. The solubility of the third component in the second component is lower than the solubility of the third component in the first component. Further, the surface tension of the second component is smaller than the surface tension of the first component.

In Comparative Example 1-237 to Comparative Example 1-252 in which the difference Δbp between the boiling point of the first component and the boiling point of the second component is from −5° C. to 26°, the wetting spread defect is observed even when the ink for forming a positive hole injection layer includes 80 vol % of the second component of which the surface tension is smaller than the surface tension of the first component. The increase of the difference Δbp between the boiling points thereof causes the evaluations of the wetting spread defect to be improved, but the evaluations thereof are from "C" to "D". In Comparative Example 1-253 to Comparative Example 1-261 in which the difference Δbp between the boiling point of the first component and the boiling point of the second component is higher than or equal to 34° C., the ink for forming a positive hole injection layer includes 80 vol % of the second component of which the surface tension is smaller than the surface tension of the first component, thus the wetting spread defect hardly occurs, and the evaluations of the wetting spread defect are "B". However, in Comparative Example 1-237 to Comparative Example 1-261, the aggregation and the deposition of the third component occur depending on the reduction of the remaining amount of the first component, after the evaporation of the second component in the reduced pressure drying. Therefore, the evaluations of the film thickness unevenness and the light emitting failure are "D".

Comparative Example 1-262 to Comparative Example 1-286

As shown in FIG. 22, the ink for forming a positive hole injection layer of Comparative Example 1-262 to Comparative Example 1-286 includes m-MTDATA as a positive hole injection material (third component) of 0.3 wt % in which each of 25 kinds of aromatic solvents as a first component described above is combined to Tetraethyleneglycol-dimethyl-ether having the boiling point of 275° C. among seven kinds of aliphatic solvents as a second component described above. The volume fraction of the first component in the mixed solvent of the first component and the second component is 20 vol %, and the volume fraction of the second component is 80 vol %. The boiling point of the first component is not necessarily higher than the boiling point of the second component, and the difference Δbp between the boiling points thereof is from −24° C. to 58° C. The solubility of the third component in the second component is lower than the solubility of the third component in the first component. Further, the surface tension of the second component is smaller than the surface tension of the first component.

In Comparative Example 1-262 to Comparative Example 1-282 in which the difference Δbp between the boiling point of the first component and the boiling point of the second component is from −24° C. to 23°, the wetting spread defect is observed even when the ink for forming a positive hole injection layer includes 80 vol % of the second component of which the surface tension is smaller than the surface tension of the first component. The increase of the difference Δbp between the boiling points thereof causes the evaluations of the wetting spread defect to be improved, but the evaluation thereof is from "C" to "D". In Comparative Example 1-283 to Comparative Example 1-286 in which the difference Δbp between the boiling point of the first component and the boiling point of the second component is higher than or equal to 30° C., the ink for forming a positive hole injection layer includes 80 vol % of the second component of which the surface tension is smaller than the surface tension of the first component, thus the wetting spread defect hardly occurs, and the evaluations of the wetting spread defect are "B". However, in Comparative Example 1-262 to Comparative Example 1-286, the aggregation and the deposition of the third component occur depending on the reduction of the remaining amount of the first component, after the evaporation of the second component in the reduced pressure drying. Therefore, the evaluations of the film thickness unevenness and the light emitting failure are "D".

The ink for forming a positive hole injection layer of Comparative Examples and Examples described above will be described as follows, with reference with evaluation results.

In Comparative Example 1-1 to Comparative Example 1-25, the ink for forming a positive hole injection layer does not include the second component of aliphatic solvent, since the ink for forming a positive hole injection layer is applied to the pixel electrode 102 which is formed of ITO in the diaphragm 134 of the opening 104a. Therefore, the wetting spread properties are poor and the positive hole injection layer 131 having a predetermined film thickness is not obtained. In Comparative Example 1-26 to Comparative Example 1-100 including the second component of the volume fraction of 20 vol %, the wetting spread properties on the pixel electrode 102 are also poor, thus the evaluations thereof are poor. In addition, in Comparative Example 1-212 to Comparative 1-286 including the second component of the volume fraction of 80 vol %, the wetting spread properties are good when the difference Δbp between the boiling point of the first component and the boiling point of the second component is higher than or equal to 30° C., but the wetting spread properties obviously falls when the difference Δbp between the boiling points thereof is lower than 30° C. or the boiling point of the second component is higher than the boiling point of the first component. The positive hole injection layer 131 having a predetermined film thickness is formed in each of Comparative Example 1-212 to Comparative Example 1-286.

On the other hand, the first component is selected from 25 kinds of aromatic solvents and the second component is selected from three kinds of aliphatic solvents in Example 1-1 to Example 1-114, in which the boiling point of the first component is higher than the boiling point of the second component and the difference Δbp between the boiling points thereof is higher than or equal to 30° C. The volume fraction of the second component is from 30 vol % to 70 vol in the mixed solvent including the first component and the second component. Even when the low molecular positive hole injection material is used as a third component in the mixed solvent configuration of the ink for forming a positive hole injection layer described above, the wetting spread properties on the pixel electrode 102 is secured and the positive hole injection layer 131 where the film thickness unevenness hardly occurs by the decrease of aggregation and deposition of m-MTDATA of the low molecular positive hole injection material as a third component in the reduced pressure drying, can be formed.

In the Example 1-1 to Example 1-114, in order to form positive hole injection layer 131 further evenly in Example 1-26 to Example 1-29 and Example 1-64 to Example 1-67, it is preferable that the aromatic solvent of the first component is selected from 225TMDPE (2,2,5-Tri-methy-diphenyl ether; boiling point 290° C.), Dibenzyl-Ether (boiling point 295° C.), 235TMDPE (2,3,5-Tri-methy diphenyl ether; boiling point 295° C.), and N-Methyldiphenylamine (boiling point 297° C.), Diethyleneglycol-dibutyl-ether of the boiling point of 256° C. is used as a second component, and the volume fraction of the second component is from 30 vol % to 50 vol %.

In Comparative Example 1-101 to Comparative Example 1-211, the volume fraction of the second component is from 30 vol % to 70 vol % in the mixed solution, in the same manner of Example 1-1 to Example 1-114. When the difference Δbp between the boiling point of the first component and the boiling point of the second component is lower than 30° C. or the boiling point of the second component is higher than the boiling point of the first component, the wetting spread properties apparently decreases and the film thickness unevenness occurs, in comparison with Example 1-1 to Example 1-114.

Ink for Forming Positive Hole Transport Layer

FIG. 23 is a table illustrating configurations and evaluation results of Comparative Example 2-1 to Comparative Example 2-25 of an ink for forming a positive hole transport layer. FIG. 24 is a table illustrating configurations and evaluation results of Comparative Example 2-26 to Comparative Example 2-50 of the ink for forming a positive hole transport layer. FIG. 25 is a table illustrating configurations and evaluation results of Comparative Example 2-51 to Comparative Example 2-75 of the ink for forming a positive hole transport layer. FIG. 26 is a table illustrating configurations and evaluation results of Comparative Example 2-76 to Comparative Example 2-100 of the ink for forming a positive hole transport layer. FIG. 27 is a table illustrating configurations and evaluation results of Example 2-1 to Example 2-25 of the ink for forming a positive hole transport layer. FIG. 28 is a table illustrating configurations and evaluation results of Comparative Example 2-101 to Comparative Example 2-116 and Example 2-26 to Example 2-34 of the ink for forming a positive hole transport layer. FIG. 29 is a table illustrating configurations and evaluation results of Comparative Example 2-117 to Comparative Example 2-137 and Example 2-35 to Example 2-38 of the ink for forming a positive hole transport layer. FIG. 30 is a table illustrating configurations and evaluation results of Example 2-39 to Example 2-63 of the ink for forming a positive hole transport layer. FIG. 31 is a table illustrating configurations and evaluation results of Comparative Example 2-138 to Comparative Example 2-153 and Example 2-64 to Example 2-72 of the ink for forming a positive hole transport layer. FIG. 32 is a table illustrating configurations and evaluation results of Comparative Example 2-154 to Comparative Example 2-174 and Example 2-73 to Example 2-76 of the ink for forming a positive hole transport layer. FIG. 33 is a table illustrating configurations and evaluation results of Example 2-77 to Example 2-101 of the ink for forming a positive hole transport layer. FIG. 34 is a table illustrating configurations and evaluation results of Comparative Example 2-175 to Comparative Example 2-190 and Example 2-102 to Example 2-110 of the ink for forming a positive hole transport layer. FIG. 35 is a table illustrating configurations and evaluation results of Comparative Example 2-191 to Comparative Example 2-211 and Example 2-111 to Example 2-114 of the ink for forming a positive hole transport layer. FIG. 36 is a table illustrating configurations and evaluation results of Comparative Example 2-212 to Comparative Example 2-236 of the ink for forming a positive hole transport layer. FIG. 37 is a table illustrating configurations and evaluation results of Comparative Example 2-237 to Comparative Example 2-261 of the ink for forming a positive hole transport layer. FIG. 38 is a table illustrating configurations and evaluation results of Comparative Example 2-262 to Comparative Example 2-286 of the ink for forming a positive hole transport layer. In the tables of FIG. 23 to FIG. 37, 25 kinds of aromatic solvents of the first component is recited in the order of increasing of the boiling points thereof from too to bottom of the table.

The ink for forming a positive hole transport layer of Comparative Example 2-1 to Comparative Example 2-286 and Example 2-1 to Example 2-114, in which the first component is selected from 25 kinds of aromatic solvents, the second component is selected from three kinds of aliphatic solvents, varies the volume fractions of the components and forms the positive hole transport layer 132 by the ink jet method. Specifically, first, the positive hole injection layer 131 is formed by the liquid phase method (ink jet method). Then, the positive hole transport layer 132 is formed using the ink for forming a positive hole transport layer of Comparative Example 2-1 to Comparative Example 2-286 and Example 2-1 to Example 2-114. In addition, by the evaporation method, the light emitting layer 133, the electron transport layer 134, and the electron injection layer 135 are formed. The material configuration of the layer is as follows, respectively. The positive hole injection layer is PEDOT/PSS; poly(3,4-ethylenedioxythiophene)-poly(styrene sulfonic acid), the positive hole transport layer is TFB, the host material of the light emitting layer 133 is CBP, dopant is Ir(ppy)3, the electron transport layer 134 is BAlq, and the electron injection layer 135 is LiF.

The evaluation method of the ink for forming a positive hole transport layer in Comparative Example 2-1 to Comparative Example 2-286 and Example 2-1 to Example 2-114 Comparative Example 2-1 to Comparative Example 2-25 is similar to the evaluation method of the ink for forming a positive hole injection layer described above, and three items of the wetting spread defect, the film thickness unevenness and the light emitting failure are evaluated. However, the evaluations thereof are performed other than the defect due to the film thickness unevenness of the positive hole injection layer 131 to which the ink for a positive hole transport layer is applied. The case of the light emitting failure is similar thereto.

Comparative Example 2-1 to Comparative Example 2-25

As shown in FIG. 23, the ink for forming a positive hole transport layer of Comparative Example 2-1 to Comparative Example 2-25 includes (9,9-dioctyl-fluorlene-co-N-(4-buthylphenyl)-diphenylamine) [TFB] of 0.5 wt % as a positive hole transport material (third component) to each of 25 kinds of aromatic solvents as a first component described above. The TFB is the π-conjugated high molecular organic compound. The aliphatic solvent of the second component is not included. The first component is a good solvent which is capable of dissolving the positive hole transport material of 0.1 wt % or more as a third component.

In the ink for forming a positive hole transport layer of Comparative Example 2-1 to Comparative Example 2-25, since the second component having small surface tension is not included thereto, the wetting spread properties are poor with respect to the opening portion 104a in which the positive hole injection layer 131 is formed. On the other hand, since TFB of the high molecular positive hole transport material as a third component is included, the aggregation and the deposition of the third component hardly occur in the reduced pressure drying in comparison with the case of using the low molecular positive hole transport material. Therefore, all of three evaluation properties of the wetting spread defect, the film thickness unevenness in the functional layer and the light emitting failure are "C".

Comparative Example 2-26 to Comparative Example 2-50

As shown in FIG. 24, the ink for forming a positive hole transport layer of Comparative Example 2-26 to Comparative Example 2-50 includes TFB as a positive hole transport material (third component) of 0.5 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 80 vol % and the volume fraction of the second component is 20 vol % in the mixed solvent including the first component and the second component. The boiling point of the first component is higher than the boiling point of the second component, and the difference Δbp between the boiling points thereof is from 39° C. to 121° C. The solubility of the third component in the first component is higher than the solubility of the third component in the second component. Further, the surface tension of the second component is smaller than the surface tension of the first component.

Comparative Example 2-51 to Comparative Example 2-75

As shown in FIG. 25, the ink for forming a positive hole transport layer of Comparative Example 2-51 to Comparative Example 2-75 includes TFB as a positive hole transport material of the third component of 0.5 wt % in which each of the first component of 25 kinds of aromatic solvents described above is combined to Diethyleneglycol-dibuthyl-ether having the boiling point of 256° C. among seven kinds of aliphatic solvents as a second component described above. The volume fraction of the first component is 80 vol % and the volume fraction of the second component is 20 vol % in the mixed solvent of the first component and the second component. The boiling point of the first component is not necessarily higher than the boiling point of the second component, and the difference Δbp between the boiling points thereof is from −5° C. to 77° C. The solubility of the third component in the first component is higher than the solubility of the third component in the second component. Further, the surface tension of the second component is smaller than the surface tension of the first component.

Comparative Example 2-76 to Comparative Example 2-100

As shown in FIG. 26, the ink for forming a positive hole transport layer of Comparative Example 2-76 to Comparative Example 2-100 includes TFB as a positive hole transport material of the third component of 0.5 wt % in which each of the first component of 25 kinds of aromatic solvents described above is combined to Tetraethyleneglycol-dimethyl-ether having the boiling point of 275° C. among seven kinds of aliphatic solvents as a second component described above. The volume fraction of the first component is 80 vol % and the volume fraction of the second component is 20 vol % in the mixed solvent of the first component and the second component. The boiling point of the first component is not necessarily higher than the boiling point of the second component, and the difference Δbp between the boiling points thereof is from −24° C. to 58° C. The solubility of the third component in the first component is higher than the solubility of the third component in the second component. Further, the surface tension of the second component is smaller than the surface tension of the first component.

In the ink for forming a positive hole transport layer of Comparative Example 2-26 to Comparative Example 2-100, the second component of which the surface tension is smaller than the surface tension of the first component is not included as 20 vol %, but the wetting spread properties are poor with respect to the opening portion 104a in the same manner of Comparative Example 1-1 to Comparative Example 1-25 without the second component. Therefore, all of three evaluation properties of the wetting spread defect, the film thickness unevenness in the functional layer and the light emitting failure are "C".

Example 2-1 to Example 2-25

As shown in FIG. 27, the ink for forming a positive hole transport layer of Example 2-1 to Example 2-25 includes TFB as a positive hole transport material of the third component of 0.5 wt % in which each of the first component of 25 kinds of aromatic solvents described above is combined to Diethyleneglycol-butylmethyl-ether having the boiling point of 212° C. among seven kinds of aliphatic solvents as a second component described above. The volume fraction of the first component is 70 vol % and the volume fraction of the second component is 30 vol % in the mixed solvent including the first component and the second component. In other words, the volume fraction of the second component in Example 2-1 to Example 2-25 increases by 10 vol % with respect to Comparative Example 2-26 to Comparative Example 2-50.

In the ink for forming a positive hole transport layer of Example 2-1 to Example 2-25 in which the boiling point of the first component is higher than the boiling point of the second component and the difference Δbp between the boiling points thereof is from 39° C. to 121° C., since the second component is included as 30 vol %, the wetting spread properties with respect to the opening 104a is improved than Comparative Example 2-26 to Comparative Example 2-50. The evaluations of the wetting spread defect are from "A" to "B", all evaluations of the film thickness unevenness are "B", and the evaluations of the light emitting failure are from "A" to "B". In particular, the evaluation properties of the wetting spread defect and the film thickness unevenness are improved using nigh molecular TFB as a third component in comparison with the case of using the low molecular positive hole transport material.

Comparative Example 2-101 to Comparative Example 2-116 and Example 2-26 to Example 2-34

As shown in FIG. 28, the ink for forming a positive hole transport layer of Comparative Example 2-101 to Comparative Example 2-116 and Example 2-26 to Example 2-34 includes TFB of the positive hole transport material as a third component of 0.5 wt % in which each of the first component of 25 kinds of aromatic solvents described above is combined to Diethyleneglycol-dibuthyl-ether having the boiling point of 256° C. among seven kinds of aliphatic solvents as a second component described above. The volume fraction of the first component is 70 vol % and the volume fraction of the second component is 30 vol % in the mixed solvent including the first component and the second component. In other words, the volume fraction of the second component in Example 2-101 to Example 2-116 increases by 10 vol % with respect to Comparative Example 2-51 to Comparative Example 2-66. The volume fraction of the second component in Example 2-26 to Example 2-34 increases by 10 vol % with respect to Comparative Example 2-67 to Comparative Example 2-75.

In Comparative Example 2-101 to Comparative Example 2-116 of the difference Δbp between the boiling point of the first component and the boiling point of the second component is from −5° C. to 26°, since the ink for forming a positive hole transport layer includes the second component of which the surface tension is smaller than the surface tension of the first component, the wetting spread properties are poor with respect to the opening portion 104a. All of the three items evaluations are "C", in the same manner of Comparative Example 2-51 to Comparative Example 2-66.

On the other hand, in the ink for forming a positive hole transport layer of Example 2-26 to Example 2-34 in which the boiling point of the first component is higher than the boiling point of the second component and the difference Δbp between the boiling points thereof is from 34° C. to 77° C., since the second component is included as 30 vol %, the wetting spread properties with respect to the opening 104a is improved than Comparative Example 2-67 to Comparative Example 2-75 and Comparative Example 2-101 to Comparative Example 2-116. All evaluations of the wetting spread defect and the film thickness unevenness are "A", and the evaluations of the light emitting failures are from "A" to "B".

Comparative Example 2-117 to Comparative Example 2-137 and Example 2-35 to Example 2-38

As shown in FIG. 29, the ink for forming a positive hole transport layer of Comparative Example 2-117 to Comparative Example 2-137 and Example 2-35 to Example 2-38 includes TFB as a positive hole transport material of the third component of 0.5 wt % in which each of the first component of 25 kinds of aromatic solvents described above is combined to Tetraethyleneglycol-dimethyl-ether having the boiling point of 275° C. among seven kinds of aliphatic solvents as a second component described above. The volume fraction of the first component is 70 vol % and the volume fraction of the second component is 30 vol % in the mixed solvent including the first component and the second component. In other words, the volume fraction of the second component in Comparative Example 2-117 to Comparative Example 2-137 increases 10 vol % with respect to Comparative Example 2-76 to Comparative Example 2-96. The volume fraction of the second component in Example 2-35 to Example 2-38 increases 10 vol % with respect to Comparative Example 2-97 to Comparative Example 2-100.

In Comparative Example 2-117 to Comparative Example 2-137 in which the difference Δbp between the boiling point of the first component and the boiling point of the second component is from −24° C. to 23°, the wetting spread defect is poor with respect to the opening 104a even when the ink for forming a positive hole transport layer includes 30 vol % of the second component of which the surface tension is smaller than the surface tension of the first component. In particular, in Comparative Example 2-117 to Comparative Example 2-125, since the boiling point of the first component is lower than the boiling point of the second component, the effects by the addition of the second component having the small surface tension are hardly achieved and all of three evaluation items are "D". The wetting spread properties to the opening 104a tend to be improved while the difference Δbp between the boiling points thereof becomes large, therefore, all of three evaluation items are "C" in Comparative Example 2-126 to Comparative Example 2-137.

On the other hand, in Example 2-35 to Example 2-38 in which the boiling point of the first component is higher than the boiling point of the second component and the difference Δbp between the boiling points thereof is from 30° C. to 58° C., since the ink for forming a positive hole transport layer includes 30 vol % of the second component, the wetting spread properties with respect to the positive hole injection layer 131 is improved than Comparative Example 2-97 to Comparative Example 2-100. The evaluations of the wetting spread defect, the film thickness unevenness and the light emitting failure are from "A" to "B".

Example 2-39 to Example 2-63

As shown in FIG. 30, the ink for forming a positive hole transport layer of Example 2-39 to Example 2-63 includes TFB as a positive hole injection material of the third component of 0.5 wt % in which each of the first component of 25 kinds of aromatic solvents described above is combined by the volume fraction of 50% to Diethyleneglycol-butylmethyl-ether having the boiling point of 212° C. among seven kinds of aliphatic solvents as a second component described above. That is, the volume fraction of the second component in Example 2-39 to Example 2-63 increases by 30 vol % with respect to Comparative Example 2-26 to Comparative Example 2-50. In other words, the volume fraction of the second component increases by 20 vol % in comparison with the volume fraction of the second component in Example 2-1 to Example 2-25.

In the ink for forming a positive hole transport layer of Example 2-39 to Example 2-63 in which the boiling point of the first component is higher than the boiling point of the second component and the difference Δbp between the boiling points thereof is from 39° C. to 121° C., since the second component of which the surface tension is smaller than the surface tension of the first component is included as 50 vol %, the wetting spread properties with respect to the opening 104a is improved than Comparative Example 2-26 to Comparative Example 2-50. Moreover, since the second component of which the boiling point is lower than the boiling of the first component is included as 50 vol %, in comparison with Comparative Example 2-26 to Comparative Example 2-50, the drying is proceeded while the state of the wetting spread of the ink for forming a positive hole transport layer on the opening 104a is maintained, and the film thickness unevenness of the positive hole transport layer 132 is also reduced. Accordingly, the occurrence of the light emitting failure in the dark spot or the bright spot due to the wetting spread defect or the film thickness unevenness is suppressed. The evaluations of the wetting spread defect are from "A" to "B", the evaluations of the film thickness unevenness are "B" and the evaluations of the light emitting failure are from "A" to "B".

Comparative Example 2-138 to Comparative Example 2-153 and Example 2-64 to Example 2-72

As shown in FIG. 31, the ink for forming a positive hole transport layer of Comparative Example 2-138 to Comparative Example 2-153 and Example 2-64 to Example 2-72 includes TFB as a positive hole transport material of the third component of 0.3 wt % in which each of the first component of 25 kinds of aromatic solvents described above is mixed by the volume fraction of 50% to Diethyleneglycol-dibuthyl-ether having the boiling point of 256° C. among seven kinds of aliphatic solvents as a second component described above. In Comparative Example 2-138 to Comparative Example 2-139, the boiling point of the second component is higher than the boiling point of the first component, and the difference Δbp between the boiling points thereof is from −5° C. to −3° C. On the other hand, in Comparative Example 2-140 to Comparative Example 2-153 and Example 2-64 to Example 2-72, the boiling point of the first component is higher than the boiling point of the second component, and the difference Δbp between the boiling points thereof is from 2° C. to 77° C. The solubility of the third component in the first component is higher than the solubility of the third component in the second component. Further, the surface tension of the second component is smaller than the surface tension of the first component.

In Comparative Example 2-138 to Comparative Example 2-153 in which the difference Δbp between the boiling point of the first component and the boiling point of the second component is lower than 30° C., the improvement effects of the wetting spread properties are not achieved sufficiently by the addition of the second component of which the surface tension is smaller than the surface tension of the first component as expected. All of three evaluation properties of the wetting spread defect, the film thickness unevenness and the light emitting failure are "C" in Comparative Example 2-138 to Comparative Example 2-153.

On the other hand, in Example 2-64 to Example 2-72 in which the difference Δbp between the boiling point of the first component and the boiling point of the second component is higher than or equal to 34° C., the effects of the wetting spread properties tend to be improved sufficiently by the addition of the second component of which the surface tension is smaller than the surface tension of the first component as expected. Both of the evaluations of the wetting spread defect and the film thickness unevenness are "A". The evaluations of the light emitting failure are from "A" to "B" depending on the increase of the difference Δbp between the boiling points thereof.

Comparative Example 2-154 to Comparative Example 2-174 and Example 2-73 to Example 2-76

As shown in FIG. 32, the ink for forming a positive hole transport layer of Comparative Example 2-154 to Comparative Example 2-174 and Example 2-73 to Example 2-76 includes TFB as a positive hole transport material of the third component of 0.5 wt % in which each of 25 kinds of aromatic solvents as a first component described above is mixed by the volume fraction of 50% to Tetraethyleneglycol-dibuthyl-ether having the boiling point of 275° C. among seven kinds of aliphatic solvents as a second component described above. In Comparative Example 2-154 to Comparative Example 2-165, the boiling point of the second component is higher than the boiling point of the first component, and the difference Δbp between the boiling points thereof is from −24° C. to −1° C. On the other hand, in Comparative Example 2-166 to Comparative Example 2-174 and Example 2-73 to Example 2-76, the boiling point of the first component is higher than the boiling point of the second component, and the difference Δbp between the boiling points thereof is from 0° C. to 58° C. The solubility of the third component in the first component is higher than the solubility of the third component in the second component. Further, the surface tension of the second component is smaller than the surface tension of the first component.

In Comparative Example 2-154 to Comparative Example 2-174 in which the difference Δbp between the boiling point of the first component and the boiling point of the second component is lower than or equal to 23° C., the second component of which the surface tension is smaller than the surface tension of the first component is included as 50 vol %, but the surface tension effect of the second component is not obtained and the wetting spread properties are poor in the opening portion 104a. Specially, all evaluations of the wetting spread defect, the film thickness unevenness and the light emitting failure are "D" in Comparative Example 2-154 to Comparative Example 2-162 in which the boiling point of the second component is higher than the boiling point of the first component. In Comparative Example 2-16.3 to Comparative Example 2-174, all evaluations of the wetting spread defect, the film thickness unevenness and the light emitting failure are "C".

Meanwhile, in Example 2-73 to Example 2-76 in which the difference Δbp between the boiling point of the first component and the boiling point of the second component is higher than or equal to 30° C., the improvement effects of the wetting spread properties is achieved sufficiently by the addition of the second component of which the surface tension is smaller than the surface tension of the first component. The evaluations of the wetting spread defect, the film thickness unevenness and the light emitting failure are from "A" to "B" depending on the increase of the difference Δbp between the boiling points thereof. When the second component having the boiling point of 275° C. is selected, it is preferable that the first component of 305° C. or higher is selected, in which the boiling point of the first component is higher than the boiling point of the second component and the difference Δbp between the boiling points thereof is higher than or equal to 30°.

Example 2-77 to Example 2-101

As shown in FIG. 33, the ink for forming a positive hole transport layer of Example 2-77 to Example 2-101 includes TFB of the positive hole transport material as a third component of 0.5 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 70 vol % and the volume fraction of the second component is 30 vol % in the mixed solvent including the first component and the second component. That is, the volume fraction of the second component in Example 2-77 to Example 2-101 increases by 50 vol % with respect to Comparative Example 2-26 to Comparative Example 2-50. In other words, the volume fraction of the second component increases by 40 vol % with respect to Example 2-1 to Example 2-25.

In the ink for forming a positive hole transport layer of Example 2-77 to Example 2-101 in which the boiling point of the first component is higher than the boiling point of the second component and the difference Δbp between the boiling points thereof is from 39° C. to 121° C., since the second component of which the surface tension is smaller than the surface tension of the first component is included as 70 vol %, the wetting spread properties with respect to the opening 104a is stably obtained. The evaluations of the wetting spread defect are from "A" to "B". All of the evaluations of the film thickness unevenness are "B", and the evaluations of the light emitting failure are from "A" to "B".

Comparative Example 2-175 to Comparative Example 2-190 and Example 2-102 to Example 2-110

As shown in FIG. 34, the ink for forming a positive hole transport layer of Comparative Example 2-175 to Comparative Example 2-190 and Example 2-102 to Example 2-110 includes TFB as a high molecular positive hole transport material of the third component of 0.5 wt % in which each of 25 kinds of aromatic solvents as a first component described above is combined to Diethyleneglycol-dibuthyl-ether having the boiling point of 256° C. among seven kinds of aliphatic solvents as a second component described above. The volume fraction of the first component is 30 vol % and the volume fraction of the second component is 70 vol % in the mixed solvent including the first component and the second component. In other words, the volume fraction of the second component in Comparative Example 2-175 to Comparative Example 2-190 increases by 20 vol % with respect to Comparative Example 2-138 to Comparative Example 2-153. In addition, the volume fraction of the second component in Example 2-102 to Example 2-110 increases by 20 vol % with respect to Example 2-64 to Example 2-72.

In Comparative Example 2-175 to Comparative Example 2-190 in which the difference Δbp between the boiling point of the first component and the boiling point of the second component is lower than 30° C., the improvement effects of the wetting spread properties are not achieved sufficiently by the addition of the second component of which the surface tension is smaller than the surface tension of the first component as except. All of the evaluation properties of the wetting spread defect, the film thickness unevenness and the light emitting failure are "C" in Comparative Example 2-175 to Comparative Example 2-190.

In contrast, in Example 2-102 to Example 2-110 in which the difference Δbp between the boiling point of the first component and the boiling point of the second component is higher than or equal to 34° C., the improvement effects of the wetting spread properties tends to be achieved sufficiently by the addition of the second component of which the surface tension is smaller than the surface tension of the first component. Both of the evaluations of the wetting spread defect and the film thickness unevenness are "A". The evaluations of the light emitting failure are from "A" to "B" depending on the increase of the difference Δbp between the boiling points thereof.

Comparative Example 2-191 to Comparative Example 2-211 and Example 2-111 to Example 2-114

As shown in FIG. 35, in Comparative Example 2-191 to Comparative Example 2-211 and Example 2-111 to Example 2-114, the ink for forming a positive hole transport layer includes TFB as a high molecular positive hole transport material of the third component of 0.5 wt % in which each of 25 kinds of aromatic solvents as a first component described above is mixed by the volume fraction of 50% to Tetraethyleneglycol-dimethyl-ether having the boiling point of 275° C. among seven kinds of aliphatic solvents as a second component described above. The volume fraction of the first component is 30 vol % and the volume fraction of the second component is 70 vol % in the mixed solvent including the first component and the second component. That is, the volume fraction of the second component in Comparative Example 2-191 to Comparative Example 2-211 increases by 20 vol % with respect to Comparative Example 2-154 to Comparative Example 2-174. In Example 2-111 to Example 2-114, the volume fraction of the second component increases by 20 vol % with respect to Example 2-73 to Example 2-76.

In Comparative Example 2-191 to Comparative Example 2-211 in which the difference Δbp between the boiling point of the first component and the boiling point of the second component is lower than or equal to 23° C., the second component of which the surface tension is smaller than the surface tension of the first component is included as 70 vol %, but the surface tension effect of the second component is not obtained and the wetting spread properties are poor in the opening portion 104a. Particularly, in Comparative Example 2-191 to Comparative Example 2-199 in which the boiling point of the second component is higher than the boiling point of the first component and the difference Δbp between the boiling points thereof is from −24° C. to −5° C., all evaluation properties of the wetting spread defect, the film thickness unevenness and the light emitting failure are "D". In Comparative Example 2-200 to Comparative Example 2-211 in which the difference Δbp between the boiling points thereof from −3° C. to 23° C., all evaluation properties of the wetting spread defect, the film thickness unevenness and the light emitting failure are from "A" to "B".

On the other hand, in Example 2-211 to Example 2-114 in which the boiling point of the first component is higher than the boiling point of the second component and the difference Δbp between the boiling points thereof is from 30° C. to 58° C., the improvement effects of the wetting spread properties tends to be achieved sufficiently by the addition of the second component of which the surface tension is smaller than the surface tension of the first component. Each of the evaluations of the wetting spread defect, the film thickness unevenness and the light emitting failure are from "A" to "B".

Comparative Example 2-212 to Comparative Example 2-236

As shown in FIG. 36, the ink for forming a positive hole transport layer in Comparative Example 2-212 to Comparative Example 2-236 includes TFB as a positive hole transport material of the third component of 0.5 wt % in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 20 vol % and the volume fraction of the second component is 80 vol % in the mixed solvent including the first component and the second component. That is, the volume fraction of the second component in Comparative Example 2-212 to Comparative Example 2-236 increases by 60 vol % with respect to Comparative Example 2-26 to Comparative Example 2-50. In other words, the volume fraction of the second component in Comparative Example 2-212 to Comparative Example 2-236 increases by 10 vol % with respect to Example 2-77 to Example 2-101.

In Comparative Example 2-212 to Comparative Example 2-236 in which the boiling point of the first component is higher than the boiling point of the second component and the difference Δbp between the boiling points thereof is from 39° C. to 121° C., the excellent wetting spread properties are achieved in the opening 104a by the second component of 80 vol %, and the evaluations thereof are from "A" to "B". However, in comparison with Example 2-77 to Example 2-101, the remaining amount of the first component is reduced after the evaporation completion of the second component in the reduced pressure drying, thus the film thickness unevenness appreciably occurs due to the aggregation of TFB which is the high molecular material as a third component. Therefore, the evaluations of the film thickness unevenness and the light emitting failure are "D".

Comparative Example 2-237 to Comparative 2-261

As shown in FIG. 37, the ink for forming a positive hole transport layer in Comparative Example 2-237 to Comparative Example 2-261 includes TFB as a high molecular positive hole transport material of the third component of 0.5 wt % in which each of 25 kinds of aromatic solvents as a first component described above is combined to Diethyleneglycol-dibuthyl-ether having the boiling point of 256° C. among seven kinds of aliphatic solvents as a second component described above. The volume fraction of the first component is 20 vol % and the volume fraction of the second component is 80 vol % in the mixed solvent including the first component and the second component. That is, the volume fraction of the second component in Comparative Example 2-237 to Comparative Example 2-261 increases by 60 vol % with respect to Comparative Example 2-51 to Comparative Example 2-75. In other words, the volume fraction of the second component in Comparative Example 2-237 to Comparative Example 2-261 increases by 10 vol % with respect to Comparative Example 2-175 to Comparative Example 2-190 and Example 2-102 to Example 2-110.

In Comparative Example 2-237 to Comparative Example 2-252 in which the difference Δbp between the boiling point of the first component and the boiling point of the second component is from −5° C. to 26° C., the second component of 80 vol % is included, but the wetting spread properties is poor in the opening 104a. Therefore, all of the evaluations thereof are "C".

In Comparative Example 2-253 to Comparative Example 2-261 in which the boiling point of the first component is higher than the boiling point of the second component and the difference Δbp between the boiling points thereof is from 34° C. to 77° C., the excellent wetting spread properties are achieved in the opening 104a by the second component of 80 vol %, and all of the evaluations thereof are "A". However, in comparison with Example 2-102 to Example 2-110, the remaining amount of the first component is reduced after the evaporation completion of the second component in the reduced pressure drying in Comparative Example 2-237 to Comparative Example 2-261, thus the film thickness unevenness appreciably occurs due to the aggregation of TFB which is the high molecular material as a third component. Therefore, the evaluations of the film thickness unevenness and the light emitting failure are "D".

Comparative Example 2-262 to Comparative Example 2-286

As shown in FIG. 38, the ink for forming a positive hole transport layer in Comparative Example 2-262 to Comparative Example 2-286 includes TFB as a high molecular positive hole transport material of the third component of 0.5 wt % in which each of 25 kinds of aromatic solvents as a first component described above is combined to Tetraethyleneglycol-dimethyl-ether having the boiling point of 275° C. among seven kinds of aliphatic solvents as a second component described above. The volume fraction of the first component is 20 vol % and the volume fraction of the second component is 80 vol % in the mixed solvent including the first component and the second component. That is, the volume fraction of the second component in Comparative Example 2-262 to Comparative Example 2-286 increases by 60 vol % with respect to Comparative Example 2-76 to Comparative Example 2-100. In other words, the volume fraction of the second component in Comparative Example 2-262 to Comparative Example 2-286 increases by 10 vol % with respect to Comparative Example 2-191 to Comparative Example 2-211 and Example 2-111 to Example 2-114.

In Comparative Example 2-262 to Comparative Example 2-282 in which the difference Δbp between the boiling point of the first component and the boiling point of the second component is from −24° C. to 23° C., the second component of 80 vol % is included, but the wetting spread properties is poor in the opening 104a. The evaluations thereof are from "C" to "D", since the wetting spread properties are improved depending on the increase of the difference Δbp between the boiling points thereof.

In Comparative Example 2-283 to Comparative Example 2-286 in which the boiling point of the first component is higher than the boiling point of the second component and the difference Δbp between the boiling points thereof is from 30° C. to 58° C., the excellent wetting spread properties are achieved in the opening 104a by the second component of 80 vol %, and the evaluations thereof are from "A" to "B". However, in comparison with Example 2-111 to Example 2-114, the remaining amount of the first component is reduced after the evaporation completion of the second component in the reduced pressure drying in Comparative Example 2-262 to Comparative Example 2-286, thus the film thickness unevenness appreciably occurs due to the aggregation of TFB which is the high molecular material as a third component. Therefore, the evaluations of the film thickness unevenness and the light emitting failure are "D".

The ink for forming a positive hole transport layer of Comparative Examples and Examples described above will be described as follows, with reference with evaluation results.

The ink for forming a positive hole transport layer includes TFB which is the high molecular positive hole transport material as a third component and is applied to the positive hole injection layer 131 in the diaphragm 104 of the opening 104a. In Comparative Example 2-1 to Comparative Example 2-25 without the second component of aliphatic solvent, the wetting spread properties are poor with respect to the opening 104a. In Comparative Example 2-26 to Comparative Example 2-100 including the second component of the volume fraction of 20 vol %, the wetting spread properties are also poor with respect to the opening 104a, thus all of the evaluations of the film thickness unevenness and the light emitting failure are "C". In addition, in Comparative Example 2-212 to Comparative 2-286 including the second component of the volume fraction of 80 vol %, in which the surface tension of the second component is smaller than the surface tension of the first component, the wetting spread properties are good when the difference Δbp between the boiling point of the first component and the boiling point of the second component is higher than or equal to 30° C., but the wetting spread properties obviously falls when the difference Δbp between the boiling points thereof is lower than 30° C. or the boiling point of the second component is higher than the boiling point of the first component. The positive hole transport layer 132 having a predetermined film thickness is formed in each of Comparative Example 2-212 to Comparative Example 2-286.

On the other hand, the first component is selected from 25 kinds of aromatic solvents and the second component is selected from three kinds of aliphatic solvents in Example 2-1 to Example 2-114, in which the boiling point of the first component is higher than the boiling point of the second component and the difference Δbp between the boiling points thereof is higher than or equal to 30° C. The volume fraction of the second component is from 30 vol % to 70 vol % in the mixed solvent including the first component and the second component. When the high molecular positive hole transport material is used as a third component in the mixed solvent configuration of the ink for forming a positive hole transport layer described above, the wetting spread properties is good to the opening 104a and the positive hole transport layer 132 where the film thickness unevenness or the light emitting failure hardly occurs after the reduced pressure drying, can be formed.

In Comparative Example 2-101 to Comparative Example 2-211, the volume fraction of the second component to the mixed solvent is from 30 vol % to 70 vol %, in the same manner of Example 2-1 to Example 2-114. When the difference Δbp between the boiling point of the first component and the boiling point of the second component is lower than 30° C. or the boiling point of the second component is higher than the boiling point of the first component, the wetting spread properties falls, in comparison with Example 2-1 to Example 2-114.

Ink for Forming Light Emitting Layer

FIG. 39 is a table illustrating configurations and evaluation results of Comparative Example 3-1 to Comparative Example 3-25 of an ink for forming a light emitting layer. FIG. 40 is a table illustrating configurations and evaluation results of Comparative Example 3-26 to Comparative Example 3-50 of the ink for forming a light emitting layer.

FIG. 41 is a table illustrating configurations and evaluation results of Comparative Example 3-51 to Comparative Example 3-75 of the ink for forming a light emitting layer. FIG. 42 is a table illustrating configurations and evaluation results of Comparative Example 3-76 to Comparative Example 3-100 of the ink for forming a light emitting layer. FIG. 43 is a table illustrating configurations and evaluation results of Example 3-1 to Example 3-25 of the ink for forming a light emitting layer. FIG. 44 is a table illustrating configurations and evaluation results of Comparative Example 3-101 to Comparative Example 3-116 and Example 3-26 to Example 3-34 of the ink for forming a light emitting layer. FIG. 45 is a table illustrating configurations and evaluation results of Comparative Example 3-117 to Comparative Example 3-137 and Example 3-35 to Example 3-38 of the ink for forming a light emitting layer. FIG. 46 is a table illustrating configurations and evaluation results of Example 3-39 to Example 3-63 of the ink for forming a light emitting layer. FIG. 47 is a table illustrating configurations and evaluation results of Comparative Example 3-138 to Comparative Example 3-153 and Example 3-64 to Example 3-72 of the ink for forming a light emitting layer. FIG. 48 is a table illustrating configurations and evaluation results of Comparative Example 3-154 to Comparative Example 3-174 and Example 3-73 to Example 3-76 of the ink for forming a light emitting layer. FIG. 49 is a table illustrating configurations and evaluation results of Example 3-77 to Example 3-101 of the ink for forming a light emitting layer. FIG. 50 is a table illustrating configurations and evaluation results of Comparative Example 3-175 to Comparative Example 3-190 and Example 3-102 to Example 3-110 of the ink for forming a light emitting layer. FIG. 51 is a table illustrating configurations and evaluation results of Comparative Example 3-191 to Comparative Example 3-211 and Example 3-111 to Example 3-114 of the ink for forming a light emitting layer. FIG. 52 is a table illustrating configurations and evaluation results of Comparative Example 3-212 to Comparative Example 3-236 of the ink for forming a light emitting layer. FIG. 53 is a table illustrating configurations and evaluation results of Comparative Example 3-237 to Comparative Example 3-261 of the ink for forming a light emitting layer. FIG. 54 is a table illustrating configurations and evaluation results of Comparative Example 3-262 to Comparative Example 3-286 of the ink for forming a light emitting layer. In the tables of FIG. 39 to FIG. 54, 25 kinds of aromatic solvents of the first component is recited in the order of increasing of the boiling points thereof from top to bottom of the table.

The ink for forming a light emitting layer of Comparative Example 3-1 to Comparative Example 3-286 and Example 3-1 to Example 3-114, in which the first component is selected from 25 kinds of aromatic solvents, the second component is selected from three kinds of aliphatic solvents, varies the volume fractions of the components and forms the light emitting layer 133 by the ink jet method. Specifically, first, the positive hole injection layer 131 and the positive hole transport layer 132 are formed by the liquid phase method (ink jet method). Then, the light emitting layer 133 is formed using the ink for forming a light emitting layer of Comparative Example 3-1 to Comparative Example 3-286 and Example 3-1 to Example 3-114. In addition, by the evaporation method, the electron transport layer 134 and the electron injection layer 135 are formed. The material configuration of the layer is as follows, respectively. The positive hole injection layer is m-MTDATA+TFB, the positive hole transport layer is TFB, the host material of the light emitting layer 133 is TDAPB, dopant is Ir(ppy)3, the electron transport layer 134 is BAlq, and the electron injection layer 135 is LiF.

The evaluation method of the ink for forming a light emitting layer in Comparative Example 3-1 to Comparative Example 3-286 and Example 3-1 to Example 3-114 Comparative Example 2-1 to Comparative Example 2-25 is similar to the evaluation method of the ink for forming a positive hole injection layer described above, and three items of the wetting spread defect, the film thickness unevenness and the light emitting failure are evaluated. However, the evaluations thereof are performed other than the defect due to the film thickness unevenness of the positive hole transport layer 132 to which the ink for a light emitting layer is applied. The case of the light emitting failure is similar thereto.

Comparative Example 3-1 to Comparative Example 3-25

As shown in FIG. 39, the ink for forming a light emitting layer of Comparative Example 3-1 to Comparative Example 3-25 includes 0.5 wt % of the material for forming a light emitting layer (the third component) to each of 25 kinds of aromatic solvents of the first component described above. At that time, Ir(ppy)3 which is a metal complex of iridium as a dopant is added to the host material of the third component TDAPB. That is, the third component includes TDAPB of the π-conjugated low molecular organic compound and the metal complex of iridium. The aliphatic solvent of the second component is not included. The first component is a good solvent which is capable of dissolving the material for forming a light emitting layer of 0.1 wt % or more as a third component.

In the ink for forming a light emitting layer of Comparative Example 3-1 to Comparative Example 3-25, since the second component of which the surface tension is smaller than the surface tension of the first component is not included, the wetting spread properties are poor with respect to the opening portion 104a in which the positive hole transport layer 132 is formed. On the other hand, when the low molecular light emitting material as a third component is included, the aggregation of the third component hardly occur, since the light emitting layer 133, which the film thickness thereof is greater (thicker) than the film thickness of the positive hole injection layer 131 or the film thickness of the positive hole transport layer 132, is formed on the positive hole transport layer 132 which is formed by the liquid phase process. Therefore, all of three evaluation properties of the wetting spread defect, the film thickness unevenness in the light emitting layer 133 and the light emitting failure are "C".

Comparative Example 3-26 to Comparative Example 3-50

As shown in FIG. 40, the ink for forming a positive hole transport layer of Comparative Example 3-26 to Comparative Example 3-50 includes the material for forming a light emitting layer as a third component of 0.5 wt % in which each of the first component of 25 kinds of aromatic solvents described above is combined to Diethyleneglyccl-butylmethyl-ether having the boiling point of 212° C. among seven kinds of aliphatic solvents as a second component described above. The volume fraction of the first component is 80 vol % and the volume fraction of the second component is 20 vol % in the mixed solvent including the first component and the second component. The boiling point of the first component is higher than the boiling point of the second component, and the difference Δbp between the boiling points thereof is from 39° C. to 121° C. The first component is a good solvent in which the solubility of the third component in the first component is higher than the solubility of the third component in the second component. Further, the surface tension of the second component is smaller than the surface tension of the first component.

Comparative Example 3-51 to Comparative Example 3-75

As shown in FIG. 41, the ink for forming a positive hole transport layer of Comparative Example 3-51 to Comparative Example 3-75 includes the material for forming a light emitting layer (third component) of 0.5 wt % in which each of the first component of 25 kinds of aromatic solvents described above is combined to Diethyleneglycol-dibuthyl-ether having the boiling point of 256° C. among seven kinds of aliphatic solvents as a second component described above. The volume fraction of the first component is 80 vol % and the volume fraction of the second component is 20 vol % in the mixed solvent including the first component and the second component. The boiling point of the first component is not necessarily higher than the boiling point of the second component, and the difference Δbp between the boiling points thereof is from −5° C. to 77° C. The first component is a good solvent in which the solubility of the third component in the first component is higher than the solubility of the third component in the second component. Further, the surface tension of the second component is smaller than the surface tension of the first component.

Comparative Example 3-76 to Comparative Example 3-100

As shown in FIG. 42, the ink for forming a positive hole transport layer of Comparative Example 3-76 to Comparative Example 3-100 includes the material for forming a light emitting layer as a third component of 0.5 wt % in which each of the first component of 25 kinds of aromatic solvents described above is combined to Tetraethyleneglycol-dimethyl-ether having the boiling point of 275° C. among seven kinds of aliphatic solvents as a second component described above. The volume fraction of the first component is 80 vol % and the volume fraction of the second component is 20 vol % in the mixed solvent including the first component and the second component. The boiling point of the first component is not necessarily higher than the boiling point of the second component, and the difference Δbp between the boiling points thereof is from −24° C. to 58° C. The first component is a good solvent in which the solubility of the third component in the first component is higher than the solubility of the third component in the second component. Further, the surface tension of the second component is smaller than the surface tension of the first component.

In the ink for forming a positive hole transport layer of Comparative Example 3-26 to Comparative Example 3-100, the second component of which the surface tension is smaller than the surface tension of the first component included as 20 vol %, but the wetting spread properties are poor with respect to the opening portion 104*a* in the same manner of Comparative Example 0.3-1 to Comparative Example 3-25 without the second component. Therefore, all of three evaluation properties of the wetting spread defect, the film thickness unevenness in the functional layer and the light emitting failure are "C".

Example 3-1 to Example 3-25

As shown in FIG. 43, the ink for forming a positive hole transport layer of Example 3-1 to Example 3-25 includes TDAPB+Ir of the material for forming a light emitting layer as a third component of 0.5 wt % in which each of the first component of 25 kinds of aromatic solvents described above is combined to Diethyleneglycol-butylmethyl-ether having the boiling point of 212° C. among seven kinds of aliphatic solvents as a second component described above. The volume fraction of the first component is 70 vol % and the volume fraction of the second component is 30 vol % in the mixed solvent including the first component and the second component. The boiling point of the first component is higher than the boiling point of the second component, and the difference Δbp between the boiling points thereof is from 39° C. to 121° C. The solubility of the third component in the first component is higher than the solubility of the third component in the second component. Further, the surface tension of the second component is smaller than the surface tension of the first component. In other words, the volume fraction of the second component in Example 3-1 to Example 3-25 increases by 10 vol % with respect to Comparative Example 3-26 to Comparative Example 3-50. Furthermore, since the host material of the third component is TDAPB and the dopant (guest material) is Ir(ppy)3, the third component is not a single material and the third component may be dissolved as 0.1 wt % with respect to the first component and the second component.

In the ink for forming a light emitting layer of Example 3-1 to Example 3-25, since the second component of which the surface tension is smaller than the surface tension of the first component is included as 30 vol %, the wetting spread properties with respect to the opening 104*a* are improved than Comparative Example 3-26 to Comparative Example 3-50. Moreover, since the second component of which the boiling point is lower than the boiling of the first component is included as 30 vol %, in comparison with Comparative Example 3-26 to Comparative Example 3-50, the drying is proceeded while the state of the wetting spread of the ink for forming a light emitting layer on the opening 104*a* is maintained in the reduced pressure drying, and the film thickness unevenness of the light emitting layer 133 is also reduced. Therefore, the occurrence of the light emitting failure in the dark spot or the bright spot due to the wetting spread defect or the film thickness unevenness is suppressed. In particular, the excellent wetting spread properties is obtained by applying the ink for forming a light emitting layer to the positive hole transport layer 132 which is formed by the liquid phase process. Therefore, the evaluations of the wetting spread defect are "A", the evaluations of the film thickness unevenness in the light emitting layer are "B", and the evaluations of the light emitting failure are "A".

Comparative Example 3-101 to Comparative Example 3-116 and Example 3-26 to Example 3-34

As shown in FIG. 44, the ink for forming a light emitting layer of Comparative Example 3-101 to Comparative Example 3-116 and Example 3-26 to Example 3-34 includes TDAPB+Ir(ppy)3 of the material for forming a light emitting layer as a third component of 0.5 wt % in which each of the first component of 25 kinds of aromatic solvents described above is combined to Diethyleneglycol-dibuthylether having the boiling point of 256° C. among seven kinds of aliphatic solvents as a second component described above. The volume fraction of the first component is 70 vol % and the volume fraction of the second component is 30 vol %. In Comparative Example 3-101 to Comparative Example 3-102, the boiling point of the second component is higher than the boiling point of the first component, and the difference Δbp between the boiling points thereof is from −5° C. to −3° C. On the other hand, in Comparative Example 3-103 to Comparative Example 3-116 and Example 3-26 to Example 3-34, the boiling point of the first component is higher than the boiling point of the second component, and the difference Δbp between the boiling points thereof is from 2° C. to 77° C. The first component is a good solvent in which the solubility of the third component in the first component is higher than the solubility of the third component in the second component. Further, the surface tension of the second component is smaller than the surface tension of the first component. The third component including plural kinds of material may be dissolved as 0.1 wt % or more with respect to the mixed solvent including the first component and the second component as described above.

In Comparative Example 3-101 to Comparative Example 3-116 in which the difference Δbp between the boiling point of the first component and the boiling point of the second component is lower than 30° C., the sufficient improvement effects of the wetting spread properties are not obtained by the addition of the second component of which the surface tension is smaller than the surface tension of the first component as expected. All of three evaluation properties of the wetting spread defect, the film thickness unevenness and the light emitting failure are "C" in Comparative Example 3-26 to Comparative Example 3-41.

In Example 3-26 to Example 3-34 in which the difference Δbp between the boiling point of the first component and the boiling point of the second component is higher than or equal to 30° C., the improvement effects of the wetting spread properties are obtained by the addition of the second component of which the surface tension is smaller than the surface tension of the first component as expected. The evaluation properties of the wetting spread defect, the film thickness unevenness and the light emitting failure are from "A" to "B".

Comparative Example 3-117 to Comparative Example 3-137 and Example 3-35 to Example 3-38

As shown in FIG. 45, the ink for forming a light emitting layer of Comparative Example 3-117 to Comparative Example 3-137 and Example 3-35 to Example 3-38 includes TDAPB+Ir(ppy)3 of the material for forming a light emitting layer as a third component of 0.5 wt % in which each of the first component of 25 kinds of aromatic solvents described above is combined to Tetraethyleneglycol-dimethyl-ether having the boiling point of 275° C. among seven kinds of aliphatic solvents as a second component described above. The volume fraction of the first component is 70 vol % and the volume fraction of the second component is 30 vol %. In Comparative Example 3-117 to Comparative Example 3-128, the boiling point of the second component is higher than the boiling point of the first component, and the difference Δbp between the boiling points thereof is from −24° C. to −1° C. On the other hand, in Comparative Example 3-129 to Comparative Example 3-137 and Example 3-35 to Example 3-38, the boiling point of the second component is lower than or equal to the boiling point of the first component, and the difference Δbp between the boiling points thereof is from 0° C. to 58° C. The first component is a good solvent in which the solubility of the third component in the first component is higher than the solubility of the third component in the second component. Further, the surface tension of the second component is smaller than the surface tension of the first component. The third component including plural kinds of material may be dissolved as 0.1 wt % or more with respect to the mixed solvent including the first component and the second component as described above.

In Comparative Example 3-117 to Comparative Example 3-137 in which the difference Δbp between the boiling point of the first component and the boiling point of second component is lower than or equal to 23° C., the effect of the surface tension of the second component is not obtained and the wetting spread defect to the opening 104a is poor even when 30 vol % of the second component of which the surface tension is smaller than the surface tension of the first component is included. In particular, all of the evaluation properties of the wetting spread defect, the film thickness unevenness and the light emitting failure are "D" in Comparative Example 3-117 to Comparative Example 3-125 in which the boiling point of the second point is higher than the boiling point of the first point. The evaluation properties of the wetting spread defect, the film thickness unevenness and the light emitting failure are "C" in Comparative Example 3-126 to Comparative Example 3-137.

In Example 3-35 to Example 3-38 in which the difference Δbp between the boiling point of the first component and the boiling point of the second component is higher than or equal to 30° C., the improvement effects of the wetting spread properties are obtained by the addition of the second component of which the surface tension is smaller than the surface tension of the first component. The evaluation properties of the wetting spread defect, the film thickness unevenness and the light emitting failure are from "A" to "B". When the second component having the boiling point of 275° C. is selected, it is preferable that the first component of 305° C. or higher is selected, in which the boiling point of the first component is higher than the boiling point of the second component and the difference Δbp between the boiling points thereof is higher than or equal to 30° C.

Example 3-39 to Example 3-63

As shown in FIG. 46, the ink for forming a light emitting layer of Example 3-39 to Example 3-63 includes TDAPB+Ir(ppy)3 of the material for forming a light emitting layer as a third component of 0.5 wt % in which each of 25 kinds of aromatic solvents as a first component described above is combined by the volume fraction of 50 vol % to Duethyl-eneglycol-butylmethyl-ether having the boiling point of 212° C. among seven kinds of aliphatic solvents as a second component described above. That is, in Example 3-39 to Example 3-63, the volume fraction of the second component increases by 30 vol % with respect to Comparative Example 3-26 to Comparative Example 3-50. In other words, the volume fraction of the second component increase by 20 vol % in comparison with Example 3-1 to Example 3-25.

In the ink for forming a light emitting layer of Example 3-39 to Example 3-63, the wetting spread properties are good with respect to the opening 104a, and the film thickness unevenness hardly occurs in the reduced pressure drying, in the same manner of Example 3-1 to Example 3-25. Therefore, the evaluations of the wetting spread defect are "A", the evaluations of the film thickness unevenness are "B", and the evaluations of the light emitting failure are "A".

Comparative Example 3-138 to Comparative Example 3-153 and Example 3-64 to Example 3-72

As shown in FIG. 47, the ink for forming a light emitting layer of Comparative Example 3-138 to Comparative Example 3-153 and Example 3-64 to Example 3-72 includes TDAPB+Ir(ppy)3 of the material for forming a light emitting layer of 0.5 wt % as a third component in which each of 25 kinds of aromatic solvents as a first component described above is combined by the volume fraction of 50 vol % to Diethyleneglycol-dibuthyl-ether having the boiling point of 256° C. among seven kinds of aliphatic solvents as a second component described above. In other words, the volume fraction of the second component in Comparative Example 3-138 to Comparative Example 3-153 and Example 3-64 to Example 3-72 increases by 20 vol % with respect to Comparative Example 3-101 to Comparative Example 3-116 and Example 3-26 to Example 3-34.

In Comparative Example 3-138 to Comparative Example 3-153 in which the difference $\Delta bp$ between the boiling point of the first component and the boiling point of the second component is lower than 30° C., the second component of which the surface tension is smaller than the surface tension of the first component is included as 50 vol %, but the improvement effects of the wetting spread properties are not sufficiently achieved. However, in Example 3-64 to Example 3-72 in which the difference $\Delta bp$ between the boiling points thereof is higher than or equal to 30° C., the improvement effects of the wetting spread properties are achieved.

In Comparative Example 3-138 to Comparative Example 3-153, all of the evaluations of the wetting spread defect, the film thickness unevenness and the light emitting failure are "C". On the other hand, all of the evaluations of the wetting spread defect, the film thickness and the light emitting failure are from "A" to "B" in Example 3-64 to Example 3-72.

Comparative Example 3-154 to Comparative Example 3-174 and Example 3-73 to Example 3-76

As shown in FIG. 48, the ink for forming a light emitting layer of Comparative Example 3-154 to Comparative Example 3-174 and Example 3-73 to Example 3-76 includes TDAPB+Ir(ppy)3 of the material for forming a light emitting layer of 0.5 wt % as a third component in which each of 25 kinds of aromatic solvents as a first component described above is combined by the volume fraction of 50 vol % to Tetraethyleneglycol-dimethyl-ether having the boiling point of 275° C. among seven kinds of aliphatic solvents as a second component described above. In other words, the volume fraction of the second component in Comparative Example 3-154 to Comparative Example 3-174 and Example 3-73 to Example 3-76 increases by 20 vol % with respect to Comparative Example 3-117 to Comparative Example 3-137 and Example 3-35 to Example 3-38.

In Comparative Example 3-154 to Comparative Example 3-174 in which the difference $\Delta bp$ between the boiling point of the first component and the boiling point of the second component is lower than 30° C., the second component of which the surface tension is smaller than the surface tension of the first component is included as 50 vol %, but the improvement effects of the wetting spread properties are not sufficiently achieved. However, in Example 3-73 to Example 3-76 in which the difference $\Delta bp$ between the boiling points thereof is higher than or equal to 30° C., the improvement effects of the wetting spread properties are achieved.

In Comparative Example 3-154 to Comparative Example 3-162 in which the difference $\Delta bp$ between the boiling points thereof is from −24° C. to 5° C., all of the evaluations of the wetting spread defect, the film thickness unevenness and the light emitting failure are "D". In Comparative Example 3-163 to Comparative Example 3-174 in which the difference $\Delta bp$ between the boiling points thereof is from −3° C. to 23° C., all of the evaluations of the wetting spread defect, the film thickness unevenness and the light emitting failure are "C". In contrast, in Example 3-73 to Example 3-76, all of the evaluations of the wetting spread defect, the film thickness and the light emitting failure are from "A" to "B".

Example 3-77 to Example 3-101

As shown in FIG. 49, the ink for forming a light emitting layer of Example 3-77 to Example 3-101 includes TDAPB+Ir(ppy)3 of the material for forming a light emitting layer of 0.5 wt % as a third component in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 30 vol % and the volume fraction of the second component is 70 vol %. That is, the volume fraction of the second component in Example 3-77 to Example 3-101 increases by 20 vol % with respect to Example 3-39 to Example 3-63.

In the ink for forming a light emitting layer of Example 3-77 to Example 3-101, the wetting spread properties are good with respect to the opening 104a, and the film thickness unevenness hardly occurs in the reduced pressure drying, in the same manner of Example 3-39 to Example 3-63. Therefore, the evaluations of the wetting spread defect are "A", the evaluations of the film thickness unevenness are "B", and the evaluations of the light emitting failure are "A".

Comparative Example 3-175 to Comparative 3-190 and Example 3-102 to Example 3-110

As shown in FIG. 50, the ink for forming a light emitting layer of Comparative Example 3-175 to Comparative Example 3-190 and Example 3-102 to Example 3-110 includes TDAPB+Ir(ppy)3 of the material for forming a light emitting layer of 0.5 wt % as a third component in which each of 25 kinds of aromatic solvents as a first component described above is combined to Diethyleneglycol-dibuthyl-ether having the boiling point of 256° C. among seven kinds of aliphatic solvents as a second component described above. The volume fraction of the first component is 30 vol % and the volume fraction of the second component is 70 vol %. In other words, the volume fraction of the second component in Comparative Example 3-175 to Comparative Example 3-190 and Example 3-102 to Example 3-110 increases by 20 vol % with respect to Comparative Example 3-138 to Comparative Example 3-153 and Example 3-64 to Example 3-72.

In Comparative Example 3-175 to Comparative Example 3-190 in which the difference $\Delta bp$ between the boiling point of the first component and the boiling point of the second component is lower than 30° C., the second component of which the surface tension is smaller than the surface tension of the first component is included as 70 vol %, but the improvement effects of the wetting spread properties are not sufficiently achieved. However, in Example 3-102 to Example 3-110 in which the difference Δbp between the boiling points thereof is higher than or equal to 30° C., the improvement effects of the wetting spread properties are achieved.

In Comparative Example 3-175 to Comparative Example 3-190, all of the evaluations of the wetting spread defect, the film thickness and the light emitting failure are "C". In contrast, in Example 3-102 to Example 3-110, all of the evaluations of the wetting spread defect, the film thickness and the light emitting failure are from "A" to "B". Particularly, it is preferable that all of the evaluations of three evaluation items are "A" in Example 3-103 to Example 3-106.

Comparative Example 3-191 to Comparative Example 3-211 and Example 3-111 to Example 3-114

As shown in FIG. 51, in Comparative Example 3-191 to Comparative Example 3-211 and Example 3-111 to Example 3-114, the ink for forming a light emitting layer includes TDAPB+Ir(ppy)3 of the material for forming a light emitting layer of 0.5 wt % as a third component in which each of 25 kinds of aromatic solvents as a first component described above is combined to Tetraethyleneglycol-dimethyl-ether having the boiling point of 275° C. among seven kinds of aliphatic solvents as a second component described above. The volume fraction of the first component is 30 vol % and the volume fraction of the second component is 70 vol % in the mixed solvent including the first component and the second component. That is, in Comparative Example 3-191 to Comparative Example 3-211 and Example 3-111 to Example 3-114, the volume fraction of the second component increases by 20 vol % with respect to Comparative Example 3-154 to Comparative Example 3-174 and Example 3-73 to Example 3-76.

In Comparative Example 3-191 to Comparative Example 3-211 in which the difference Δbp between the boiling point of the first component and the boiling point of the second component is lower than 30° C., the second component of which the surface tension is smaller than the surface tension of the first component is included as 70 vol %, but the wetting spread properties are not sufficiently improved as expected. In Example 3-111 to Example 3-114 in which the difference Δbp between the boiling points thereof is higher than or equal to 30° C., the improvement effects of the wetting spread properties are achieved.

In Comparative Example 3-191 to Comparative Example 3-199 in which the difference Δbp between the boiling points thereof is from −24° C. to 5° C., all of the evaluations of the wetting spread defect, the film thickness unevenness and the light emitting failure are "D". In Comparative Example 3-200 to Comparative Example 3-211 in which the difference Δbp between the boiling points thereof is from −3° C. to 23° C., all of the evaluations of the wetting spread defect, the film thickness unevenness and the light emitting failure are "C". In contrast, in Example 3-111 to Example 3-114, the evaluations of the wetting spread defect are "A", the evaluations of the film thickness unevenness are "B", and the evaluations of the light emitting failure are "A".

Comparative Example 3-212 to Comparative Example 3-236

As shown in FIG. 52, the ink for forming a light emitting layer in Comparative Example 3-212 to Comparative Example 3-236 includes the material for forming a light emitting layer of 0.5 wt % as a third component in which each of 25 kinds of aromatic solvents as a first component described above is combined to Diethyleneglycol-butylmethyl-ether having the boiling point of 212° C. among seven kinds of aliphatic solvents as a second component described above. The volume fraction of the first component is 20 vol % and the volume fraction of the second component is 80 vol % in the mixed solvent including the first component and the second component. In other words, the volume fraction of the second component in Comparative Example 3-212 to Comparative Example 3-236 increases by 10 vol % with respect to Example 3-77 to Example 3-101.

In Comparative Example 3-212 to Comparative Example 3-236 in which the boiling point of the first component is higher than the boiling point of the second component and the difference Δbp between the boiling points thereof is from 39° C. to 121° C., the excellent wetting spread properties are achieved in the opening 104*a* by the second component of 80 vol %, and the evaluations thereof "A". However, in comparison with Example 3-77 to Example 3-101, the remaining amount of the first component is reduced after the evaporation completion of the second component in the reduced pressure drying, thus the film thickness unevenness appreciably occurs due to the aggregation or the deposition of the material for forming a light emitting layer including the low molecular material as a third component. Therefore, the evaluations of the film thickness unevenness and the light emitting failure are "D".

Comparative Example 3-237 to Comparative Example 3-261

As shown in FIG. 53, the ink for forming a light emitting layer in Comparative Example 3-237 to Comparative Example 3-261 includes the material for forming a light emitting layer of 0.5 wt % as a third component in which each of 25 kinds of aromatic solvents as a first component described above is combined to Diethyleneglycol-dibuthyl-ether having the boiling point of 256° C. among seven kinds of aliphatic solvents as a second component described above. The volume fraction of the first component is 20 vol % and the volume fraction of the second component is 80 vol % in the mixed solvent including the first component and the second component. In other words, the volume fraction of the second component in Comparative Example 3-237 to Comparative Example 3-261 increases by 10 vol % with respect to Comparative Example 3-175 to Comparative Example 3-190 and Example 3-132 to Example 3-110.

In Comparative Example 3-237 to Comparative Example 2-252 in which the difference Δbp between the boiling point of the first component and the boiling point of the second component is from −5° C. to 26° C., the second component of 80 vol % is included, but the wetting spread properties is poor in the opening 104*a*. Therefore, all of the evaluations thereof are "C".

In Comparative Example 3-253 to Comparative Example 3-261 in which the boiling point of the first component is higher than the boiling point of the second component and the difference Δbp between the boiling points thereof is from 34° C. to 77° C., the excellent wetting spread properties are achieved in the opening 104*a* by the second component of 80 vol %, and the evaluations thereof are from "A" to "B". However, in comparison with Example 3-102 to Example 3-110, the remaining amount of the first component is reduced after the evaporation completion of the second component in the reduced pressure drying in Comparative Example 3-237 to Comparative Example 3-261, thus the film thickness unevenness appreciably occurs due to the aggregation or the deposition of the material for forming a light emitting layer including the low molecular material as a third component. Therefore, the evaluations of the film thickness unevenness and the light emitting failure are "D".

Comparative Example 3-262 to Comparative Example 3-286

As shown in FIG. 54, the ink for forming a positive hole transport layer in Comparative Example 2-262 to Comparative Example 2-286 includes TFB as a high molecular positive hole transport material of the third component of 0.5 wt % in which each of 25 kinds of aromatic solvents as a first component described above is combined to Tetraethyleneglycol-dimethyl-ether having the boiling point of 275° C. among seven kinds of aliphatic solvents as a second component described above. The volume fraction of the first component is 20 vol % and the volume fraction of the second component is 80 vol % in the mixed solvent including the first component and the second component. That is, the volume fraction of the second component in Comparative Example 2-262 to Comparative Example 2-286 increases by 60 vol % with respect to Comparative Example 2-76 to Comparative Example 2-100. In other words, the volume fraction of the second component in Comparative Example 2-262 to Comparative Example 2-286 increases by 10 vol % with respect to Comparative Example 2-191 to Comparative Example 2-211 and Example 3-111 to Example 3-114.

In Comparative Example 3-262 to Comparative Example 3-282 in which the difference Δbp between the boiling point of the first component and the boiling point of the second component is lower than 30° C., the second component of which the surface tension is smaller than the surface tension of the first component is included as 80 vol %, but the improvement effects of the wetting spread properties due to the addition of the second component are not sufficiently obtained as expected. Therefore, the evaluations of the wetting spread defect are from "C" to "D". Meanwhile, since the improvement effects of the wetting spread properties are achieved in Comparative Example 3-283 to Comparative Example 3-286 in which the difference Δbp between the boiling points thereof is higher than or equal to 30° C., the evaluations of the wetting spread defect are "A".

However, in comparison with Example 3-111 to Example 3-114, the remaining amount of the first component is reduced after the evaporation completion of the second component in the reduced pressure drying in Comparative Example 3-262 to Comparative Example 3-286, thus the film thickness unevenness appreciably occurs due to the aggregation or the deposition of the material for forming a light emitting layer which is the low molecular material as a third component. Therefore, the evaluations of the film thickness unevenness and the light emitting failure are "D".

The ink for forming a light emitting layer of Comparative Examples and Examples described above will be described as follows, with reference with evaluation results.

The ink for forming a light emitting layer includes the low molecular material for a light emitting as a third component and is applied to the positive hole transport layer 132 in the diaphragm 104 of the opening 104a. In Comparative Example 3-1 to Comparative Example 3-25 without the second component of aliphatic solvent, the wetting spread properties are poor to the opening 104a. In Comparative Example 3-26 to Comparative Example 3-100 including the second component of the volume fraction of 20 volt, the wetting spread properties are also poor with respect to the opening 104a, thus all of the evaluations of the film thickness unevenness and the light emitting failure are "C". In addition, in Comparative Example 3-212 to Comparative 3-286 including the second component of the volume fraction of 80 vol %, in which the surface tension of the second component is smaller than the surface tension of the first component, the wetting spread properties are good when the difference Δbp between the boiling point of the first component and the boiling point of the second component is higher than or equal to 30° C., but the wetting spread properties obviously fall when the difference Δbp between the boiling points thereof is lower than 30° C. or the boiling point of the second component is higher than the boiling point of the first component. The light emitting layer 133 where the film thickness unevenness or the light emitting failure hardly occurs is formed in each of Comparative Example 3-212 to Comparative Example 3-286.

On the other hand, the first component is selected from 25 kinds of aromatic solvents and the second component is selected from three kinds of aliphatic solvents in Example 3-1 to Example 3-114, in which the boiling point of the first component is higher than the boiling point of the second component and the difference Δbp between the boiling points thereof is higher than or equal to 30° C. The volume fraction of the second component is from 30 vol % to 70 vol % in the mixed solvent including the first component and the second component. When the low molecular light emitting material is used as a third component in the mixed solvent configuration of the ink for forming a light emitting layer described above, the wetting spread properties are excellent to the opening 104a and the light emitting layer 133 where the film thickness unevenness or the light emitting failure hardly occurs after the reduced pressure drying, can be formed.

In Comparative Example 3-101 to Comparative Example 3-211, the volume fraction of the second component to the mixed solvent is from 30 vol % to 70 vol %, in the same manner of Example 3-1 to Example 3-114. When the difference Δbp between the boiling point of the first component and the boiling point of the second component is lower than 30° C. or the boiling point of the second component is higher than the boiling point of the first component, the wetting spread properties fall, in comparison with Example 3-1 to Example 3-114.

Effects of the first embodiment are as follows.

(1) The ink for forming a positive hole injection layer according to Example 1-1 to Example 1-114 includes one kind of first component that is selected from 25 kinds of aromatic solvents of which the boiling point is higher than or equal to 250° C. and lower than or equal to 350° C., one kind of second component that is selected from seven kinds of aliphatic solvents of which the boiling point is higher than or equal to 200° C., and the third component that is the low molecular positive hole injection material, in which the solubility of the third component in the first component is higher than the solubility of the third component in the second component, the volume fraction of the second component is more than or equal to 30 vol % and less than or equal to 70 vol % in the mixed solvent, and the difference between the boiling point of the first component and the boiling point of the second component is higher than or equal to 30° C. Therefore, the effect is obtained when the aliphatic solvent is used as a second component in which the surface tension of the aliphatic solvent is smaller than the surface tension of the aromatic solvent of the first component. If the ink for forming a positive hole injection layer of Example 1-1 to Example 1-114 is applied to the opening 104a which is surrounded by the diaphragm 104, it is possible to form the positive hole injection layer 131 of which the film thickness unevenness is within ±5% with respect to the average film thickness after drying while the wetting spreads to the opening 104a on which the pixel electrode 102 is placed.

(2) The ink for forming a positive hole transport layer according to Example 2-1 to Example 2-114 includes one kind of first component that is selected from 25 kinds of aromatic solvents of which the boiling point is higher than or equal to 250° C. and lower than or equal to 350° C., one kind of second component that is selected from seven kinds of aliphatic solvents of which the boiling point is higher than or equal to 200° C., and the third component that is the high molecular positive hole transport material, in which the solubility of the third component in the first component is higher than the solubility of the third component in the second component, the volume fraction of the second component is more than or equal to 30 vol % and less than or equal to 70 vol % in the mixed solvent, and the difference between the boiling point of the first component and the boiling point of the second component is higher than or equal to 30° C. Therefore, the effect is obtained when the aliphatic solvent is used as a second component in which the surface tension of the aliphatic solvent is smaller than the surface tension of the aromatic solvent of the first component. If the ink for forming a positive hole transport layer of Example 2-1 to Example 2-114 is applied to the opening 104a which is surrounded by the diaphragm 104, it is possible to form the positive hole transport layer 132 of which the film thickness unevenness is within ±2.5% with respect to the average film thickness after drying while the wetting spreads to the opening 104a on which the positive hole injection layer 131 that is formed by the liquid phase process is placed.

(3) The ink for forming a light emitting layer according to Example 3-1 to Example 3-114 includes one kind of first component that is selected from 25 kinds of aromatic solvents of which the boiling point is higher than or equal to 250° C. and lower than or equal to 350° C., one kind of second component that is selected from seven kinds of aliphatic solvents of which the boiling point is higher than or equal to 200° C., and the third component that is the low molecular material for forming a light emitting layer, in which the solubility of the third component in the first component is higher than the solubility of the third component in the second component, the volume fraction of the second component is more than or equal to 30 vol % and less than or equal to 70 vol %, and the difference between the boiling point of the first component and the boiling point of the second component is higher than or equal to 30° C. Therefore, the effect is obtained when the aliphatic solvent is used as a second component in which the surface tension of the aliphatic solvent is smaller than the surface tension of the aromatic solvent of the first component. If the ink for forming a light emitting layer of Example 3-1 to Example 3-114 is applied to the opening 104a which is surrounded by the diaphragm 104, it is possible to form the light emitting layer 133 of which the film thickness unevenness is within ±2.5% with respect to the average film thickness after drying while the wetting spreads to the opening 104a on which the positive hole transport layer 132 that is formed by the liquid phase process is placed.

(4) In the ink for forming each of functional layers according to Example 1-1 to Example 1-114, Example 2-1 to Example 2-114 and Example 3-1 to Example 3-114, since the boiling point of the mixed solvent including the first component and the second component is higher than or equal to 200° C., it is difficult to occur the clogging of the nozzle 21 of the discharging head 20 and the stable discharge properties can be obtained. Accordingly, the ink is suitable for the ink jet method (droplet discharging method).

(5) If the discharging apparatus 1 including the ink container such as the ink tank 14 and the ink cartridge 140 which is filled with the ink forming a functional layer according to the embodiment, is used, it is possible to form the functional layer having a stale film shape with suppressing the film thickness unevenness caused by the uneven application (wetting spread), by stably discharging a predetermined amount of the ink for forming a functional layer on the predetermined place (the opening 104a of the diaphragm 104) in the substrate W as a workpiece.

(6) According to the method for manufacturing the organic EL element 130 of the first embodiment, in the organic EL element 130, at least one layer, which is selected from the positive hole injection layer 131, the positive hole transport layer 132, and the light emitting layer 133 of the functional layer 136, is formed by the ink jet method using the ink for forming a functional layer of the first embodiment. Therefore, the functional layer 136 having a stable film shape is obtained, and it is possible to manufacture the organic EL element 130 having the desired light emitting properties (luminance or light emitting lifetime) with high yield rate. Then, it is possible to provide the light emitting device 100 including the organic EL element 130.

In each example of the ink for forming a positive hole injection layer, the ink for forming a positive hole transport layer and the ink for forming a light emitting layer described above, the aromatic solvent of which the boiling point is higher than or equal to 250° C. and lower than or equal to 350° C. is selected as a first component. On the other hand, in the reduced pressure drying process of the respective inks, the first component remains even after the evaporation completion of the second component when the second component of which the boiling point of the aliphatic solvent is lower than the boiling point of the first component begins to evaporate earlier than the first component. Accordingly, the drying time becomes longer in the case of the first component with the high boiling point under the same reduced pressure drying conditions. In consideration of productivity (drying time, reduced pressure drying conditions or the like) in the reduced pressure drying process, it is preferable that the aromatic solvent of the boiling point of 300° C. or lower is selected as a first component.

Second Embodiment

Electronic Apparatus

Figure 55A:
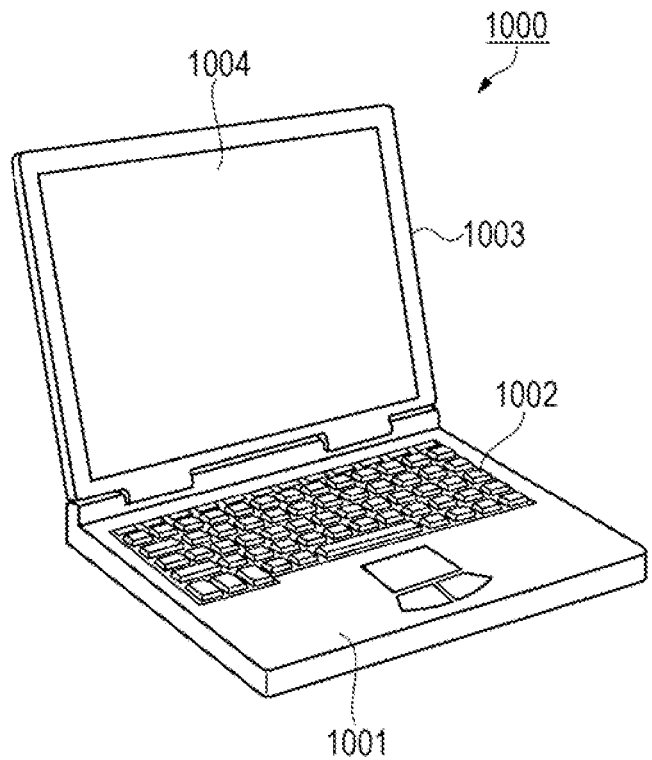
FIG. 55A is a schematic diagram illustrating a notebook type personal computer which is an example of an electronic apparatus and FIG. 55B is a schematic diagram illustrating a flat panel television (TV) which is an example of the electronic apparatus.

Next, an electronic apparatus according to a second embodiment will be described with reference to FIGS. 55A and 55B. FIG. 55A is a schematic diagram illustrating a notebook type personal computer which is an example of the electronic apparatus and FIG. 55B is a schematic diagram illustrating a flat panel television (TV) which is an example of the electronic apparatus.

As shown in FIG. 55A, a personal computer 1000 as an electronic apparatus is constituted of a main body portion 1001 including a keyboard 1002, a display unit 1003 including a display portion 1004. The display unit 1003 is rotatably supported through a hinge structure portion with respect to the main body portion 1001.

In the personal computer 1000, the light emitting device 100 of the first embodiment is mounted on the display portion 1004.

Figure 55B:
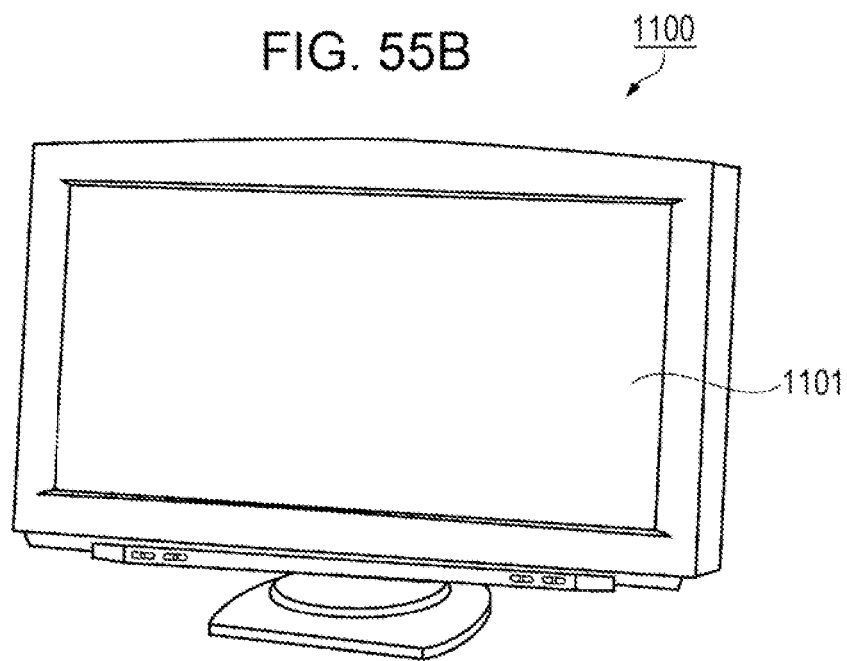

As shown in FIG. 55B, the light emitting device 100 of the first embodiment is mounted on a display unit 1101 in a flat panel television (TV) 1100 as an electronic apparatus.

In the organic EL element 130 which is arranged in the sub pixels 110R, 110G, and 110B of the light emitting device 100, at least one layer, which is selected from the positive hole injection layer 131, the positive hole transport layer 132, and the light emitting layer 133 in the functional layer 136, is formed by the liquid phase process (ink jet method) using the ink for forming a functional layer of the first embodiment described above. Therefore, the light emitting device 100 is manufactured with high yield rate while the film thickness unevenness is reduced and the light emitting failure is also reduced in a dark spot or a bright spot. In other words, it is possible to provide the personal computer 1000 and the flat panel TV 1100 with excellent cost performance.

The electronic apparatus on which the light emitting device 100 is mounted is not limited to the personal computer 1000 or to the flat panel TV 1100. For example, a portable information terminal such as a smartphone and a POS terminal or the electronic apparatus including a display portion such as a navigator, a viewer, a digital camera, and a video recorder having a direct-view monitor may be the electronic apparatus described above.

Since the invention is not limited to the embodiments described above and the invention can be appropriately altered within a scope that is not contrary to the gist of the invention which is implied from claims and the entire specification or to the idea of the invention, the ink for forming a functional layer, the method for manufacturing an organic EL element, the light emitting device to which the organic EL element is applied, and the electronic apparatus to which the organic EL element is applied are also included in the technical scope of the invention while accompanying such an alteration. Various modification examples may be examples of the invention other than the embodiments described above. Hereinafter, modification examples will be described.

Modification Example 1

The aromatic solvent is not limited to one kind in the first component of the ink for forming a functional layer according to the embodiment, and the configuration including plural kinds of aromatic solvents may be used. According to this, it is possible to adjust the solubility of the third component in the first component relatively easily in comparison with the case of using one kind of aromatic solvent.

Modification Example 2

The aliphatic solvent is not limited to one kind in the second component of the ink for forming a functional layer according to the embodiment, and the configuration including plural kinds of aliphatic solvents may be used. According to this, it is possible to adjust the surface tension relatively easily in comparison with the case of using one kind of aliphatic solvent.

Modification Example 3

The third component is not limited to one kind of functional material in the ink for forming a functional layer according to the embodiment, and the third component may include plural kinds of functional material. For example, the positive hole transport material may include the low molecular positive hole transport material and the high molecular positive hole transport material. According to this, it is possible to improve positive hole transportability. Further, for example, the material for forming a light emitting layer may include plural kinds of host material or dopant in each of the host material and the dopant. Therefore, it is possible to improve luminance and light emitting lifetime.

Modification Example 4

The third component is not limited to the material which forms the functional layer 136 of the organic EL element 130 in the ink for forming a functional layer according to the embodiment. For example, if the organic semiconductor compound is used as a third component, it is possible to form a semiconductor layer or an electrode as a functional layer in a thin film transistor. In addition, for example, it is possible to form a photoelectric conversion layer of a dye-sensitized solar cell or a functional element such as electron emission portion in a field emission display (FED) and a surface-conduction-electron emitter display (SED).

Modification Example 5

The configuration of the light emitting device 100 according to the embodiment is not limited to the configuration including the sub pixels 110R, 110G, and 110B which obtain different light emitting colors with each other. For example, the sub pixel of yellow (Y) may be used other than red (R), green (G), blue (B). Further, the configuration thereof is not limited to the full color display, and the configuration including the organic EL element 130 which obtains single light emitting color may be used. According to this, it is possible to provide the light emitting device 100 which is used as not only a display device but also a lighting system.

The entire disclosure of Japanese Patent Application No. 2012-252007, filed Nov. 16, 2012 is expressly incorporated by reference herein.

What is claimed is:

1. An ink for forming a functional layer, comprising:
    a first component that contains 2-phenoxytetrahydrofuran;
    a second component that contains diethylene glycol butyl methyl ether; and
    a third component for forming a functional layer, wherein the third component is dissolved in the first component,
    wherein a mixing ratio of the second component is more than or equal to 30 vol % and less than or equal to 70 vol %.

2. The ink for forming a functional layer according to claim 1,
    wherein the first component dissolves more than or equal to 0.1 wt % of the third component.

3. The ink for forming a functional layer according to claim 1,
    wherein a mixed solvent of the first component and the second component dissolves more than or equal to 0.1 wt % of the third component.

4. The ink for forming a functional layer according to claim 1,
    wherein the third component includes an organic compound which is a π-conjugated high molecular material or a π-conjugated low molecular material.

5. The ink for forming a functional layer according to claim 4, wherein the third component further includes a metal complex.

6. The ink for forming a functional layer according to claim 1,
wherein the third component includes plural kinds of organic compounds.

7. An ink container which contains
the ink for forming a functional layer according to claim 1.

8. A discharging apparatus comprising:
the ink container according to claim 7; and
a discharging head to which the ink for forming a functional layer is supplied from the ink container,
wherein the discharging head discharges the ink for forming a functional layer as a droplet from a nozzle.

9. A method for forming a functional layer, comprising:
applying the ink for forming a functional layer according to claim 1 to on film formation area of an object to be applied; and
forming a functional layer in the film formation area by drying and solidifying the applied ink for forming a functional layer.

10. The method for forming a functional layer according to claim 9,
wherein the film formation area is divided by a diaphragm having liquid repellency against the ink for forming a functional layer.

11. A method for manufacturing an organic EL element, which includes a functional layer having a light emitting layer between an anode and a cathode, comprising:
forming an insulating layer that divides the anode so as to constitute an opening on the anode and overlaps an outer edge of the anode;
applying the ink for forming a functional layer according to claim 4 on the opening;
forming at least one layer of the functional layers by drying and solidifying the applied ink for forming a functional layer, and
forming the cathode by covering the insulating layer and the functional layer.

12. A light emitting device comprising:
an organic EL element which is manufactured using the method for manufacturing an organic EL element according to claim 11.

13. An electronic apparatus comprising:
the light emitting device according to claim 12.

14. The ink for forming a functional layer according to claim 1, wherein the third component is dissolved in the first component at room temperature.

15. The ink for forming a functional layer according to claim 1,
wherein the first component is 2-phenoxytetrahydrofuran and ethyl-2-napht-ether.

* * * * *

UNITED STATES PATENT AND TRADEMARK OFFICE
CERTIFICATE OF CORRECTION

Page 1 of 1

PATENT NO. : 10,184,056 B2
APPLICATION NO. : 14/077955
DATED : January 22, 2019
INVENTOR(S) : Takuya Sonoyama et al.

It is certified that error appears in the above-identified patent and that said Letters Patent is hereby corrected as shown below:

On the Title Page

Item (54), change "DISCHARGHING" to --DISCHARGING--

Signed and Sealed this
Twenty-third Day of July, 2019

Andrei Iancu
*Director of the United States Patent and Trademark Office*